United States Patent
Yamae et al.

(10) Patent No.: US 9,112,181 B2
(45) Date of Patent: Aug. 18, 2015

(54) COMPOSITE SUBSTRATE, MANUFACTURING METHOD OF THE SAME AND ORGANIC ELECTROLUMINESCENCE DEVICE

(71) Applicant: PANASONIC CORPORATION, Osaka (JP)

(72) Inventors: Kazuyuki Yamae, Nara (JP); Shintaro Hayashi, Hyogo (JP); Yuko Suzuka, Osaka (JP); Yoshiharu Sanagawa, Osaka (JP); Masuyuki Ota, Osaka (JP); Hitomichi Takano, Osaka (JP); Nobuhiro Ide, Osaka (JP); Yoshikazu Kuzuoka, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/375,506

(22) PCT Filed: Feb. 7, 2013

(86) PCT No.: PCT/JP2013/000684
§ 371 (c)(1),
(2) Date: Jul. 30, 2014

(87) PCT Pub. No.: WO2013/118508
PCT Pub. Date: Aug. 15, 2013

(65) Prior Publication Data
US 2015/0014672 A1   Jan. 15, 2015

(30) Foreign Application Priority Data

Feb. 7, 2012  (JP) ................ 2012-024442
Feb. 10, 2012 (JP) ................ 2012-027443
Feb. 13, 2012 (JP) ................ 2012-027992
Mar. 7, 2012  (JP) ................ 2012-049910

(51) Int. Cl.
*H01L 51/52* (2006.01)
*H01L 51/00* (2006.01)
(Continued)

(52) U.S. Cl.
CPC ............ *H01L 51/5253* (2013.01); *B32B 38/10* (2013.01); *H01L 51/0096* (2013.01);
(Continued)

(58) Field of Classification Search
CPC ............ H01L 51/5253; H01L 51/0096; H01L 51/5203; H01L 21/02436; H01L 27/1218; H01L 23/3735
See application file for complete search history.

(56) References Cited

U.S. PATENT DOCUMENTS 5,557,120 A * 9/1996 Martin et al. .............. 257/291
6,592,969 B1  7/2003 Burroughes et al.
(Continued)

FOREIGN PATENT DOCUMENTS

JP  2002-107704  4/2002
JP  2002-170669  6/2002
(Continued)

OTHER PUBLICATIONS

U.S. Appl. No. 14/381,633 to Shintaro Hayashi et al., filed Aug. 28, 2014.
(Continued)

*Primary Examiner* — Ida M Soward
(74) *Attorney, Agent, or Firm* — Greenblum & Bernstein, P.L.C.

(57) ABSTRACT

A composite substrate includes a moisture-proof substrate, and a resin substrate pasted on a surface of the moisture-proof substrate. The resin substrate is formed to be smaller than the moisture-proof substrate in planar view. An end side of the resin substrate is an inclined face that is inclined inward. In an organic electroluminescence device, an organic light-emitting multilayer provided on a surface of the resin substrate is sealed with a sealing member. A moisture-proof film coats at least part of the surface of the resin substrate in which no lead-out electrode is formed.

17 Claims, 29 Drawing Sheets

(51) Int. Cl.
  H05B 33/04 (2006.01)
  H05B 33/10 (2006.01)
  B32B 38/10 (2006.01)
  *H01L 21/02* (2006.01)
  *H01L 27/12* (2006.01)
  *H01L 23/373* (2006.01)

(52) U.S. Cl.
  CPC ........ *H01L51/5203* (2013.01); *H01L 51/5237* (2013.01); *H05B 33/04* (2013.01); *H05B 33/10* (2013.01); *B32B 2255/00* (2013.01); *B32B 2310/0843* (2013.01); *H01L 21/02436* (2013.01); *H01L 23/3735* (2013.01); *H01L 27/1218* (2013.01)

(56) References Cited

U.S. PATENT DOCUMENTS

| | | | |
|---|---|---|---|
| 6,994,906 | B2 | 2/2006 | Burroughes et al. |
| 7,025,647 | B2 | 4/2006 | Miyazawa |
| 7,034,457 | B2 | 4/2006 | Iwase et al. |
| 7,169,003 | B2 | 1/2007 | Iwase et al. |
| 7,190,115 | B2 | 3/2007 | Tsuchiya et al. |
| 7,514,866 | B2 | 4/2009 | Burroughes et al. |
| 7,745,832 | B2 | 6/2010 | Hsieh et al. |
| 8,080,936 | B2 | 12/2011 | Fujimura et al. |
| 8,179,040 | B2 | 5/2012 | Tsuchiya et al. |
| 8,421,349 | B2 | 4/2013 | Fujimura et al. |
| 8,716,736 | B2 | 5/2014 | Yamae et al. |
| 8,759,126 | B2 | 6/2014 | Kuranaga et al. |
| 2003/0124341 | A1 | 7/2003 | Burroughes et al. |
| 2003/0127974 | A1 | 7/2003 | Miyazawa |
| 2004/0185301 | A1 | 9/2004 | Tsuchiya et al. |
| 2004/0217704 | A1 | 11/2004 | Iwase et al. |
| 2006/0033429 | A1 | 2/2006 | Fujimura et al. |
| 2006/0076571 | A1 | 4/2006 | Hsieh et al. |
| 2006/0099873 | A1 | 5/2006 | Iwase et al. |
| 2006/0134394 | A1 | 6/2006 | Burroughes et al. |
| 2007/0013292 | A1* | 1/2007 | Inoue et al. ............... 313/504 |
| 2008/0116795 | A1 | 5/2008 | Tsuchiya et al. |
| 2009/0021678 | A1 | 1/2009 | Son et al. |
| 2009/0185259 | A1* | 7/2009 | Uchida ..................... 359/296 |
| 2010/0196679 | A1 | 8/2010 | Morishima |
| 2011/0260180 | A1 | 10/2011 | Kuranaga et al. |
| 2011/0279766 | A1* | 11/2011 | Kitoh et al. ............... 349/152 |
| 2012/0062107 | A1 | 3/2012 | Fujimura et al. |
| 2013/0181204 | A1 | 7/2013 | Kuranaga et al. |
| 2013/0249385 | A1 | 9/2013 | Fujimura et al. |
| 2013/0306952 | A1 | 11/2013 | Yamae |
| 2014/0225099 | A1 | 8/2014 | Yamae et al. |

FOREIGN PATENT DOCUMENTS

| | | |
|---|---|---|
| JP | 2003-133070 | 5/2003 |
| JP | 2004-281380 | 10/2004 |
| JP | 2006-054111 | 2/2006 |
| JP | 2006-093711 | 4/2006 |
| JP | 2007-317671 | 12/2007 |
| JP | 2008-218419 | 9/2008 |
| JP | 2009-037798 | 2/2009 |
| JP | 2009-083465 | 4/2009 |
| JP | 2009-522593 | 6/2009 |
| JP | 2011-201043 | 10/2011 |
| JP | 2011-227369 | 11/2011 |
| WO | 2004/057920 | 7/2004 |
| WO | 2007/078130 | 7/2007 |

OTHER PUBLICATIONS

U.S. Appl. No. 14/380,472 to Nobuhiro Ide et al., filed Aug. 22, 2014.
U.S. Appl. No. 14/375,458 to Nobuhiro Ide et al., filed Jul. 30, 2014.
International Search Report (ISR) in International Patent Application No. PCT/JP2013/000684, dated May 7, 2013.

* cited by examiner

COMPOSITE SUBSTRATE, MANUFACTURING METHOD OF THE SAME AND ORGANIC ELECTROLUMINESCENCE DEVICE

TECHNICAL FIELD

The present invention relates to a composite substrate for an organic electric device and a manufacturing method of the same. The present invention also relates to an organic electroluminescence device.

BACKGROUND ART

An organic electroluminescence device (hereinafter referred to as an organic EL device) has been recently adapted to applications such as a lighting panel and the like. There is known an organic EL device in which an optically-transparent first electrode (an anode), an organic layer and a second electrode (a cathode) are laminated on a surface of an optically-transparent substrate in that order, where the organic layer is formed of a plurality of layers and includes a light-emitting layer. In the organic EL device, by applying a voltage between the anode and the cathode, light generated in the light-emitting layer is taken out through the optically-transparent electrode and substrate.

In the organic EL device, a light quantity to be taken out is smaller than a theoretical light quantity in general because a light quantity from the light-emitting layer is reduced owing to absorption in the substrate, total reflection at an interfacial layer and the like. For example, in a case where glass is employed as substrate material, total reflection occurs at the interface and light-extraction efficiency is reduced because the glass has a refractive index lower than that of an organic layer in general. Therefore, what is needed in such an organic EL device is to increase the light-extraction efficiency for high brightness. It is conceivable that a substrate is formed of a composite substrate made of plastic member and glass member in order to increase the light-extraction efficiency. In this case, if the plastic member is disposed at a light-extraction side, total reflection at an interface between the substrate and an electrode is reduced. As a result, more light can be taken out.

Such a composite substrate can be also adapted to organic electric devices except for the organic EL device. Examples of an organic electric device include an organic solar cell, an organic display device (an organic display) and other organic semiconductor devices. In a case of the composite substrate, it is possible to obtain, according to an organic electric device, substrate material such as a composite substrate of a substrate suitable for improving a property of a multilayer (a multilayered body) and a substrate suitable for protecting the multilayer. In addition, a flexible substrate can be obtained by compounding flexible substrates.

CITATION LIST

Patent Literature

Patent Document 1: JP Pub. No. 2007-317671

SUMMARY OF INVENTION

Technical Problem

What is needed in an organic electric device is to prevent inward penetration of moisture in general. The organic electric device is a device containing organic matter, and accordingly the inward penetration of moisture causes degradation of the device such as deterioration of the organic matter.

In the organic electric device, it is especially important to prevent moisture from penetrating inside the device because a light-emitting layer is easily degraded by moisture. Degradation of the light-emitting layer by moisture causes luminescence failure and reduction in reliability of the organic EL device. In a case where a composite substrate is formed as a substrate for increasing light-extraction efficiency by using material having comparatively high moisture permeability such as plastic or resin, inward penetration of moisture through the material is still problem (see Patent Document 1). Therefore, employing of a resin substrate is required to prevent moisture penetration through the resin substrate by covering with a film having high moisture-proofness or disposing a substrate having high moisture-proofness outside. There is however a concern that if even part of the resin substrate is exposed outside, inward penetration of moisture may occur through the exposed part.

In manufacture of an organic electric device, after forming devices (two or more multilayers) on a substrate, individual devices may be formed by cutting the substrate. There is also a case of individuating a composite substrate having a large surface area on which devices can be formed, namely dividing the composite substrate into pieces each of which has a size corresponding to one device. In this case, the composite substrate may be formed by pasting at least two materials together. Accordingly, in the cases of forming the individual devices or individuating the composite substrate having the large surface area, when a composite substrate is cut, different force is applied to each material at cutting part of the composite substrate. As a result, the cut part of the composite substrate may shift in the substrate or a malfunction may occur in cut surfaces of substrate pieces. Such a shift between substrate interfaces or a malfunction in a shape of cut end face of the composite substrate makes it difficult to form a device that is of a good quality, thereby causing product defects.

The present invention has been achieved in view of the above circumstances, and an object thereof is to provide a composite substrate capable of effectively preventing moisture penetration to suppress degradation in an organic electric device to be formed. An object thereof is to also provide a composite substrate which can be manufactured without a malfunction in cut surfaces of substrate pieces. An object thereof is to also provide a composite substrate to be formed with an organic electroluminescence device having a high reliability, a good manufacturability and an excellent light-extraction efficiency and capable of effectively preventing moisture penetration and suppressing degradation. An object thereof is to also provide an organic electroluminescence device having a high reliability, a good manufacturability and an excellent light-extraction efficiency and capable of effectively preventing moisture penetration and suppressing degradation.

Solution to Problem

A composite substrate of the present invention includes a moisture-proof substrate and a resin substrate pasted to a surface of the moisture-proof substrate. The resin substrate is formed to be smaller than the moisture-proof substrate in planar view. An end side of the resin substrate is formed into an inclined face that is inclined inward.

In a preferable embodiment of the composite substrate, a corner from a surface to a side of an end of the resin substrate has a round.

In a preferable embodiment, the composite substrate is provided with an organic multilayer on a surface of the resin substrate. The organic multilayer is sealed with a sealing member. A first lead-out electrode and a second lead-out electrode are provided on an end surface of the composite substrate. The first lead-out electrode is extended from an inside of the composite substrate in planar view. The second lead-out electrode is electrically insulated from the first lead-out electrode and extended from the inside of the composite substrate in planar view. The moisture-proof film configured to prevent moisture penetration is formed on at least part of the surface of the resin substrate in which the first and second lead-out electrodes are not formed.

In the case, preferably, the moisture-proof film is formed at least on part of the resin substrate protruding from the sealing member.

In the case, preferably, the moisture-proof film is formed at least on a region sealed with the sealing member.

In the case, preferably, the moisture-proof film is formed at all regions on end surfaces of the composite substrate in which the first and second lead-out electrodes are not formed.

In the case, preferably, the first and second lead-out electrodes are formed on a surface of the moisture-proof film.

More preferably, an inside end side of the moisture-proof film is formed into an inclined face that is inclined outward with respect to the surface of the resin substrate.

In a preferable embodiment, the composite substrate is provided with an organic multilayer on a surface of the resin substrate. The organic multilayer is sealed with a sealing member. A first lead-out electrode and a second lead-out electrode are provided on an end surface of the composite substrate. The first lead-out electrode is extended from an inside of the composite substrate in planar view. The second lead-out electrode is electrically insulated from the first lead-out electrode and extended from the inside of the composite substrate in planar view. An adhesion gap in which resin material for gluing of the sealing member is filled is formed between the first and second lead-out electrodes. The adhesion gap is shaped like a line that continuously extends from an outside to an inside in planar view. The adhesion gap includes an advancing part that extends in a direction from the outside to the inside and a returning part that extends in a direction from the inside to the outside.

The present invention is a manufacturing method of a composite substrate including a moisture-proof substrate and a resin substrate pasted to a surface of the moisture-proof substrate. The method includes a resin division and inclination step and a moisture-proof substrate dividing step. The resin division and inclination step includes preparing a composite substrate material obtained by pasting together a moisture-proof substrate material for forming moisture-proof substrates and a resin member for forming resin substrates, and dividing the resin member of the composite substrate material to form end sides of the resin substrates into inclined faces. The moisture-proof substrate dividing step includes dividing the moisture-proof substrate material.

In a preferable embodiment, the manufacturing method of the composite substrate includes a step of coating peripheral ends of the resin substrates with a moisture-proof film.

In a preferable embodiment of the manufacturing method, the resin division and inclination step is performed by laser irradiation.

In a preferable embodiment of the manufacturing method, the laser irradiation is performed by concentrating a laser beam through an object lens having a numerical aperture of 0.5 or more.

In a preferable embodiment, the manufacturing method includes a residue removing step of removing processing residue in the resin division and inclination step.

In a preferable embodiment of the manufacturing method, the residue removing step is performed by blowing a gas.

In a preferable embodiment of the manufacturing method, a sealing substrate material for forming sealing substrates is pasted to a surface of the composite substrate material on a side of the resin member. The resin division and inclination step is performed by emitting a laser beam that passes through the sealing substrate material. The sealing substrate material is divided at the moisture-proof substrate dividing step.

An organic electroluminescence device of the present invention includes a composite substrate, an organic light-emitting multilayer, a sealing member, a first lead-out electrode, a second lead-out electrode and a moisture-proof film. The composite substrate includes a moisture-proof substrate and a resin substrate pasted to a surface of the moisture-proof substrate. The organic light-emitting multilayer includes a first electrode, an organic light-emitting layer and a second electrode, and is provided on a surface of the resin substrate of the composite substrate. The sealing member seals the organic light-emitting multilayer. The first lead-out electrode is provided on an end surface of the composite substrate. The first lead-out electrode is extended from an inside of the composite substrate in planar view. The second lead-out electrode is provided on the end surface of the composite substrate. The second lead-out electrode is electrically insulated from the first lead-out electrode and extended from the inside of the composite substrate in planar view. The first lead-out electrode is electrically conducted to the first electrode. The second lead-out electrode is electrically conducted to the second electrode. The moisture-proof film is configured to prevent moisture penetration and formed on at least part of the surface of the resin substrate in which the first and second lead-out electrodes are not formed. The resin substrate is formed to be smaller than the moisture-proof substrate in planar view. An end side of the resin substrate is formed into an inclined face that is inclined inward.

Advantageous Effects of Invention

In the composite substrate according to the invention, it is possible to obtain a composite substrate to be formed with an organic electric device capable of effectively preventing moisture penetration to suppress degradation. A composite substrate capable of realizing manufacture without a malfunction in cut surfaces of substrate pieces can be also obtained. It is also possible to obtain a composite substrate to be formed with an organic electroluminescence device having a high reliability, a good manufacturability and an excellent light-extraction efficiency and capable of effectively preventing moisture penetration and suppressing degradation.

In the manufacturing method of the composite substrate according to the invention, it is possible to easily manufacture a composite substrate to be formed with an organic electric device capable of effectively preventing moisture penetration to suppress degradation.

In the organic electroluminescence device according to the invention, it is possible to obtain an organic electroluminescence device having a high reliability, a good manufacturability and an excellent light-extraction efficiency and capable of effectively preventing moisture penetration and suppressing degradation.

BRIEF DESCRIPTION OF DRAWINGS

FIG. 2A is a plan view, FIG. 2B is a sectional view and FIG. 2C is an enlarged sectional view;

FIG. 6A shows a composite substrate with no moisture-proof film and FIG. 6B shows a composite substrate provided with a moisture-proof film;

FIG. 7A shows a composite substrate with no moisture-proof film and FIG. 7B shows a composite substrate provided with a moisture-proof film;

FIG. 8A shows a composite substrate with no moisture-proof film and each of FIGS. 8B and 8C shows a composite substrate provided with a moisture-proof film;

FIG. 19A is a plan view and FIG. 19B is a sectional view taken along an X-X' line of FIG. 19A;

DESCRIPTION OF EMBODIMENTS

Figure 1:
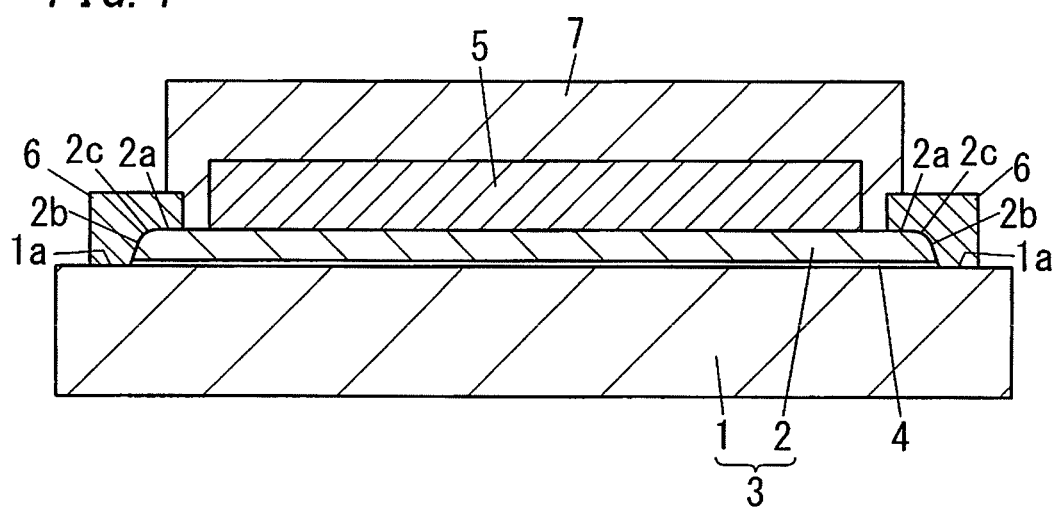
FIG. 1 is a sectional view showing an organic electric device using a composite substrate, as an example of the invention.

FIG. 1 shows an organic electric device using a composite substrate as an example of the invention. The organic electric device includes a composite substrate 3 that is formed of a moisture-proof substrate 1 and a resin substrate 2 and is employed as a substrate for forming an organic multilayer 5. The organic multilayer 5 is provided on a surface of the resin substrate 2 of the composite substrate 3, and sealed with a sealing member 7.

Figure 2A:
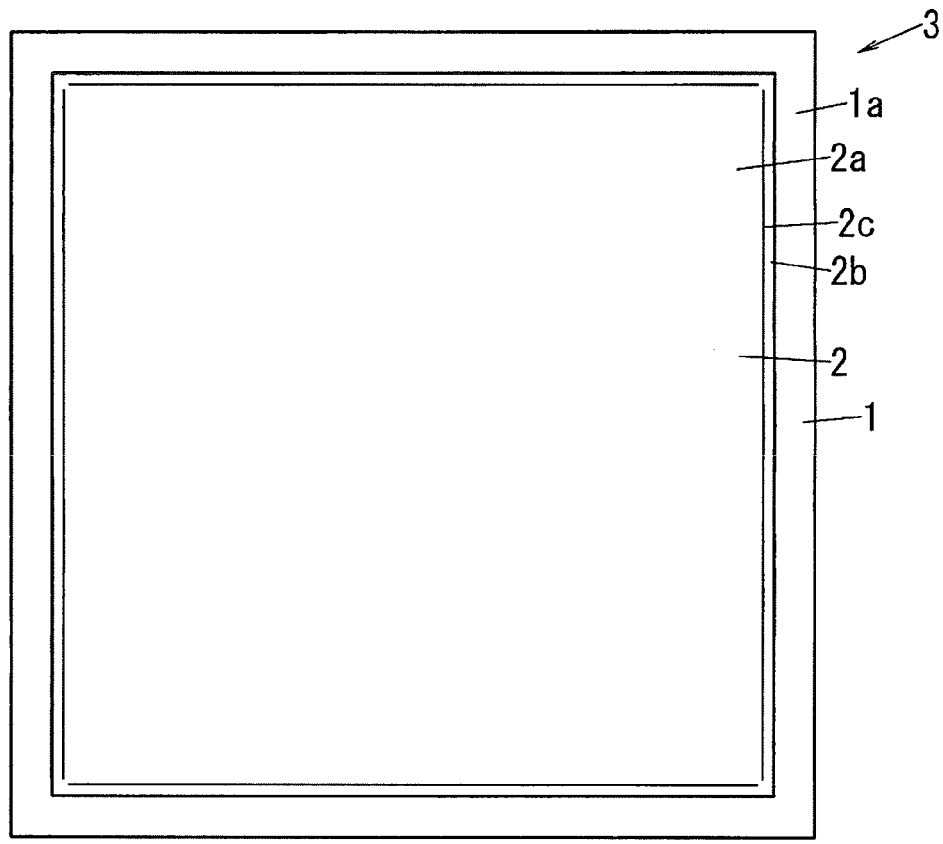
FIGS. 2A to 2C show an example of a composite substrate in an embodiment.
Figure 2B:
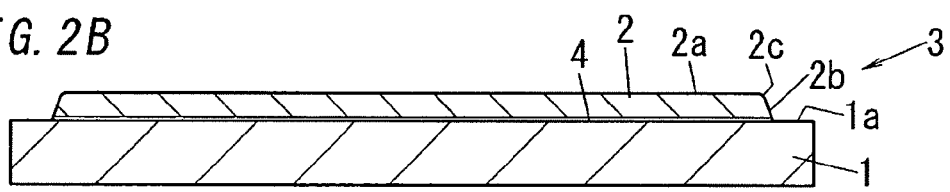
Figure 2C:
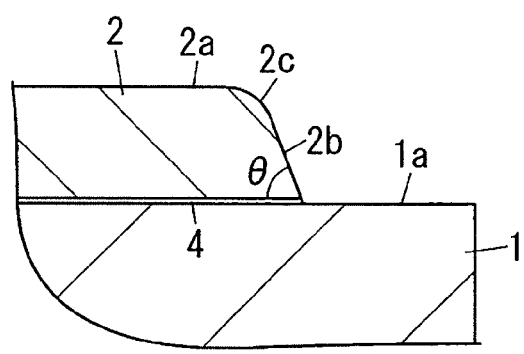

FIGS. 2A to 2C are an example of a composite substrate used for an organic electric device like a form shown in FIG. 1. It may be regarded as an illustration of one obtained by extracting the composite substrate 3 from the organic electric device. That is, in the composite substrate, the organic electric device is formed by providing a needed organic multilayer 5 (an electrical device) on a surface of the composite substrate 3. FIGS. 2A to 2C selectively show the composite substrate 3 in the organic electric device. In this disclosure, composite substrate structure means the structure including the composite substrate 3 in FIGS. 2A to 2C. As shown in FIGS. 2A to 2C, the composite substrate structure also includes only the composite substrate 3 formed with no organic multilayer 5. In this case, the organic electric device can be formed by providing an organic multilayer 5 on the composite substrate 3.

The composite substrate 3 is formed of the moisture-proof substrate 1 and the resin substrate 2 pasted on a surface of the moisture-proof substrate 1. The moisture-proof substrate 1 and the resin substrate 2 are pasted together through an adhesion layer 4.

As shown in FIG. 2A, in the composite substrate 3, the resin substrate 2 is formed to be smaller than the moisture-proof substrate 1 in planar view (as seen from a direction perpendicular to the surface of the substrate). Accordingly, a surface 1a of a peripheral end of the moisture-proof substrate 1 is exposed. Thus, when the resin substrate 2 is smaller than the moisture-proof substrate 1, an end edge (a peripheral edge) of the moisture-proof substrate 1 does not agree with an end edge (a peripheral edge) of the resin substrate 2. Because of this, the resin substrate 2 and the moisture-proof substrate 1 are to be cut separately when manufacturing individual composite substrates 3 by cutting a composite substrate 3 (a composite substrate material 13 as stated below) having a size corresponding to the composite substrates 3. It is therefore unnecessary to cut the resin substrate 2 and the moisture-proof substrate 1 in unison, thereby preventing a malfunction from occurring in cut surfaces. In addition, when the resin substrate 2 is smaller than the moisture-proof substrate 1, an end side 2b of the resin substrate 2 can be easily covered with a laminated layer.

As shown in FIGS. 2B and 2C, an end side (a peripheral face) 2b of the resin substrate 2 is formed into an inclined face that is inclined inward. That is, the resin substrate 2 has a cross-section shaped like a trapezoid, and a bottom base side of the trapezoid is pasted on the moisture-proof substrate 1 with a top base of the trapezoid disposed at an outer surface side thereof. In a case where the end side 2b of the resin substrate 2 is the inclined face, when a layer such as a moisture-proof film 6 is laminated on an end surface of the resin substrate 2, the layer is laminated on the inclined face. It is accordingly possible to prevent the layer from being cut on the end edge of the resin substrate 2, thereby forming the layer without dividing failure. Since the resin substrate 2 is smaller than the moisture-proof substrate 1 in planar view and a periphery of the moisture-proof substrate 1 protrudes from the resin substrate 2, the surface 1a of the moisture-proof substrate 1 is exposed. As a result, when forming the layer, the layer can be formed on the surface 1a of the moisture-proof substrate 1. Thus, the layer can be formed to cross border part between the resin substrate 2 and the moisture-proof substrate 1. It is consequently possible to laminate the layer so that an interface between the resin substrate 2 and the moisture-proof substrate 1 is not exposed outside.

The end side 2b as the inclined face in the resin substrate 2 has an angle of inclination $\theta$ that is smaller than 90°. Preferably, the angle is 80° or less, 75° or less, or 70° or less. In these cases, the angle is an acute angle. When the angle of inclination $\theta$ is in such a range, it is possible to efficiently prevent the layer from being cut on the end edge. In order to further protect the layer from being cut on the end edge, the angle of inclination $\theta$ may be set to 60° or less, or 45° or less. There is however a concern that if the angle of inclination $\theta$ is too small, a region of the end side 2b is enlarged too much with the end side 2b almost inclined sideways. Therefore, the angle of inclination $\theta$ may be set to an appropriate range such as 30° or more, 45° or more, or 60° or more.

In the present form, the resin substrate 2 has a round at the corner 2c from the surface 2a to the side 2b of the end thereof. That is, an edge (border part) between the surface 2a and the side 2b of the end of the resin substrate 2 is curved from the surface 2a to the side 2b. The corner 2c is the border part between the surface 2a and the end side 2b as the inclined face of the resin substrate 2, and accordingly if the corner 2c is sharp, the layer may be cut on the corner when the layer is laminated thereon. However, the corner 2c of the end of the resin substrate 2 has the round, and accordingly the layer can be smoothly laminated to cross the corner 2c. It is consequently possible to prevent the layer from being cut on the corner 2c, thereby laminating the layer without dividing failure.

A transparent substrate having moisture-proofness and optically transparency may be employed as the moisture-proof substrate 1. It is especially preferable that a glass substrate is employed as the moisture-proof substrate 1. In a case where the moisture-proof substrate 1 is formed of the glass substrate, moisture can be prevented from penetrating inside a sealed region when the organic electric device is sealed because glass has low moisture permeability. In addition, moisture-proof resin may be employed as material of the moisture-proof substrate 1.

A flexible substrate may be also used for the moisture-proof substrate 1. Examples thereof include a flexible glass and moisture-proof resin. When the moisture-proof substrate 1 has flexibility, flexible organic electric devices can be obtained.

For example, the resin substrate 2 may be formed of a plastic substrate. The plastic substrate may be formed of a mold substrate (a sheet, a film or the like) obtained by molding and hardening synthetic resin of plastic raw material. An example of the plastic material includes plastic material such as PET (polyethylene terephthalate), PEN (polyethylene naphthalate) and the like. Molding may be roll forming.

Preferably, the resin substrate 2 has flexibility. When the resin substrate 2 has flexibility, the composite substrate 3 (the composite substrate material 13) can be manufactured while rolling out the resin substrate 2 shaped like a roll (a resin member 12 as stated below)). As a result, the composite substrates 3 can be manufactured with high manufacturability. In addition, when the resin substrate 2 having flexibility is employed, flexible organic electric devices can be obtained.

The resin substrate 2 and the moisture-proof substrate 1 may be pasted together through suitable adhesive. The adhesion layer 4 is made of the adhesive. The resin substrate 2 may be pasted on the moisture-proof substrate 1 by thermocompression bonding. Thus, the adhesion layer 4 may be formed of part of the resin substrate 2 (part provided with adhesive property by heat). In the following forms, some adhesion layers 4 are not illustrated, but a resin substrate 2 and a moisture-proof substrate 1 are pasted together.

The composite substrate 3 may be formed such that the organic multilayer 5 is provided on the surface of the resin substrate 2 and the organic multilayer 5 is sealed with the sealing member 7. That is, the composite substrate 3 is used for forming the organic multilayer 5. In the organic electric device of FIG. 1, the organic multilayer 5 is provided on the surface of the resin substrate 2 in the composite substrate 3 as shown in FIGS. 2A to 2C, and the organic multilayer 5 is sealed with the sealing member 7.

It is preferable that the moisture-proof film 6 for preventing moisture penetration be formed on the surface of the resin substrate 2. A region provided with the moisture-proof film 6 may be part of the surface of the resin substrate 2. In the form, the composite substrate 3 with the moisture-proof film 6 can be employed. The structure of the composite substrate 3 with the moisture-proof film 6 may be formed.

The organic electric device requires (positive and negative) electrode terminals electrically conducted to the organic multilayer 5 in general. It is accordingly preferable that lead-out electrodes 8 extended from an inside of the composite substrate 3 in planar view be formed on end surfaces of the composite substrate 3. The lead-out electrodes 8 are illustrated in an organic electroluminescence device of FIG. 3. The lead-out electrodes 8 are provided by first lead-out electrodes 8a and second lead-out electrodes 8b extended in a way that they are electrically insulated from the first lead-out electrodes 8a. In this case, preferably the moisture-proof film 6 is formed on at least part of the surface of the resin substrate 2 in which no first and second lead-out electrodes 8a and 8b are formed.

The lead-out electrodes 8 may be formed by patterning electrode films. Therefore, a composite substrate 3 having electrode films can be used in order to manufacture the organic electric device. In the organic electric device, structure of the composite substrate 3 having electrode films may be formed. A composite substrate 3 having electrode films coated with a moisture-proof film may be employed. Structure of the composite substrate 3 having the electrode films coated with the moisture-proof film may be formed.

Preferably, the moisture-proof film 6 is formed at least on part of the resin substrate 2 protruding from the sealing member 7. In the form of FIG. 1, the moisture-proof film 6 coats a surface of part of the resin substrate 2 protruding from the sealing member 7. Thus, if the resin substrate 2 is coated with the moisture-proof film 6 so as to be hidden from outside, it is possible to prevent inward penetration of moisture through the resin substrate 2. As a result, degradation of the device can be effectively suppressed because moisture is hard to reach the organic multilayer 5 provided within the sealed region. In the present form, the moisture-proof film 6 is formed to cross the border part between the resin substrate 2 and the moisture-proof substrate 1. Accordingly, the interface between the resin substrate 2 and the moisture-proof substrate 1 is hidden from outside. It is consequently possible to prevent moisture penetration through the interface between the resin substrate 2 and the moisture-proof substrate 1 and to suppress degradation of the device caused by the moisture penetration.

In the organic electric device of FIG. 1, the sealing member 7 is formed on a surface of the moisture-proof film 6. Specifically, the organic multilayer 5 is sealed with the sealing member 7 after the moisture-proof film 6 is formed. The moisture-proof film 6 is formed to cross an edge of the sealing member 7 (an edge of the sealing region). Thus, if the moisture-proof film 6 is formed to cross the edge of the sealing region, the resin substrate 2 can be coated with the moisture-proof film 6 from an outside to an inside of the sealing region. It is consequently possible to further prevent the moisture penetration through the resin substrate 2. Alternatively, after sealing with the sealing member 7, the moisture-proof film 6 may be formed so that the resin substrate 2 exposed from the sealing member 7 is coated with the moisture-proof film 6.

The moisture-proof film 6 has lower moisture permeability than that of the resin substrate 2. Moisture can be accordingly prevented from penetrating the resin substrate 2. It is therefore preferable that the moisture-proof film 6 be formed of material having lower moisture permeability than that of the resin substrate 2. It is also preferable that the moisture-proof film 6 have electrical insulation. Since the organic electric device requires (positive and negative) electrode terminals electrically conducted to the organic multilayer 5, the electrode terminals may be provided in contact with the moisture-proof film 6. There is therefore a concern about short circuit if the moisture-proof film 6 does not have electrical insulation. It is accordingly preferable that the moisture-proof film 6 be formed from material having electrical insulation and moisture-proofness.

For example, the moisture-proof film 6 may be formed of material containing inorganic component as principal component. If the principal component is the inorganic component, moisture penetration can be highly prevented. The material containing the inorganic component as the principal component may contain organic component or resin for the purpose of binding, but it is more preferable to contain neither organic component nor resin. In this case, moisture penetration can be further effectively prevented. For example, the inorganic component may contain at least one selected from the group consisting $SiO_2$, $SiN_x$, $SiN$, $MoO_3$ and $SiC$. Barrier property with respect to moisture can be enhanced by using such material. For example, the moisture-proof film 6 can be easily formed if the layer is formed of a deposition layer in order to form the layer out of only the inorganic material.

It is also preferable that the moisture-proof film 6 be formed of composition containing grains of glass, or coating glass. The composition containing grains of glass includes fluid medium and grains of glass dispersed in the fluid medium. The coating glass is glass material having fluidity. A glass coating layer is formed of the coating glass. The moisture-proof film 6 can be formed by solidifying the glass material having fluidity or glass composition. Thus, by using glass as material, it is possible to easily form the moisture-proof film 6 having low moisture permeability. In a case where organic electric devices are manufactured by dividing and individuating as stated below, if the moisture-proof film 6 is made of glass material, individuating can be easily performed because glass material can be used for each material to be divided. In a case where the glass composition is fluidized by heating, it is preferable that the composition be fluidized at a lower temperature than a heat-proof temperature of the resin substrate 2. Mixture of glass material and binder may be employed as material of the coating glass. Examples of the binder include organic binder and inorganic binder. By forming the moisture-proof film 6 of the glass coating layer, moisture penetration can be effectively prevented. In this case, the glass coating layer may contain the inorganic material in order to enhance the barrier property with respect to moisture. By using the coating glass by which film deposition on the surface of the resin substrate 2 can be performed at ordinary or low temperature, the moisture-proof film 6 can be easily formed on the surface of the resin substrate 2.

The moisture-proof film 6 may be formed of moisture-proof resin composition. The moisture-proof resin composition may contain desiccant or filler. The moisture-proof film 6 can be easily formed by applying paste resin composition. Examples of the resin include thermoset resin and ultraviolet curing resin. In a case of the thermoset resin, it is preferable that a curing temperature thereof be lower than that of a heat-proof temperature of the resin substrate 2. Epoxy resin or the like is exemplified as the thermoset resin. Acrylic resin or the like is exemplified as the ultraviolet curing resin.

In a preferable aspect, the moisture-proof film 6 is a cured resin layer. The cured resin layer is a layer formed of curable resin composition. The curable property may be thermoset or photo-curing such as ultraviolet curing. In a case of the thermoset, it is preferable that curing be performed at a lower temperature than the heat-proof temperature of the resin substrate 2. The cured resin layer can be formed by applying and curing fluid resin composition (paste). Moisture penetration can be effectively prevented by forming the moisture-proof film 6 of the cured resin layer. The cured resin layer may contain the aforementioned inorganic material in order to enhance the barrier property with respect to moisture. The cured resin layer may contain desiccant in order to enhance the barrier property with respect to moisture. Examples of the resin material include: only epoxy resin; only acrylic resin; epoxy resin along with appropriate additive (curing agent, polymerization initiator or the like); and acrylic resin along with the additive. By using cured resin by which film deposition on the surface of the resin substrate 2 can be performed at ordinary or low temperature, the moisture-proof film 6 can be easily formed on the surface of the resin substrate 2.

The resin substrate 2 is made from synthetic resin and has few barrier property with respect to moisture. That is, the resin substrate 2 neither has moisture-proofness nor can prevent moisture penetration. Conversely, moisture is liable to penetrate through the resin substrate 2. On the other hand, the cured resin layer forming the moisture-proof film 6 is a layer containing resin but is a layer for preventing moisture penetration and formed as a layer having a high barrier property. It is therefore possible to prevent moisture from penetrating inside the device.

The moisture-proof film 6 may be formed by application or deposition. In a case of the application or the deposition, the moisture-proof film 6 can be efficiently formed. In a case of the application, it can be formed by inexpensive and simple manufacturing process. The film may be formed by other method such as, for example, sputtering.

The organic electric device requires electrode terminals configured to be connected to external electrical wirings in order to supply electricity to the organic multilayer 5 or to extract electricity from the organic multilayer 5. The electrode terminals require to be electrically conducted to the organic multilayer 5 in a region (a sealed region) sealed with the sealing member 7 and to be exposed outside the sealed region. A plurality of (at least (an anode and a cathode) two or more) electrode terminals is required for electrical conduction to an anode and a cathode in the organic multilayer 5. In the organic electric device of FIG. 1, the electrode terminals may be provided at regions obtained by cutting part of moisture-proof film 6, provided along the surface of the moisture-proof film 6, or protruded from the moisture-proof film 6 and the moisture-proof substrate 1. In these cases, if the resin substrate 2 is exposed outside, there is a concern that moisture may penetrate from exposed part thereof. Therefore, it is preferable that the resin substrate 2 be not exposed outside.

The composite substrate can be applied to different organic electric devices. Examples of the organic electric device include an organic electroluminescence device, an organic solar battery, an organic display device (an organic display) and other organic semiconductor devices. The composite substrate can be formed of a composite substrate of a substrate suitable to improve characteristics of the multilayer and a substrate suitable to protect the multilayer, and accordingly substrate material can be employed according to each organic electric device. By combining flexible substrates, a flexible substrate can be obtained.

In a preferable example, the organic electric device is an organic electroluminescence device (an organic EL device). In the organic EL device, the organic multilayer 5 is formed of an organic light-emitting multilayer 10 including a first electrode 14, an organic layer 15 and a second electrode 16.

Figure 3:
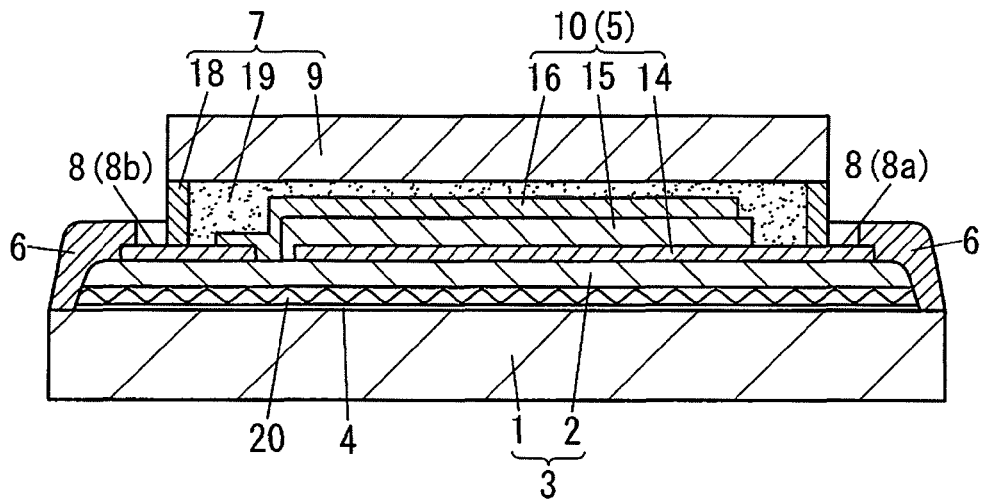
FIG. 3 is a sectional view showing an example of an organic electroluminescence device.

FIG. 3 shows an example of the organic EL device. In the organic EL device, the aforementioned composite substrate 3 is employed as a substrate for formation of the organic light-emitting multilayer 10. The composite substrate 3 is formed of the moisture-proof substrate 1 and the resin substrate 2 pasted on the surface of the moisture-proof substrate. The first electrode 14, the organic layer 15 and the second electrode 16 included in the organic light-emitting multilayer 10 are provided on the surface of the resin substrate 2 of the composite substrate 3 in that order. The organic light-emitting multilayer 10 is sealed with the sealing member 7. A region sealed with the sealing member 7 is the sealed region.

The structure of the composite substrate 3 is the same as the structure shown in FIGS. 2A to 2C. That is, the resin substrate 2 is formed to be smaller than the moisture-proof substrate 1 in planar view. Each end side 2b of the resin substrate 2 is formed into an inclined face that is inclined inward. Each corner 2c of the resin substrate 2 has a round.

In the organic EL device, the moisture-proof film 6 is formed on part in which the first and second lead-out electrodes 8a and 8b are not provided. In the present form, the moisture-proof film 6 coats part of the resin substrate 2 protruding from the sealing member 7.

Each of the moisture-proof substrate 1 and the resin substrate 2 is an optically transparent substrate. The first electrode 14 of the organic light-emitting multilayer 10 is an optically transparent electrode. Therefore, light generated in the organic layer 15 of the organic light-emitting multilayer 10 is taken out through the resin substrate 2 and the moisture-proof substrate 1. In general, the first and second electrodes 14 and 15 are anode and cathode, respectively, but may be reversed. The second electrode 16 may be a light reflection electrode. In this case, the second electrode 16 reflects light generated in the organic layer 15, so that the light can be taken out. Alternatively, with the second electrode 16 formed of an optically transparent electrode, a reflecting layer may be provided on an opposite surface of the second electrode 16 from the organic layer 15.

The organic layer 15 is a layer having a function for generating light and formed of two or more layers selected from the group consisting a hole injection layer, a hole transport layer, a luminous layer, an electron transport layer, an electron injection layer and an intermediate layer.

The sealing member 7 is formed of a sealing side wall 18 surrounding a periphery of the organic light-emitting multilayer 10, a sealing substrate 9 attached on the composite substrate 3 with the sealing side wall 18, and filler 19 filled in a region surrounded with the sealing side wall 18. The sealing side wall 18 is formed of moisture-proof material, for example, glass, moisture-proof resin or the like. The sealing substrate 9 is formed of moisture-proof material, for example, glass, moisture-proof resin or the like. The filler 19 may be formed of moisture-proof resin. The sealing side wall 18 can function as a dam member for holding back the filler 19. The sealing side wall 18 can function as a spacer for securing a thickness of the organic light-emitting multilayer 10.

In the organic EL device, the organic light-emitting multilayer 10 is provided on the surface of the composite substrate 3. Light generated in the organic layer 15 is to pass through the first electrode 14 and the resin substrate 2 to enter the moisture-proof substrate 1 and then to go out from the moisture-proof substrate 1. Thus, the light passes through the resin substrate 2 and thereby more light can be taken out. Light generated in the luminous layer reaches the substrate directly or after reflection, but if a refractive index difference at an interface thereof is large, more light cannot be taken out by total reflection. If the first electrode 14 is directly provided on the surface of the moisture-proof substrate 1, light to be taken out is decreased owing to a large refractive index difference. Therefore, in the present form, the substrate is formed of the composite substrate 3 of the moisture-proof substrate 1 and the resin substrate 2, and the resin substrate 2 having a refractive index near to the first electrode 14 is disposed at a light extraction side of the first electrode 14. As a result, the refractive index difference between the first electrode 14 and the composite substrate 3 can be reduced and light-extraction efficiency can be enhanced by preventing total reflection.

In order to enhance the light-extraction efficiency, it is preferable that a refractive index of the resin substrate 2 be similar to that of the first electrode 14. If the refractive index of the resin substrate 2 approximates the refractive index of the first electrode 14, total reflection caused by the refractive index difference can be prevented. For example, a difference between the refractive index of the resin substrate 2 and the refractive index of the first electrode 14 can be set to one or less. In order to decrease the refractive index difference, the resin substrate 2 may be formed of a plastic substrate having a high refractive index.

Light-extraction structure may be provided at the interface between the moisture-proof substrate 1 and the resin substrate 2. For example, in the form of FIG. 3, a light diffusion layer 20 as the light-extraction structure is provided on a surface of the resin substrate 2 on a side of the moisture-proof substrate 1. Thus, if the light diffusion layer 20 is provided, light entering the light diffusion layer 20 is diffused and a propagation direction of the light is changed. As a result, total reflection is prevented and more light can be extracted. The light diffusion layer 20 may be provided by forming uneven structure at an interface of two layers, or by forming a layer including light diffusion particles. The light-extraction structure may be formed by providing fine surface unevenness on the surface of the moisture-proof substrate 1. If the fine surface unevenness is provided, light entering the surface is scattered and a propagation direction of the light is changed. As a result, total reflection is prevented and more light can be extracted.

In the organic EL device, light can be generated by applying a voltage between the first electrode 14 and the second electrode 16 in order to recombine holes and electrons in the organic layer 15. It is accordingly necessary to extend the electrode terminals electrically conducted to the first and second electrodes 14 and 16 in order to provide the terminals at an outside of the sealed region. The electrode terminals are terminals to be electrically connected to external electrodes. In the form of FIG. 3, the electrode terminals are formed of the lead-out electrodes 8 electrically conducted to the electrodes. The lead-out electrodes 8 are formed of the first lead-out electrode 8a electrically conducted to the first electrode 14, and the second lead-out electrode 8b electrically conducted to the second electrode 16. The first and second lead-out electrodes 8a and 8b are structured to be electrically insulated not so as to be short-circuited.

In the present form, the lead-out electrodes 8 are exposed outside as the electrode terminals by cutting part of the moisture-proof film 6 or by providing holes pierced through the moisture-proof film 6, at an outside of the sealed region. The electrode terminals are exposed outside and thereby can be applied with a voltage. In this case, it is preferable that the electrode terminals be exposed outside so that the resin substrate 2 is not exposed outside. There is a concern that if the resin substrate 2 is exposed outside, moisture is liable to penetrate through exposed part thereof. For example, in a case where the moisture-proof film 6 is laminated, if the moisture-proof film 6 is formed by a pattern for exposing each part of the lead-out electrodes 8, the resin substrate 2 can be coated so that the electrode terminals are exposed but the resin substrate 2 is not exposed.

In the organic EL device according to the form, the moisture-proof film 6 coats part of the resin substrate 2 protruding from the sealed region sealed with the sealing member 7. The organic light-emitting multilayer 10 is sealed with the sealing substrate 9 and the moisture-proof substrate 1 having moisture-proofness. However, the resin substrate 2 included in the composite substrate 3 causes moisture penetration through the resin substrate 2. That is, if the resin substrate 2 is exposed outside, moisture may penetrate into the resin substrate 2 through the exposed part at the outside thereof and then reach the organic layer 15 within the sealed region through the resin substrate 2. Therefore, in the organic EL device according to the form, the moisture-proof film 6 coats part of the resin substrate 2 protruding outside the sealed region. Thus, the resin substrate 2 is hidden from outside, and accordingly moisture penetration from an outside can be prevented. The moisture-proof film 6 may be provided at least on part of the resin substrate 2 exposed outside when assuming that the moisture-proof film 6 is not present outside the sealed region. If the resin substrate 2 is not exposed outside the sealed region, moisture penetration can be efficiently prevented because the resin substrate 2 is not in direct contact with an exterior space.

Preferably, the moisture-proof film 6 coats the border part between the resin substrate 2 and the moisture-proof substrate 1. In this case, since the resin substrate 2 is smaller than the moisture-proof substrate 1 in planar view, the moisture-proof film 6 is formed to be in contact with the surface 1a of the periphery end of the moisture-proof substrate 1. If the border part between the moisture-proof substrate 1 and the resin substrate 2 is exposed, moisture may penetrate through the interface between the moisture-proof substrate 1 and the resin substrate 2. However, since the moisture-proof film 6 coats the border part between the resin substrate 2 and the moisture-proof substrate 1, the interface between the moisture-proof substrate 1 and the resin substrate 2 is hidden from outside. As a result, moisture penetration from an outside can be further prevented.

There is no need to provide the moisture-proof film 6 on a center region of the composite substrate 3 in planar view. The center region of the composite substrate 3 is a region formed with a luminous region by providing the organic light-emitting multilayer 10 thereon. That is, there is a concern that if the moisture-proof film 6 is provided on that region, light-extraction efficiency cannot be enhanced. By providing the moisture-proof film 6 only on the periphery end of the composite substrate 3, the moisture-proof film 6 can be easily formed so that the moisture-proof film 6 is not formed on the luminous region.

In the organic EL device according to the form, the resin substrate 2 is walled off from an exterior space and is not exposed outside. That is, the opposite surface of the resin substrate 2 from the organic light-emitting multilayer 10 is covered with the moisture-proof substrate 1 and is walled off from an exterior space. The surface of the resin substrate 2 on a side of the organic light-emitting multilayer 10 is walled off from an exterior space with the center region thereof sealed with the sealing member 7. The periphery end of the resin substrate 2 outside the sealed region is sheltered from an exterior space with the surface and side thereof covered with the moisture-proof film 6 and the lead-out electrodes 8. It is consequently possible to effectively prevent moisture penetration from an outside to the resin substrate 2 because the resin substrate 2 neither is totally exposed outside nor is in contact with an exterior space.

Figure 4:
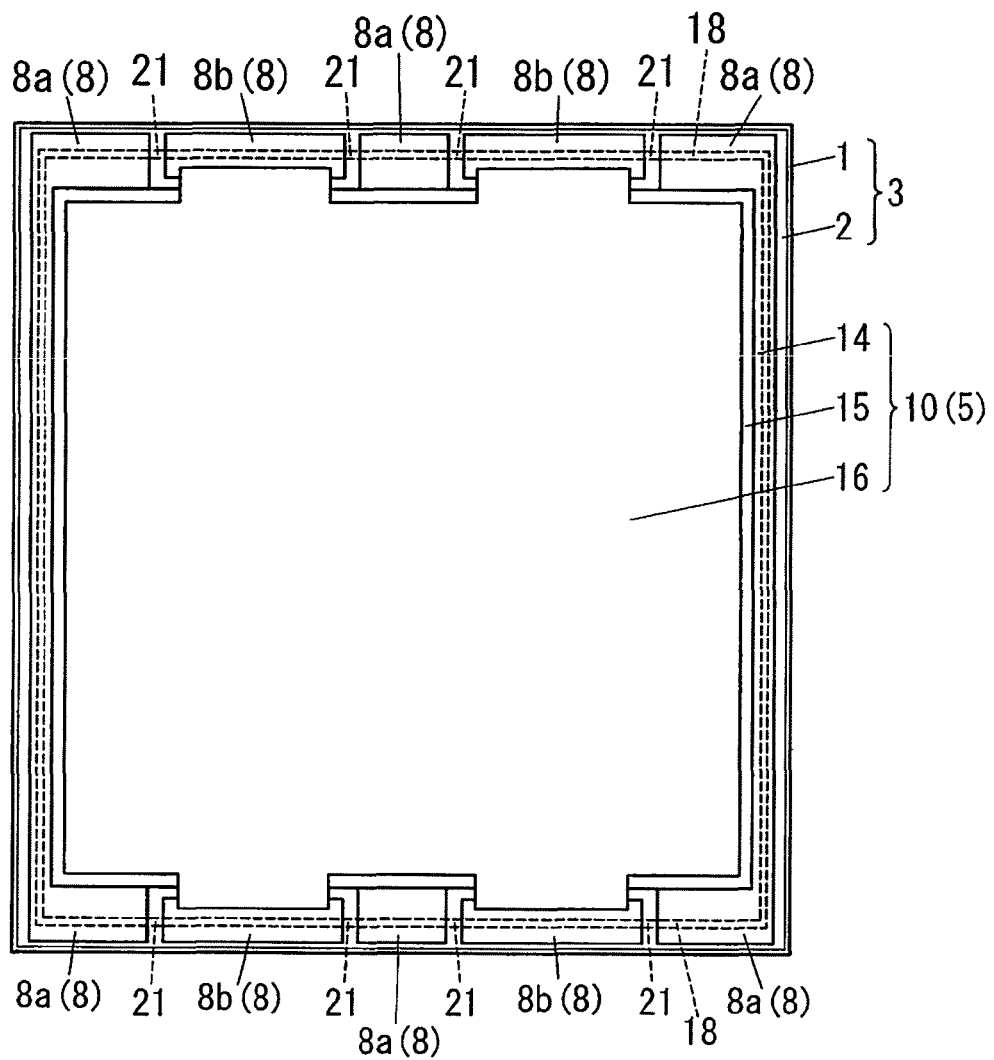
FIG. 4 is a plan view showing an example of the composite substrate and the organic electroluminescence device.

FIG. 4 shows an example of the organic EL device in planar view (as seen from a direction perpendicular to the substrate surface). In the organic EL device, first lead-out electrodes 8a and second lead-out electrodes 8b are alternately separated and arranged at each of ends of the moisture-proof substrate 1 (upper and lower ends in the figure). The sealing side wall 18 is provided so as to surround the periphery of the organic light-emitting multilayer 10. The sealing side wall 18 is formed of adhesive material. The sealing substrate 9 is pasted on the moisture-proof substrate 1 on a side of the surface of the moisture-proof substrate 1 (the side of the organic light-emitting multilayer 10) through the sealing side wall 18. In FIG. 4, the sealing substrate 9 is omitted and a region provided with the sealing side wall 18 is indicated by a broken line. In this case, the sealed region is a region of which the periphery is surrounded with the sealing side wall 18. As shown in the form of FIG. 4, in a case where a moisture-proof substrate 1 shaped like a rectangle is employed, ends of the substrate (right and left ends in FIG. 4) may be formed with no lead-out electrodes 8 to be separately formed. First lead-out electrodes 8a are extended on each of the ends of the substrate.

As described above, the organic light-emitting multilayer 10 is sealed with the sealing substrate 9 pasted to the composite substrate 3 through the sealing side wall 18. However, the composite substrate 3 including, at a surface side thereof, the resin substrate 2 has an issue of moisture penetration through the resin substrate 2. Therefore, in the organic EL device, it is preferable that the moisture-proof film 6 for preventing moisture penetration be formed part of the surface of the resin substrate 2, in which no first and second lead-out electrodes 8a and 8b are formed. As a result, the resin substrate 2 is coated with the moisture-proof film 6, and accordingly moisture penetration can be prevented. The moisture-proof film 6 is a layer that functions as a barrier with respect to moisture and can be regarded as a barrier layer.

Figure 5:
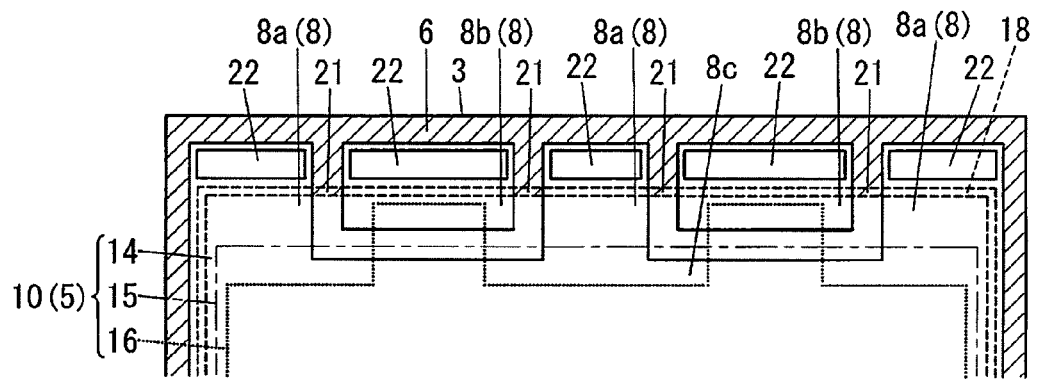
FIG. 5 is a plan view showing an example of a composite substrate provided with a moisture-proof film.

FIG. 5 shows an example of the moisture-proof film 6 provided on the composite substrate 3. FIG. 5 shows the moisture-proof film 6 in the organic EL device. In the figure, the moisture-proof film 6 is indicated by an oblique line part. In FIG. 5, an end edge of the second electrode 16 is indicated by a dotted line, and the organic layer 15 is indicated by a dashed line. The sealing side wall 18 is indicated by a broken line.

As shown in FIG. 5, the first and second lead-out electrodes 8a and 8b are formed by forming patterned conductive layers on the surface of the resin substrate 2 on ends of the substrate. The moisture-proof film 6 is formed on the surface of the resin substrate 2 in which no first and second lead-out electrodes 8a and 8b are formed (oblique line part). In the present form, the moisture-proof film 6 is provided outside the sealing side wall 18 including an organic light emitting multilayer 10. Thus, by forming the moisture-proof film 6, part of the resin substrate 2 outside the sealed region is coated with the conductive layers forming the first and second lead-out electrodes 8a and 8b and the moisture-proof film 6 burying gaps of the conductive layers. By coating the surface of the resin substrate 2, it is possible to block a penetration path of moisture from an outside to prevent moisture from penetrating inside the device. Each of the conductive layers (transparent electrode layers) formed on the surface of the resin substrate 2 is a layer having barrier property such that moisture is harder to penetrate in comparison with resin. Thus, the resin substrate 2 is coated with the conductive layers and the moisture-proof film 6.

Each lead-out electrode 8 can function as an electrode terminal of a corresponding electrode. As shown in FIG. 5, the first lead-out electrodes 8a are formed to be extended separately from center part 8c of a conductive layer to a side of an end thereof, where the conductive layer is unified to a conductive layer that is disposed on a center side and forms the first electrode 14. The first lead-out electrodes 8a are protruded outside the sealed region, thereby functioning as electrode terminals of the first electrode 14. The second lead-out electrodes 8b are formed to cross a region of the sealing side wall 18 to protrude outside the sealed region, thereby functioning electrode terminals of the second electrode 16.

As shown in FIG. 5, auxiliary electrodes 22 may be provided on surfaces of the first and second lead-out electrodes 8a and 8b in order to support electrical conductivity of each lead-out electrode 8. By providing the auxiliary electrodes 22, it is possible to enhance electrical conductivity of each of the first and second lead-out electrodes 8a and 8b. The auxiliary electrodes 22 may be formed of material with higher electrical conductivity than that of conductive layers forming the first and second lead-out electrodes 8a and 8b. For example, the conductive layers may be formed of transparent metal oxide layers such as ITO, and the auxiliary electrodes 22 may be formed of metal layers. In order to improve adhesion between the conductive layers and the auxiliary electrodes 22, each of the auxiliary electrodes 22 may be formed of layers including material having good adhesion, a metal layer having high electrical conductivity and the like. The auxiliary electrodes 22 may be non-transparent. The auxiliary electrodes 22 may be provided on regions except for the sealing side wall 18. In FIG. 5, the auxiliary electrodes 22 are formed on the surfaces of the lead-out electrodes 8 outside the sealed region, but the auxiliary electrodes 22 may be formed on the surfaces of the lead-out electrodes 8 inside the sealed region. The auxiliary electrodes 22 provided outside the sealed region can function as electrode pads.

Figure 6A:
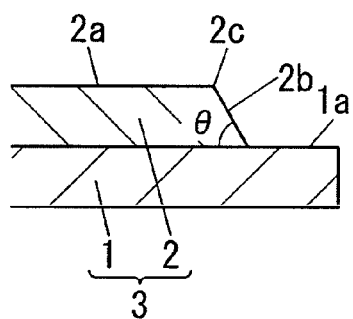
FIGS. 6A and 6B are enlarged sectional views illustrating composite substrates.
Figure 6B:
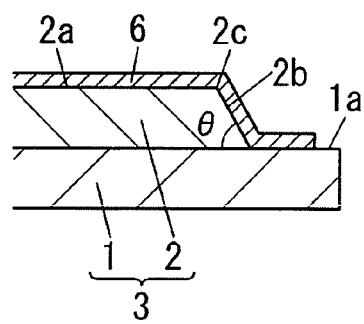

FIGS. 6A and 6B show an example of a neighborhood around an end of the composite substrate 3. FIG. 6A shows a composite substrate 3 in which a resin substrate 2 is formed on a surface of a moisture-proof substrate 1. In the aforementioned organic EL device, a moisture-proof film 6 is laminated on a surface of the end of the composite substrate 3. In the composite substrate 3 shown in the form of FIG. 6A, an end side 2b of the resin substrate 2 is formed into an inclined face that is inclined inward. If the moisture-proof film 6 is laminated on the composite substrate 3, the moisture-proof film 6 is formed on a surface of the inclined face as shown in FIG. 6B. As a result, the moisture-proof film 6 can be prevented from being cut on an end edge, and the resin substrate 2 can be prevented from being exposed outside.

Figure 7A:
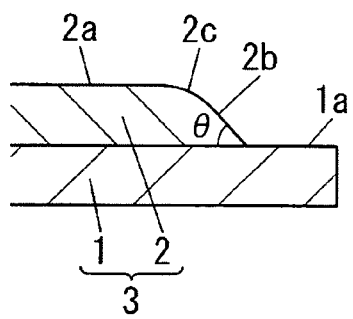
FIGS. 7A and 7B are enlarged sectional views illustrating composite substrates.
Figure 7B:
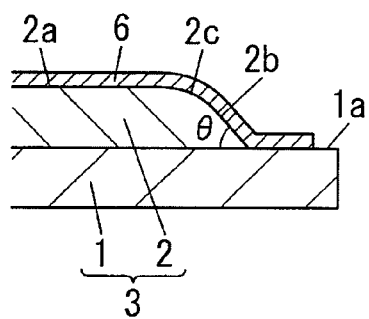

FIGS. 7A and 7B show an example of a neighborhood around an end of the composite substrate 3. In the example of the composite substrate 3 shown in the form of FIG. 7A, an end side 2b of a resin substrate 2 is formed into an inclined face that is inclined inward, and a corner 2c that is an edge between a surface 2a and the end side 2b of the resin substrate 2 is shaped like a curve. If a moisture-proof film 6 is laminated on the composite substrate 3, the moisture-proof film 6 is formed on a surface of the inclined face while crossing the round corner 2c as shown in FIG. 7B. As a result, the moisture-proof film 6 can be further prevented from being cut on the end edge, and the resin substrate 2 can be prevented from being exposed outside.

Figure 8A:
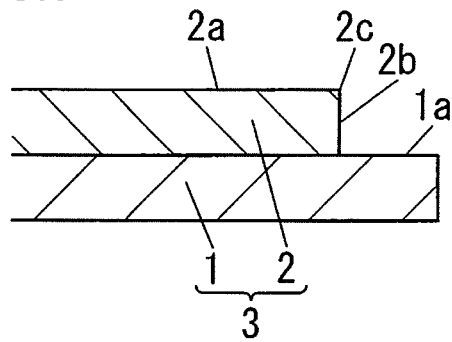
FIGS. 8A to 8C are enlarged sectional views illustrating comparative examples of composite substrates.
Figure 8B:
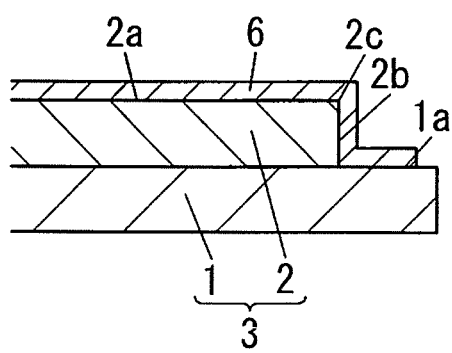
Figure 8C:
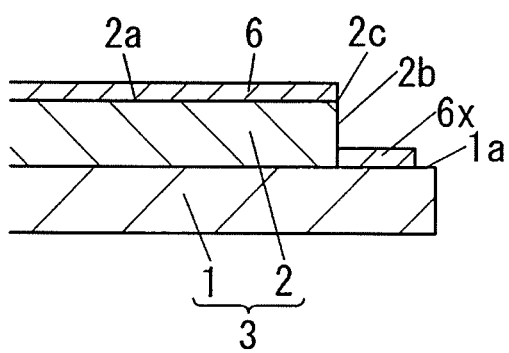

FIGS. 8A to 8C show a comparative example of a neighborhood around an end of the composite substrate 3. In the composite substrate 3 shown in FIG. 8A, a resin substrate 2 is formed on a surface of a moisture-proof substrate 1. In the form of FIG. 8A, a side of the resin substrate 2 is perpendicular to a surface of the moisture-proof substrate 1. In the form, if a moisture-proof film 6 covers the side 2b of the resin substrate 2 as shown in FIG. 8B, all of the end of the resin substrate 2 can be coated. However, if the side of the resin substrate 2 is a perpendicular face, there is a concern that the moisture-proof film 6 is not successfully formed as shown in FIG. 8C. In this case, a divided part 6x of the moisture-proof film 6 may be formed as a result of cutting of the moisture-proof film 6 at the end edge, for example, in a case where a thickness of the resin substrate 2 is much thicker than that of the moisture-proof film 6. If the moisture-proof film 6 is divided, the resin substrate 2 is exposed outside and moisture may be liable to penetrate through the part. Even if the moisture-proof film 6 is not divided, there is a concern that moisture is liable to penetrate in a case where a thickness of the moisture-proof film 6 is made thin because such thin part cannot have sufficient barrier property with respect to moisture. Accordingly, by forming the end side 2b of the resin substrate 2 into the inclined face as shown in FIGS. 6A, 6B, 7A and 7B, the moisture-proof film 6 can form a sufficient coat.

Figure 9A:
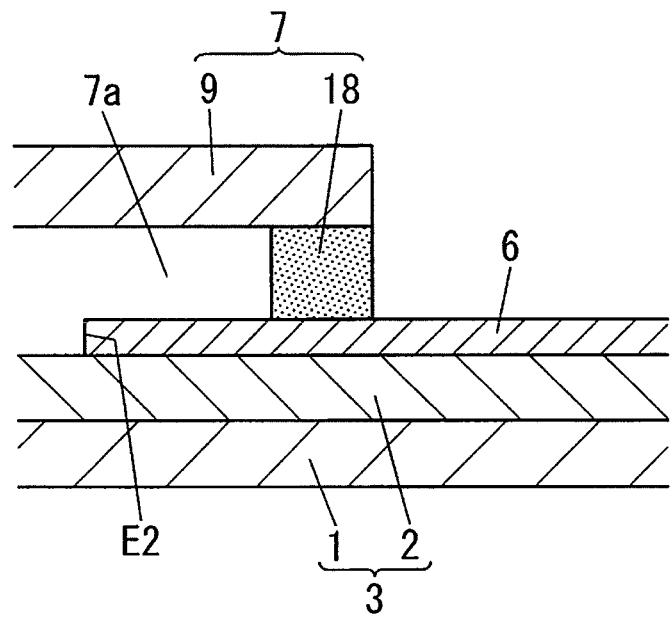
FIGS. 9A and 9B are enlarged sectional views each of which illustrates a composite substrates provided with a moisture-proof film.
Figure 9B:
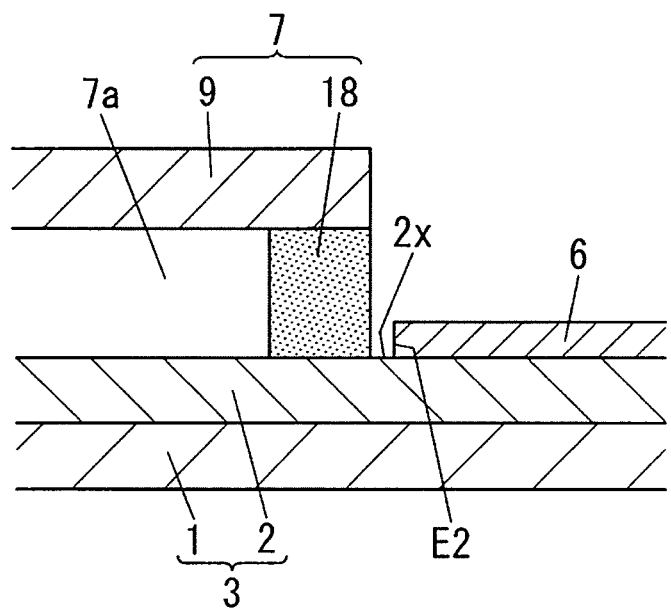

Each of FIGS. 9A and 9B shows an example of a moisture-proof film 6 at a separation area between a first lead-out electrode 8a and a second lead-out electrode 8b. In the structure, a sealed space 7a that is a space is formed between a composite substrate 3 and a sealing substrate 9, in which an organic light-emitting multilayer 10 is housed. That is, an organic EL device has a hollow structure with no filler 19. In FIG. 9B, E2 shows an inner edge of a moisture-proof film 6.

FIG. 9B is an example in which the sealing substrate 9 is pasted to the composite substrate 3 on an area in which no moisture-proof film 6 is provided. In this example, a sealing side wall 18 is provided inside the inner edge E2 of the moisture-proof film 6. The inner edge E2 of the moisture-proof film 6 is disposed outside an outer edge of the sealing side wall 18. In FIG. 9B, a resin substrate 2 is present at a gap between the first lead-out electrode 8a and the second lead-out electrode 8b, and the sealing side wall 18 is formed on a surface of the resin substrate 2. As shown in FIG. 9B, there is a concern that an exposed part 2x is formed as part of the resin substrate 2 exposed outside by a gap which is to be easily made between the sealing side wall 18 and the moisture-proof film 6. Even if the inner edge E2 of the moisture-proof film 6 and a side of the sealing side wall 18 are fit together without forming the exposed part 2x of the resin substrate 2, the moisture-proof film 6 is interrupted at the side of the sealing side wall 18. There is therefore a concern that moisture is liable to penetrate the resin substrate 2 through an interface between the moisture-proof film 6 and the sealing side wall 18.

FIG. 9A is an example in which the sealing substrate 9 is pasted to the composite substrate 3 on an area in which the moisture-proof film 6 is provided. In this example, the sealing side wall 18 is provided outside the inner edge E2 of the moisture-proof film 6. The inner edge E2 of the moisture-proof film 6 is disposed inside an inner edge of the sealing side wall 18. In FIG. 9A, the moisture-proof film 6 is present at the gap between the first lead-out electrode 8a and the second lead-out electrode 8b, and the sealing side wall 18 is formed on a surface of the moisture-proof film 6. As shown in FIG. 9A, the moisture-proof film 6 is continuously provided between an inside and an outside of the sealed region with the moisture-proof film 6 crossing a region of the sealing side wall 18, and it is accordingly possible to prevent moisture penetration from a side of the sealing side wall 18 like FIG. 9B. Thus, by forming the sealing side wall 18 at a region in which the moisture-proof film 6 is provided, moisture penetration can be effectively prevented.

Figure 10:
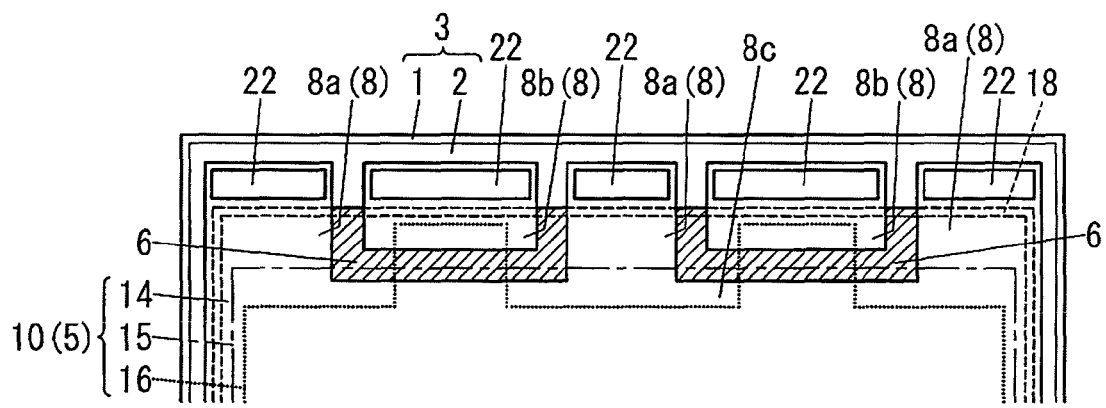
FIG. 10 is a plan view illustrating a composite substrate provided with a moisture-proof film.

FIG. 10 shows other example of a moisture-proof film 6 for the structure of a composite substrate 3. This figure shows an organic EL device, and the moisture-proof film 6 is indicated by an oblique line part. In a preferable form, the moisture-proof film 6 is formed at least at a region sealed with a sealing member 7.

In the structure of the composite substrate 3 according to the from, the moisture-proof film 6 for preventing moisture penetration is formed at regions of a surface of a resin substrate 2 inside a sealed region, in which no first and second lead-out electrodes 8a and 8b are formed. As a result, moisture penetration can be prevented because the resin substrate 2 neither is in contact with a filler 19 nor is exposed inside a sealed space 7a. The moisture-proof film 6 may be formed at a region sealed with at least a sealing substrate 9. In the hollow structure, if the resin substrate 2 is not exposed in the sealed region, the resin substrate 2 is not in direct contact with the sealed space 7a. In filling structure, moisture penetration can be effectively prevented because the resin substrate 2 is not in direct contact with the filler 19.

As shown in FIG. 10, patterned conductive layers are formed on a surface of the resin substrate 2 on an end of the substrate inside the sealed region, and the first and second lead-out electrodes 8a and 8b are formed. The moisture-proof films 6 are formed on the surface of the resin substrate 2 on regions in which no first and second lead-out electrodes 8a and 8b are formed. Thus, by forming the moisture-proof films 6, the resin substrate 2 inside the sealed region is coated with: conductive layers forming a first electrode 14, the first lead-out electrodes 8a and the second lead-out electrodes 8b; and the moisture-proof films 6 buried in gaps among the conductive layers. Since the surface of the resin substrate 2 is coated, a penetration path of moisture is blocked and moisture penetration inward the device can be prevented. Each of the conductive layers (transparent electrode layers) formed on the surface of the resin substrate 2 is a layer having barrier property by which moisture is harder to penetrate in comparison with resin. Therefore, what is needed is to coat the resin substrate 2 with the conductive layers and the moisture-proof film 6.

In the form, as shown in FIG. 10, each moisture-proof film 6 is formed on a whole gap between first and second lead-out electrodes 8a and 8b, which extends in an electrode lead-out direction and in a direction perpendicular to the electrode lead-out direction. That is, each moisture-proof film 6 is formed between a second lead-out electrode 8b and unified center part 8c before the first lead-out electrodes 8a are separated at an end. As a result, an organic layer 15 is prevented from being in direct contact with the resin substrate 2, and degradation caused by moisture can be further suppressed.

Figure 11:
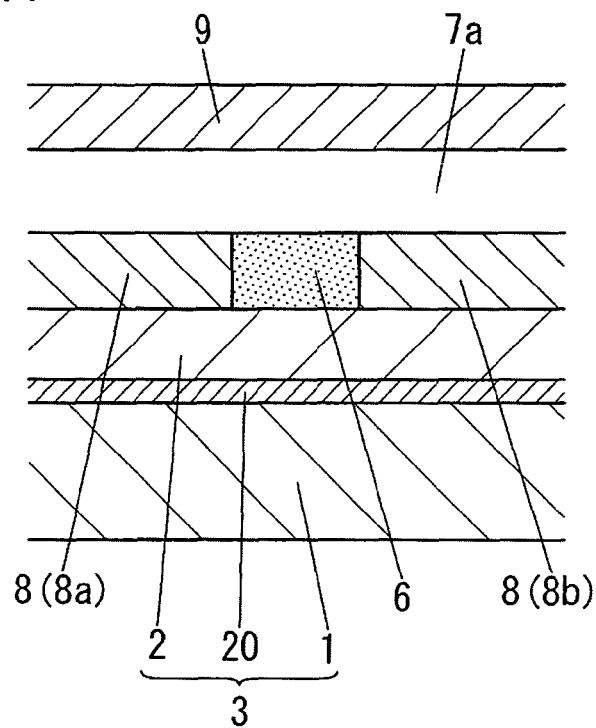
FIG. 11 is an enlarged sectional view illustrating a composite substrate provided with a moisture-proof film.

FIG. 11 is a sectional view showing a structure example around border part between a first lead-out electrode 8a and a second lead-out electrode 8b. As shown in the figure, a moisture-proof film 6 is provided between the first and second lead-out electrodes 8a and 8b so as to be contact with the first and second lead-out electrodes 8a and 8b. In the form, the resin substrate 2 is blocked from a sealed space 7a with the moisture-proof film 6. Thus, the moisture-proof films 6 coat regions in which no first and second lead-out electrodes 8a and 8b are provided. As a result, moisture penetration from the regions can be prevented.

In FIG. 10, a region provided with the sealing side wall 18 is indicated by broken lines. In the form of FIG. 10, the sealing side wall 18 is provided on surfaces of the first and second lead-out electrodes 8a and 8b, and surfaces of moisture-proof films 6. In the form, end edges of the moisture-proof films 6 between the first and second lead-out electrodes 8a and 8b are arranged at almost the same position as an outer edge of the sealing side wall 18. Thus, when the sealing side wall 18 is provided on the surfaces of the moisture-proof films 6 with the sealing side wall 18 out of contact with the resin substrate 2, the moisture-proof films 6 can widely coat the resin substrate 2. As a result, moisture penetration can further prevented. If gaps of an adhesive joint of the sealing side wall 18 are reduced, adhesive strength for the sealing substrate 9 can be increased. Outer end edges of the moisture-proof films 6 may be disposed inside the outer edge of the sealing side wall 18. In this case, it is preferable that the outer end edges of the moisture-proof films 6 be disposed on or outside the inner edge of the sealing side wall 18. Accordingly, the moisture-proof films 6 are in contact with the sealing side wall 18, and the resin substrate 2 can be coated so as not to be exposed at the border part between the moisture-proof films 6 and the sealing side wall 18. As a result, moisture penetration can be prevented.

The moisture-proof films 6 are provided on the regions of the surface of the resin substrate 2, in which no first and second lead-out electrodes 8a and 8b are formed. That is, the moisture-proof films 6 are provided on regions without conductive layers forming the first electrode 14 and the first and second lead-out electrodes 8a and 8b. In a case where the moisture-proof films 6 are formed in the sealed region, it is preferable that the moisture-proof films 6 are provided on all regions of the surface of the resin substrate 2 without the conductive layers inside the sealed region. Accordingly, since the surface of the resin substrate 2 can be coated with the conductive layers and the moisture-proof films 6, barrier property with respect to moisture can be enhanced. In the case, since the organic layer 15 can be formed on the surface of the first electrode 14 and the surfaces of the moisture-proof films 6, the organic layer 15 can be formed to be out of contact with the resin substrate 2. It is therefore possible to further prevent moisture penetration toward the organic layer 15. In the hollow structure, it is preferable that when the organic light-emitting multilayer 10 is sealed, the moisture-proof films 6 can coat the resin substrate 2 so that it is not exposed within the sealed space 7a. The resin substrate 2 can be hidden even by, for example, providing the moisture-proof films 6 and extension part of the organic layer 15 on the regions without the first and second lead-out electrodes 8a and 8b in order to coat the resin substrate 2. In this case, it is preferable that a layer (e.g., a first organic layer 15a) in the organic layer 15 which is in contact with the first electrode 14 be a moisture-proof layer. The moisture-proof first organic layer 15a can be formed by applying, e.g., moisture-proof material.

In FIG. 10, an end edge of the second electrode 16 is indicated by a dotted line, and the organic layer 15 is indicated by a dashed line. In the form of FIG. 10, part of the second electrode 16 extended toward an end thereof crosses the moisture-proof films 6 to be connected with the second lead-out electrodes 8b. That is, the second electrode 16 is out of contact with the resin substrate 2. In a case where the second electrode 16 is formed by deposition, there is a concern that moisture is liable to permeate through the second electrode 16 because the moisture may penetrate from an interface between the second electrode 16 and the resin substrate 2 if the second electrode is directly formed on the surface of the resin substrate 2. That is, the layer formed of electrode material by deposition is low in density, and accordingly may have a tendency to be low in barrier property with respect to moisture. However, in the present form, since the second electrode 16 is out of contact with the resin substrate 2, moisture penetration through the second electrode 16 can be prevented.

Figure 12:
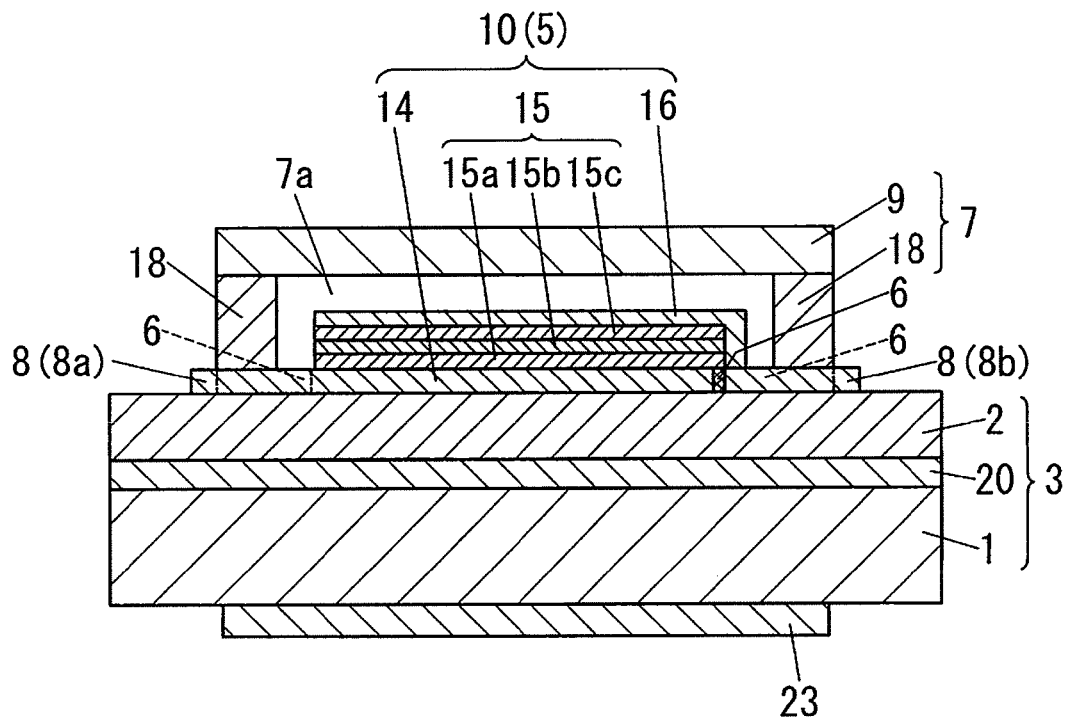
FIG. 12 is a sectional view showing an example of an organic electroluminescence device.

FIG. 12 is a sectional view showing an example of an organic EL device. In the organic EL device, electrode lead-out structure at an end is the same as the structure shown in FIG. 10. A moisture-proof film 6 is formed between first lead-out electrodes 8a and second lead-out electrodes 8b inside a sealed region. As a result, moisture penetration can be highly prevented.

Figure 13:
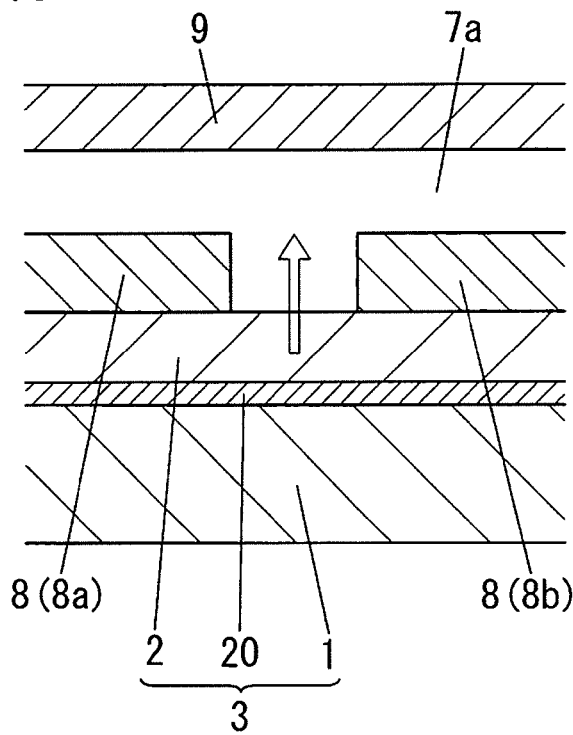
FIG. 13 is an enlarged sectional view illustrating a comparative example of a composite substrate.
Figure 14:
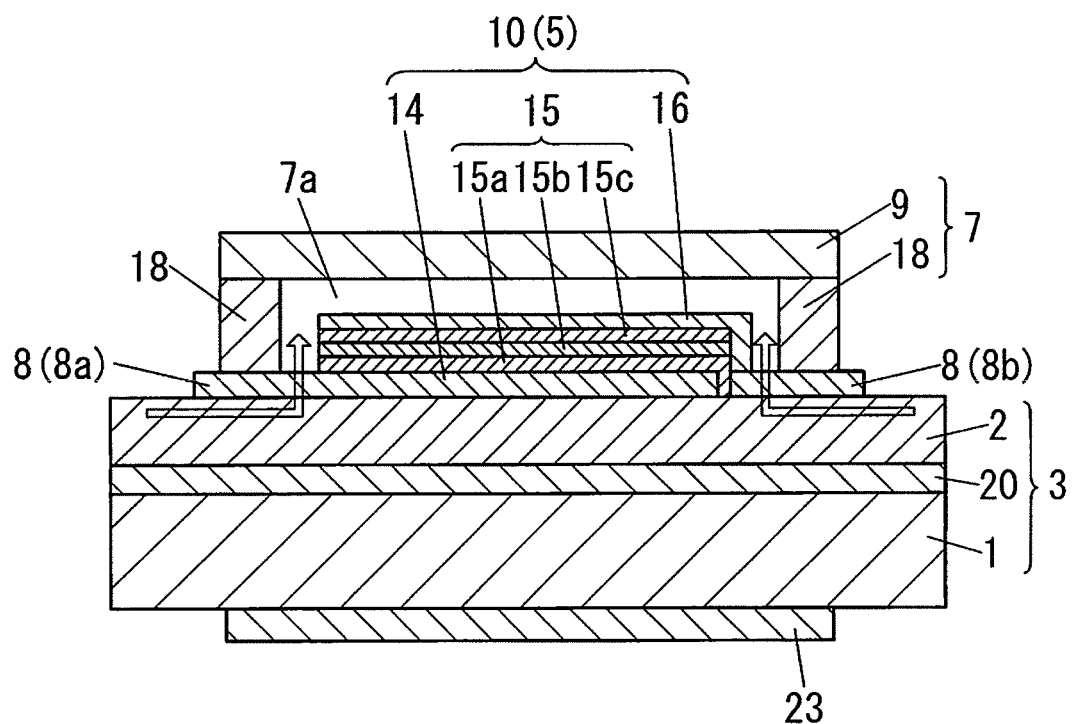
FIG. 14 is an enlarged sectional view showing a comparative example of an organic electroluminescence device.

FIGS. 13 and 14 show an organic EL device with no moisture-proof film 6. In the form, no moisture-proof film 6 is provided and accordingly moisture is liable to penetrate into a resin substrate 2. As shown by an outline arrow, moisture penetrated into the resin substrate 2 may be discharged inward from a gap between first and second lead-out electrodes 8a and 8b. It is therefore preferable that the moisture-proof films 6 be provided inside the sealed region in order to prevent moisture penetration as shown in FIGS. 10 to 12.

In the form of FIG. 12, a light-extraction part 23 is provided on an outer surface of the moisture-proof substrate 1. The light-extraction part 23 can be formed by providing uneven structure on a surface thereof or providing a light scattering layer containing light scattering substance. In order to explain that an organic layer 15 is formed of a plurality of function layers, the organic layer 15 is divided into a first organic layer 15a, a second organic layer 15b and a third organic layer 15c. The organic layer 15 may be laminate structure of three or more layers.

Figure 15A:
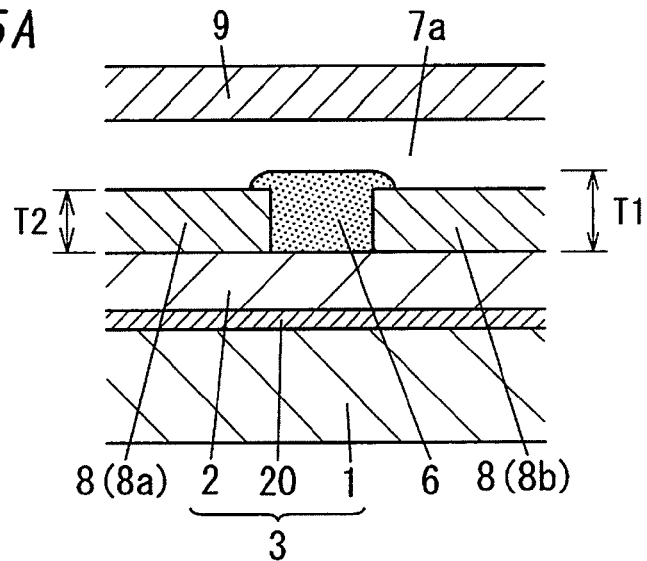
FIGS. 15A, 15B and 15C are enlarged sectional views each of which illustrates a composite substrate provided with a moisture-proof film.
Figure 15B:
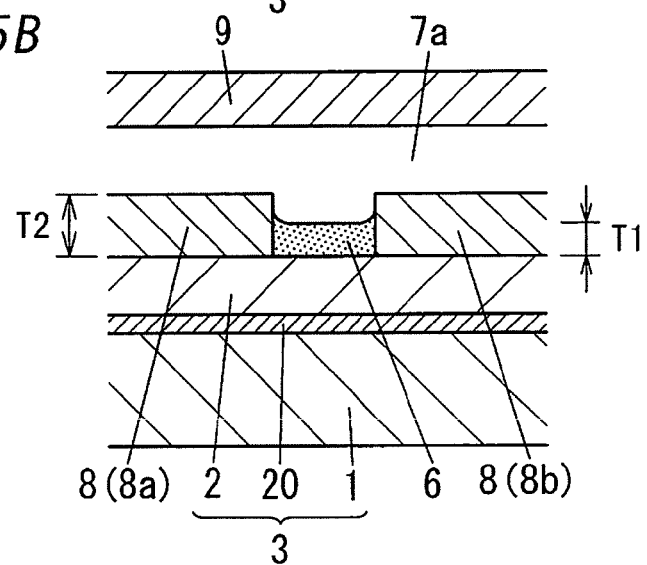
Figure 15C:
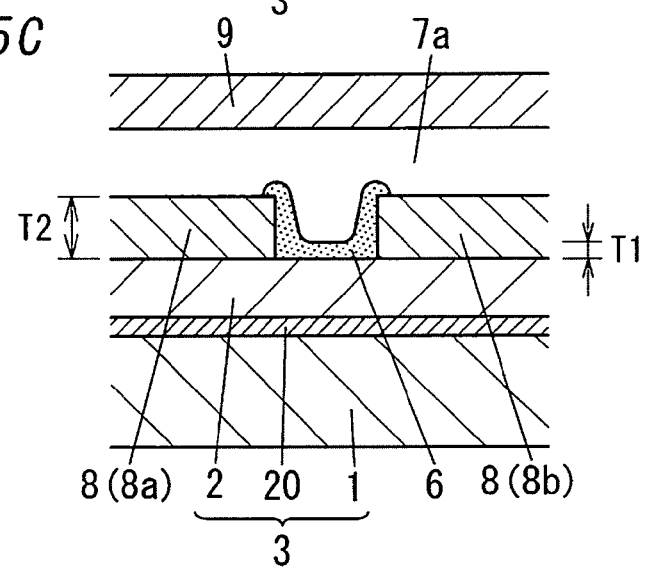

FIGS. 15A, 15B and 15C are examples each of which shows a laminate state of a moisture-proof film 6. In the form of FIG. 15A, a thickness of a moisture-proof film 6 is thicker than those of first and second lead-out electrodes 8a and 8b. The moisture-proof film 6 is formed even on end surfaces of the first and second lead-out electrodes 8a and 8b. That is, the moisture-proof film 6 is formed over lead-out electrodes 8.

The form of FIG. 15A can be shaped by laminating the moisture-proof film 6 with a mask pattern slightly larger than regions in which no first and second lead-out electrodes 8a and 8b are formed. Alternatively, it can be shaped by overflowing the moisture-proof film 6 from a gap between conductive layers when burying the gap with material of the moisture-proof film 6 to deposit on surfaces of end edges of the first and second lead-out electrodes 8a and 8b. In this case, the moisture-proof film 6 is large in quantity, and accordingly moisture penetration can be further prevented. The moisture-proof film 6 is formed over both ends of the first and second lead-out electrodes 8a and 8b. That is, since the moisture-proof film 6 covers the resin substrate 2, and sides and the surfaces of the ends of the first and second lead-out electrodes 8a and 8b, barrier property with respect to moisture can be further enhanced.

In the form of FIG. 15B, a thickness of a moisture-proof film 6 is thinner than those of first and second lead-out electrodes 8a and 8b. However, high barrier property with respect to moisture can be obtained because a resin substrate 2 is coated with the moisture-proof film 6 so that the resin substrate 2 neither is exposed inside a sealed space 7a nor is in contact with filler 19. Since the thickness of the moisture-proof film 6 can be made thin, efficiency in use of material can be enhanced.

In the form of FIG. 15C, a thickness of a moisture-proof film 6 is thinner than those of first and second lead-out electrodes 8a and 8b, but the moisture-proof film 6 is also formed over end surfaces of the first and second lead-out electrodes 8a and 8b. That is, the moisture-proof film 6 is formed to cross between both ends of the first and second lead-out electrodes 8a and 8b. As a result, the moisture-proof film 6 covers a resin substrate 2, and sides and surfaces of the ends of the first and second lead-out electrodes 8a and 8b, and accordingly barrier property with respect to moisture can be enhanced. Since the thickness of the moisture-proof film 6 can be made thin, efficiency in use of material can be enhanced.

A thickness T1 of a moisture-proof film 6 shown in each of FIGS. 15A, 15B and 15C may be almost the same as those of the first and second lead-out electrodes 8a and 8b as shown in the form of FIG. 11 (thickness of conductive layers), or may differ like each form of FIGS. 15A to 15C. When the thickness T1 of the moisture-proof film 6 is larger than those of the first and second lead-out electrodes 8a and 8b as shown in FIG. 15A, the moisture-proof film 6 is thick in thickness, and barrier property can be accordingly enhanced. In this case, there is no upper limit in thickness of the moisture-proof film 6, but the thickness of the moisture-proof film 6 may be, for example, one hundred times or less the thickness of conductive layers. The moisture-proof film 6 may be thin than thickness of conductive layers as shown in FIGS. 15B and 15C, and the thickness of the moisture-proof film 6 may be, for example, 0.05 times or more the thickness of the conductive layers. In short, the thickness of the moisture-proof film 6 can be appropriately set in order to secure barrier property with respect to moisture. For example, a thickness T2 of the conductive layers (the first electrode 14, and the first and second lead-out electrodes 8a and 8b) may be set in a range of 10 to 500 nm, but is not limited to this. For example, the thickness T1 of the moisture-proof film 6 may be set in a range of 5 nm to 50 μm, but is not limited to this. In a case where an end of a moisture-proof film 6 is covered with the organic layer 15 or the second electrode 16, it is preferable that the end of the moisture-proof film 6 have a tapered corner or a round corner in order to prevent short circuit. In the case of the tapered corner, it is preferable that a taper angle (an angle between a substrate surface and a tapered face) be small.

Figure 16:
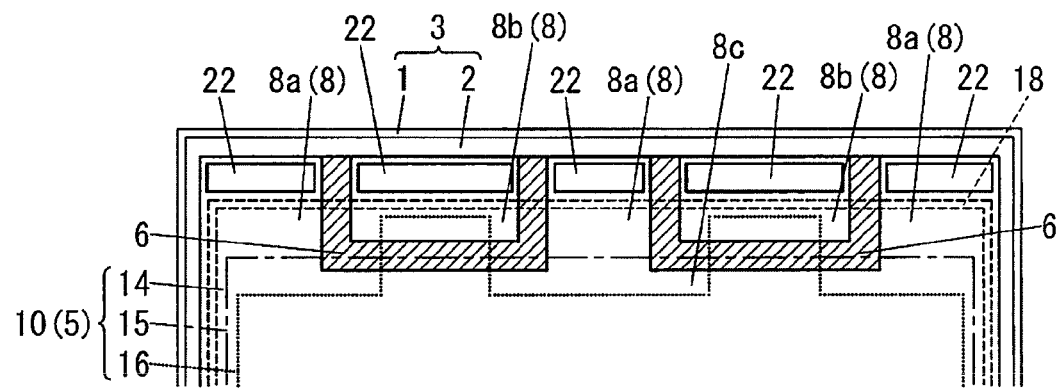
FIG. 16 is a plan view illustrating a composite substrate provided with a moisture-proof film.
Figure 17:
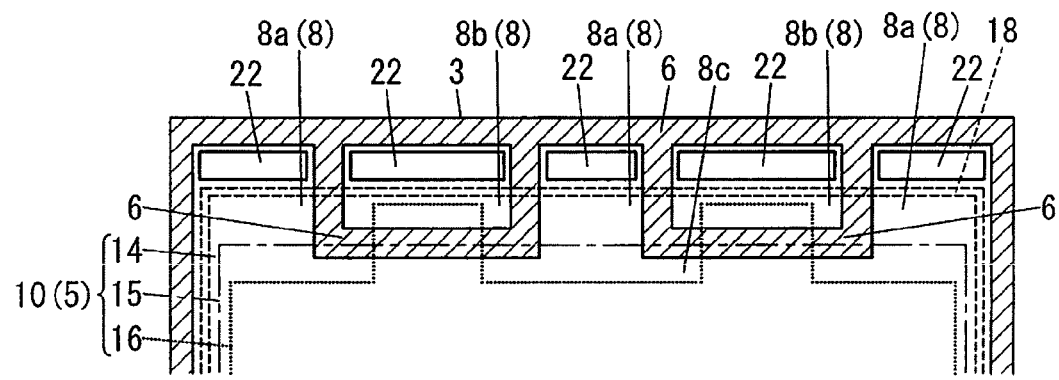
FIG. 17 is a plan view illustrating a composite substrate provided with a moisture-proof film.
Figure 18:
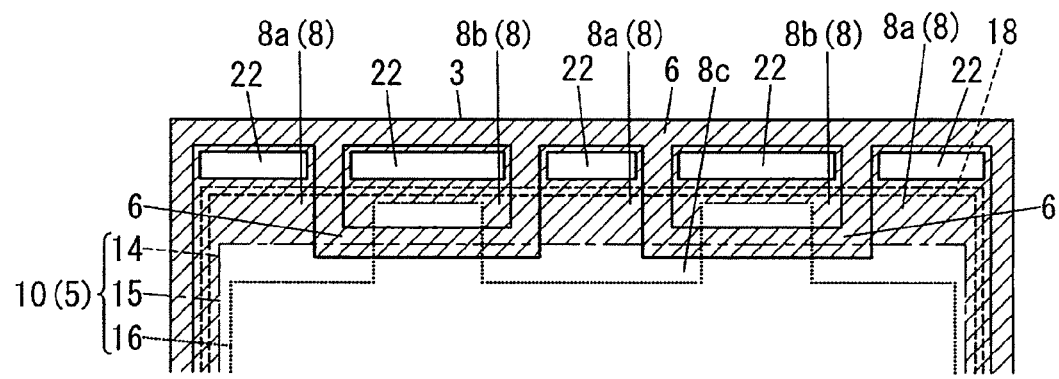
FIG. 18 is a plan view illustrating a composite substrate provided with a moisture-proof film.

FIGS. 16, 17 and 18 are examples in each of which a composite substrate 3 is provided with a moisture-proof film(s) 6. In the figures, a moisture-proof film 6 is indicated by an oblique line part.

As shown in a form of FIG. 16, each moisture-proof film 6 may be formed on or near end edges of first and second lead-out electrodes 8a and 8b on a side of a substrate periphery (end edges of conductive layers). In this case, each moisture-proof film 6 is formed to protrude from an inside to an outside of a sealed region with the film crossing a region of a sealing side wall 18. A surface area of a resin substrate 2 covered with the moisture-proof films 6 can be increased, and accordingly moisture penetration can be prevented. In this case, amount of material can be reduced in comparison with a case where the moisture-proof film 6 is formed on all regions of the resin substrate 2 exposed outside. In addition, each moisture-proof film 6 can be formed more simply and efficiently because each moisture-proof film 6 is small in surface area.

As shown in a form of FIG. 17, more preferably a moisture-proof film 6 is formed on all regions on end surfaces of a resin substrate 2 without first and second lead-out electrodes 8a and 8b. That is, it is more preferable that the moisture-proof film 6 be formed not only inside a sealed region but also a surface of the resin substrate 2 outside the sealed region. It is accordingly possible to coat the surface of the resin substrate 2 with the moisture-proof film 6 so as to be hidden from outside, thereby to prevent moisture from penetrating into the resin substrate 2 from an outside and to further prevent moisture from penetrating inward the device. In this case, it is preferable that end sides 2b of the resin substrate 2 be coated with the moisture-proof film 6. Specifically, as explained with reference to FIGS. 6A, 6B, 7A and 7B, the moisture-proof film 6 may be formed on the end sides 2b of the resin substrate 2 in addition to all surface 2a of the resin substrate 2 without the first and second lead-out electrodes 8a and 8b. That is, the resin substrate 2 is coated with the moisture-proof film 6 so as to be totally hidden from an outside. In this case, the resin substrate 2 can be coated so that the whole thereof including the sides 2b is not exposed. Accordingly, moisture penetration from an outside can be blocked, and moisture penetration can be highly prevented.

As shown in a form of FIG. 18, it is further preferable that a moisture-proof film 6 coats not only all regions without first lead-out electrodes 8a and second lead-out electrodes 8b but also the first lead-out electrodes 8a and the second lead-out electrodes 8b. In an inside of a sealed region in the form of FIG. 18, the moisture-proof film 6 is provided on: a region of a first electrode 14 except for a region on which an organic layer 15 is laminated; and regions of second lead-out electrodes 8b except for regions on which a second electrode 16 is laminated. In an outside of the sealed region, the moisture-proof film 6 is formed on a whole region except for regions on which auxiliary electrodes 22 are formed. That is, the moisture-proof film 6 is provided so as to cover substrate ends with openings for electrical connection provided. In the form, since the moisture-proof film 6 coats the resin substrate 2 in addition to lead-out electrodes 8, moisture penetration can be highly prevented.

Figure 19A:
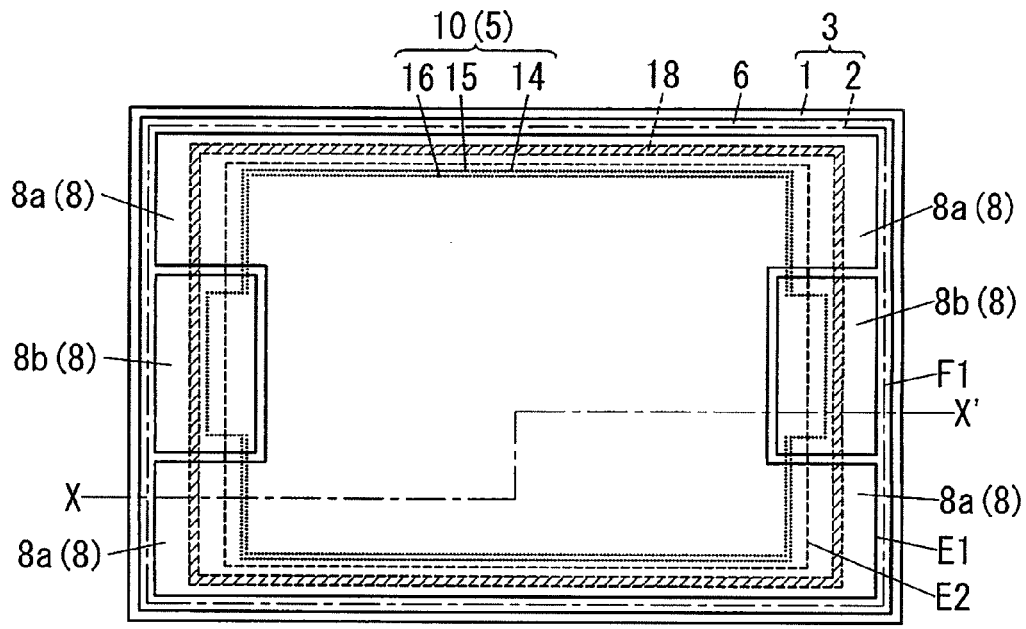
FIGS. 19A and 19B show an example of an organic electroluminescence device.
Figure 19B:
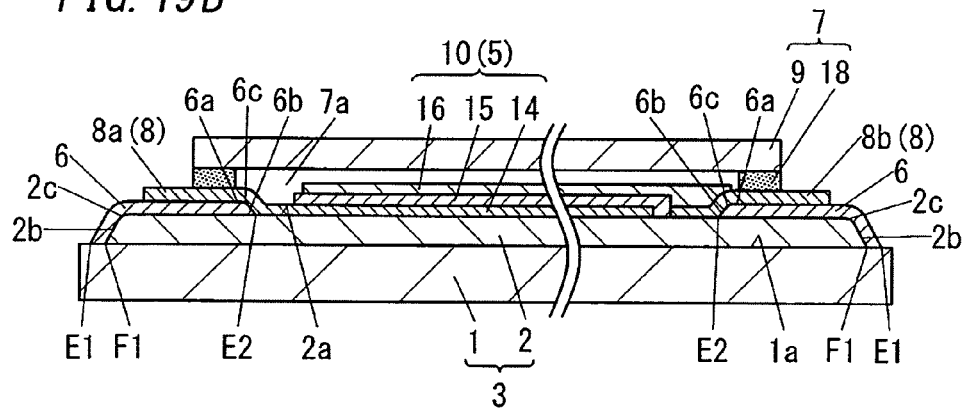

FIGS. 19A and 19B show a structure example of a composite substrate 3 provided with a moisture-proof film 6. As shown in FIGS. 19A and 19B, the composite substrate 3 is used for an organic EL device. In the organic EL device of FIGS. 19A and 19B, the composite substrate 3 is formed of a moisture-proof substrate 1 and a resin substrate 2, and is employed as a substrate for forming a multilayer. An organic light-emitting multilayer 10 is provided on a surface of the composite substrate 3 on a side of the resin substrate 2, on which a first electrode 14, an organic layer 15 and a second electrode 16 are formed in that order. The organic light-emitting multilayer 10 is sealed with a sealing substrate 9 that is pasted to the composite substrate 3 at a periphery thereof. The sealing substrate 9 is pasted through a sealing side wall 18 that is formed on a surface side of a periphery end of the composite substrate 3. In FIG. 19A, the sealing substrate 9 is omitted for the purpose of clarity of device structure, and a region provided with the sealing side wall 18 is indicated by an oblique line region surrounded by broken lines. The organic layer 15 and the second electrode 16 are indicated by dotted lines, and a conductive layer forming the first electrode 14 is indicated by a solid line. An outer edge F1 of the resin substrate 2 is indicated by a dashed line. In FIG. 19B, center part thereof is omitted for the purpose of clarity of end structure.

In a preferable aspect of the structure of the composite substrate 3, first lead-out electrodes 8a and second lead-out electrodes 8b are formed on a surface of the moisture-proof film 6. In the organic EL device of FIGS. 19A and 19B, the moisture-proof film 6 coats part of the resin substrate 2 protruding from a sealed region that is formed of and sealed with the sealing substrate 9. The first and second lead-out electrodes 8a and 8b are formed to overlap a surface of the moisture-proof film 6.

In the organic EL device according to the form, the moisture-proof film 6 as lower layers for lead-out electrodes 8 is formed on ends of the composite substrate 3. The moisture-proof film 6 also coats the part of the resin substrate 2 protruding from the sealed region. As a result, moisture penetration from an outside can be prevented because the resin substrate 2 is not exposed outside. The moisture-proof film 6 may be provided at least on a region of the resin substrate 2 exposed outside when assuming that the moisture-proof film 6 is not present outside the sealed region. If the resin substrate 2 is not exposed outside the sealed region, moisture penetration can be effectively prevented because the resin substrate 2 is not in direct contact with an exterior space.

Preferably, the moisture-proof film 6 coats border part between the resin substrate 2 and the moisture-proof substrate 1. In a case where the resin substrate 2 is smaller than the moisture-proof substrate 1 in planar view, the moisture-proof film 6 is formed to be in contact with a surface of a periphery end of the moisture-proof substrate 1 as shown in FIG. 19B. If the border part between the moisture-proof substrate 1 and the resin substrate 2 is exposed, moisture may penetrate through the interface between the moisture-proof substrate 1 and the resin substrate 2. However, since the moisture-proof film 6 coats the border part between the resin substrate 2 and the moisture-proof substrate 1, the interface between the moisture-proof substrate 1 and the resin substrate 2 is hidden from an outside. As a result, moisture penetration from an outside can be further prevented. In FIG. 19B, an outer edge E1 of the moisture-proof film 6 is disposed outside an outer edge F1 of the resin substrate 2.

There is no need to provide the moisture-proof film 6 on a center region of the composite substrate 3 in planar view. The center region of the composite substrate 3 is provided with the organic light-emitting multilayer 10, and is accordingly a region formed with a luminous region. There is therefore a concern that if the moisture-proof film 6 is provided on the region, light-extraction efficiency cannot be enhanced. If the moisture-proof film 6 is provided only on the periphery end of the composite substrate 3, the moisture-proof film 6 is not formed on the luminous region. As a result, the moisture-proof film 6 can be easily formed because it is unnecessary to adjust a refractive index of the moisture-proof film 6 or to make the moisture-proof film 6 transparent.

The moisture-proof film 6 may coat all gaps among the first and second lead-out electrodes 8a and 8b. Accordingly, in the form of FIGS. 19A and 19B, an inner edge E2 of the moisture-proof film 6 is disposed inside an outer edge of conductive layers integrally forming the first electrode 14 and the first lead-out electrodes 8a. That is, the moisture-proof film 6 is extended inside a position at which a conductive layer forming the first electrode 14 is divided into the first lead-out electrodes 8a. Accordingly, since the moisture-proof film 6 coats the resin substrate 2 in the inside of the sealed region, the resin substrate 2 is out of contact with the sealed space. Even if moisture penetrates into the resin substrate 2, moisture can be prevented from reaching the organic light-emitting multilayer 10 from the resin substrate 2.

The moisture-proof film 6 may coat a whole of the resin substrate 2 including center part of the composite substrate 3. In this case, the resin substrate 2 is surrounded and sealed with the moisture-proof substrate 1 and the moisture-proof film 6. There is accordingly no penetration path of moisture into the resin substrate 2 because the whole of the resin substrate 2 is covered with moisture-proof members. It is therefore possible to highly prevent moisture from penetrating the organic light-emitting multilayer 10. When the moisture-proof film 6 coats the whole of the resin substrate 2, the moisture-proof film 6 includes a lower layer with respect to the first electrode 14. It is therefore preferable that the moisture-proof film 6 have optical transparency.

In the present form, end sides 2b of the resin substrate 2 are inclined as well. That is, in FIGS. 19A and 19B, an outer edge of the resin substrate 2 is indicated by an outer edge F1. Each end side 2b at the outer edge F1 is formed into an inclined face. Preferably, the resin substrate 2 has a round corner 2c that is border part between a side 2b and a surface 2a of each end of the resin substrate 2. In the resin substrate 2, preferably each side 2b is an inclined face and more preferably each corner 2c is rounded, and the reason is as described with reference to FIGS. 6A, 6B, 7A, 7B, 8A, 8B and 8C. Also in the form, preferably the moisture-proof film 6 is formed to cross the sealing side wall 18, and the reason is described with reference to FIGS. 9A and 9B. In FIG. 19B, an inner edge E2 of the moisture-proof film 6 is disposed inside an inner edge of the sealing side wall 18 on the resin substrate 2.

In the composite substrate 3, when the lead-out electrodes 8 are formed on the surface of the moisture-proof film 6, it is preferable that each end side 6b of the moisture-proof film 6 on an inside of the device be formed into an inclined face that is inclined outward the device with respect to the surface 2a of the resin substrate 2. In the organic EL device of FIGS. 19A and 19B, each end side 6b of the moisture-proof film 6 on the inside of the device is formed into an inclined face that is inclined outward the device with respect to the surface 2a of the resin substrate 2. In FIG. 19B, an inner edge of each end of the moisture-proof film 6 on the inside of the device is indicated by an inner edge E2. Preferably each end side 6b on the inner edge E2 is an inclined face. In this case, an angle between each end side 6b and the surface on a side of the resin substrate 2 is an acute angle.

Preferably, the moisture-proof film 6 has a round corner 6c that is edge part from a surface 6a to an end side 6b of each end thereof on the inside of the device. That is, it is preferable that a corner of each surface end of the moisture-proof film 6 on the inside be curved.

Figure 20A:
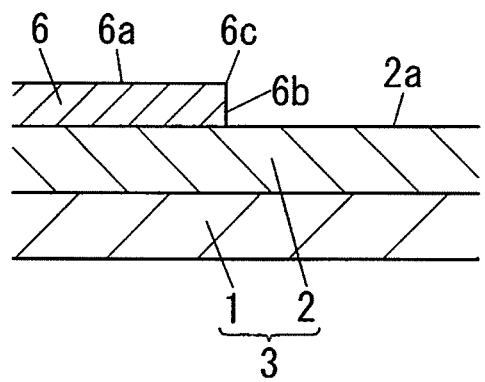
FIGS. 20A, 20B and 20C are enlarged sectional views each of which illustrates a composite substrate provided with a moisture-proof film.
Figure 20B:
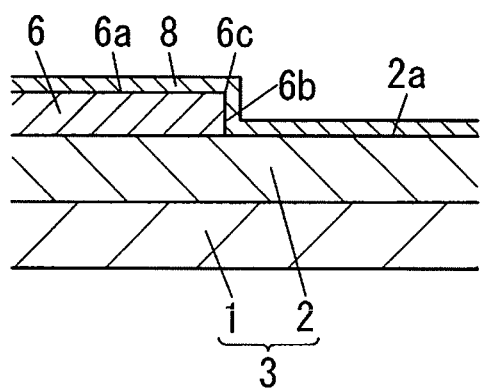
Figure 20C:
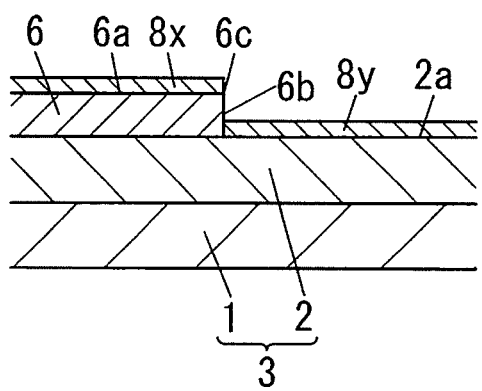

FIGS. 20A to 20C shows an example of a neighborhood around an end of a moisture-proof film 6 on an inside of a device. FIG. 20A shows a composite substrate 3 in which a moisture-proof film 6 is formed on a surface of a resin substrate 2. In a case where an organic electric device is formed, lead-out electrodes 8 (first and second lead-out electrodes 8a and 8b) are formed by laminating conductive layers on surfaces of the moisture-proof film 6 and the resin substrate 2. In the case, if laminating is successfully performed as shown in FIG. 20B, the conductive layer covers a side 6b of the moisture-proof film 6 with the conductive layer not divided. As a result, electrical conductivity of the lead-out electrodes 8 is secured. There is however a concern that divided parts 8x and 8y of an lead-out electrode 8 are formed like FIG. 20C as a result of a cut of the conductive layer on an end edge if the conductive layer is not successfully laminated, for example, in a case where a thickness of the moisture-proof film 6 is much thicker than that of the conductive layer. Such a divided conductive layer may cause electrical disconnection with an electrode of an organic light-emitting multilayer 10 because electrical conductivity of the lead-out electrodes 8 is impaired. When the conductive layer is thin in thickness even if the conductive layer is not divided, part of the conductive layer that is thin in thickness has high electric resistance. As a result, satisfactory electrical conductivity may not be obtained. Therefore, electrical conductivity of each lead-out electrode 8 can be sufficiently secured by forming each end side 6b of the moisture-proof film 6 into an inclined face or by forming each corner 6c thereof into a curve.

Figure 21A:
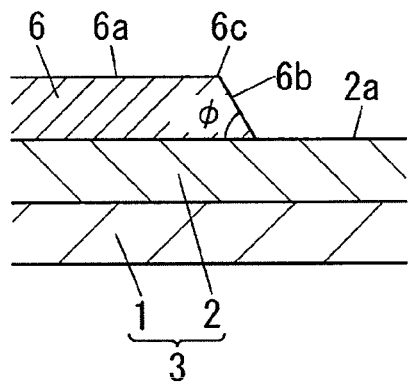
FIGS. 21A, 21B, 21C, 21D, 21E and 21F are enlarged sectional views each of which illustrates a composite substrate provided with a moisture-proof film.
Figure 21B:
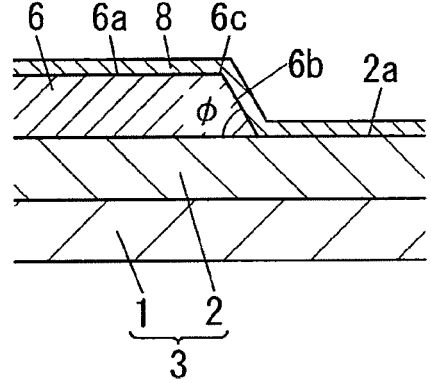

FIGS. 21A to 21F are examples each of which shows a neighborhood around an end of a moisture-proof film 6 on an inside of a device. A form of FIG. 21A is an example in which an end side 6b of the moisture-proof film 6 is formed into an inclined face that is inclined outward. If a conductive layer is formed on the moisture-proof film 6 in which the end side 6b on an inside thereof is formed into the inclined face, the conductive layer is formed on a surface of the inclined face as shown in FIG. 21B, and it is accordingly possible to prevent the conductive layer from being cut on an end edge. As a result, electrical conductivity of lead-out electrodes 8 can be enhanced.

Figure 21C:
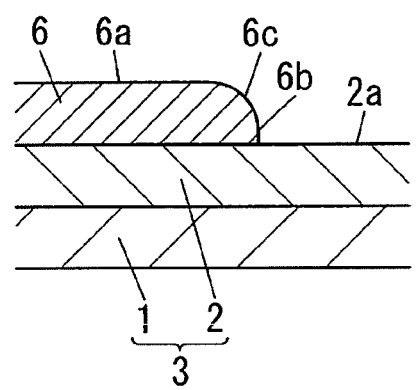
Figure 21D:
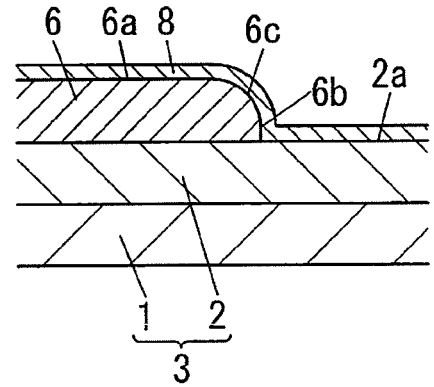

A form of FIG. 21C is an example in which a corner 6c between a surface 6a and a side 6b of the moisture-proof film 6 is rounded and formed into a curve. If a conductive layer is laminated on the moisture-proof film 6 of which corner 6c is rounded, the conductive layer is formed so as to cross the rounded corner 6c, and it is accordingly possible to prevent the conductive layer from being cut on the corner. As a result, electrical conductivity of lead-out electrodes 8 can be enhanced.

Figure 21E:
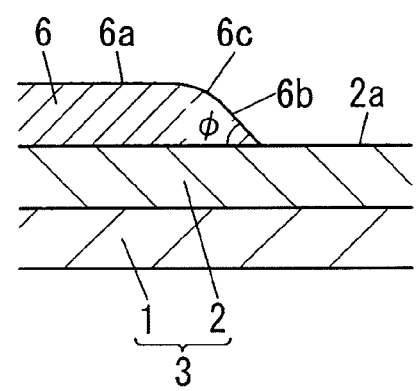
Figure 21F:
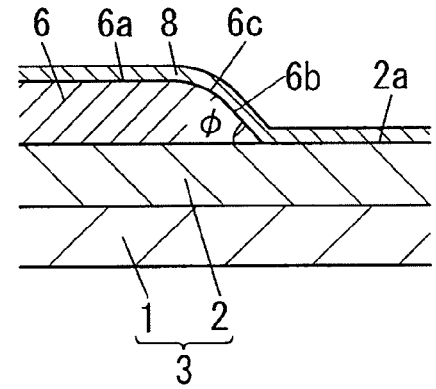

A form of FIG. 21E is an example in which an end side 6b of the moisture-proof film 6 is formed into an inclined face that is inclined outward and a corner 6c between a surface 6a and a side 6b of the moisture-proof film 6 is rounded and formed into a curve. If a conductive layer is laminated on the moisture-proof film 6, the conductive layer is formed on a surface of the inclined face while crossing the rounded corner 6c as shown in FIG. 21F, and it is accordingly possible to further prevent the conductive layer from being cut on the corner. As a result, electrical conductivity of lead-out electrodes 8 can be further enhanced.

In a case where each end side 6b of the moisture-proof film 6 on an inside thereof is inclined, an angle of inclination φ of the inclined face in the moisture-proof film 6 is appropriately set in a range less than 90°. The angle of inclination is an acute angle. The angle of inclination φ may be 30° or more, 45° or more, 60° or more, or 75° or more. The angle of inclination φ may be also 75° or less, or 60° or less.

Figure 22A:
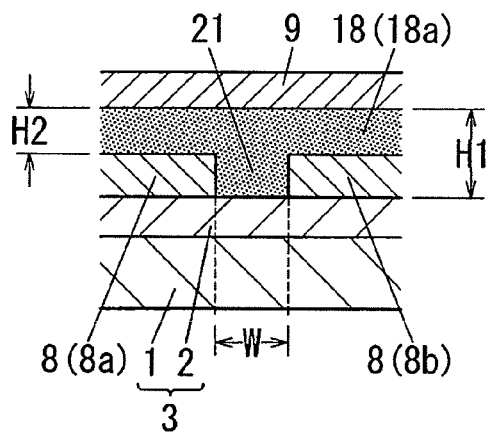
FIGS. 22A, 22B, 22C and 22D are enlarged sectional views each of which illustrates a composite substrate provided with lead-out electrodes.
Figure 22B:
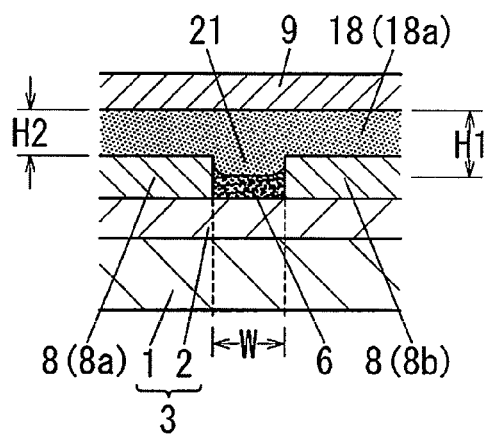
Figure 22C:
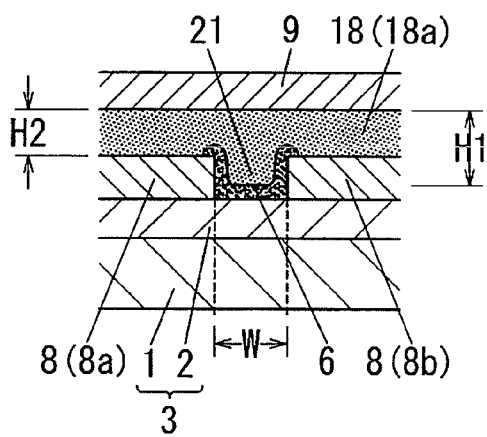
Figure 22D:
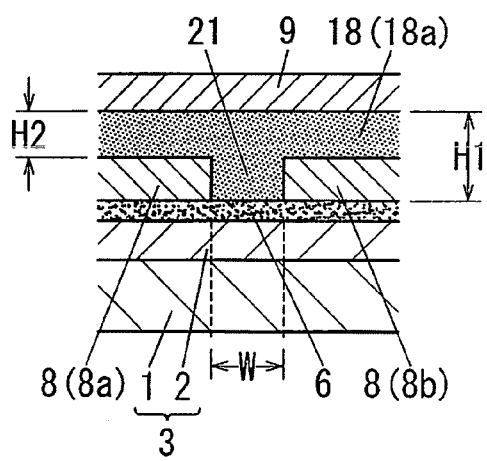

FIGS. 22A to 22D show is examples in each of which a sealing substrate 9 is pasted to a composite substrate 3 through a sealing side wall 18 having adhesive property. FIGS. 22A to 22D show structure of border part between a first lead-out electrode 8a and a second lead-out electrode 8b at a position where a sealing side wall 18 is formed. FIG. 22A shows an example in which a sealing side wall 18 is formed on surfaces of lead-out electrodes 8 and a composite substrate 3 at a position where no moisture-proof film 6 is provided. FIG. 22B shows an example in which a composite substrate 3 is provided with a moisture-proof film 6 like the form of FIG. 15B, and a sealing side wall 18 is formed on surfaces of lead-out electrodes 8 and the moisture-proof film 6. FIG. 22C shows an example in which a composite substrate 3 is provided with a moisture-proof film 6 like the form of FIG. 15C, and a sealing side wall 18 is formed on surfaces of lead-out electrodes 8 and the moisture-proof film 6. FIG. 22D corresponds to the form of FIGS. 19A and 19B, and shows an example in which a composite substrate 3 is provided with lead-out electrodes 8 formed on a surface of a moisture-proof film 6, and a sealing side wall 18 is formed on surfaces of lead-out electrodes 8 and the moisture-proof film 6.

In the composite substrate 3 and the organic EL device with the same as shown in FIG. 4, first lead-out electrodes 8a and second lead-out electrodes 8b are arranged separately and alternately on each of ends of the composite substrate 3 (the upper and lower ends in FIG. 4). The sealing side wall 18 is provided so as to surround the periphery of the organic light-emitting multilayer 10, and the sealing substrate 9 is pasted to the composite substrate 3 on a side of the surface of the moisture-proof substrate 1 (a side of the organic light-emitting multilayer 10) through the sealing side wall 18. As shown in FIG. 4, a region provided with the sealing side wall 18 corresponds to regions provided with the first and second lead-out electrodes 8a and 8b, and each interval between the first lead-out electrodes 8a and the second lead-out electrodes 8b includes a gap where no first and second lead-out electrodes 8a and 8b are formed. When all the gaps are buried with the moisture-proof film 6, each gap is covered as shown in FIG. 15A. Therefore, moisture penetration from each gap is hardly required to be considered. In cases of FIGS. 22A and 22D in each of which gaps are present, there is however a problem of moisture penetration from gaps. As shown in FIGS. 22B and 22C, when the whole of each gap is not buried with the moisture-proof film 6, gaps further buried with the sealing side wall 18 are remained.

In FIG. 22A, a gap is present because the moisture-proof film 6 is not provided at a position of the sealing side wall 18. In FIGS. 22B and 22C, a gap is present because the gap is not fully buried with a moisture-proof film 6 at a position of the sealing side wall 18. In FIG. 22D, a gap is present owing to a form in which a lead-out electrode 8 is formed on the moisture-proof film 6. Therefore, a sealing substrate 9 as shown in FIGS. 22A to 22D is pasted, through a sealing side wall 18, to a first lead-out electrode 8a and a second lead-out electrode 8b; and to a lower layer of a lead-out electrode 8 or a surface of a moisture-proof film 6 between the first lead-out electrode 8a and the second lead-out electrode 8b. In these cases, a sealed region is a region of which periphery is surrounded with a sealing side wall 18. In short, in a case where a gap is not buried with a moisture-proof film 6, a region provided with a sealing side wall 18 can be regarded as a surface of conductive layers forming lead-out electrodes 8 and gaps among the conductive layers. As shown in FIG. 22C, when the moisture-proof film 6 coats sides of the lead-out electrodes 8, it can be regarded as a gap of the moisture-proof film 6.

As shown in FIGS. 22A to 22D, when a sealing substrate 9 is pasted with a sealing side wall 18, resin material 18a for forming the sealing side wall 18 is filled between a first lead-out electrode 8a and a second lead-out electrode 8b. Part between the first lead-out electrode 8a and the second lead-out electrode 8b into which the sealing side wall 18 intrudes is an adhesion gap 21. The adhesion gap 21 is a gap for adhesion of the sealing substrate 9. The resin material 18a is filled in the adhesion gap 21, thereby giving electrical insulation to the gap in which no lead-out electrode 8 is formed. As shown in FIGS. 22A to 22D, a height H1 (a thickness) of a sealing side wall 18 at a region formed with an adhesion gap 21 is larger than a height H2 (a thickness) of the sealing side wall 18 at a region in which a first lead-out electrode 8a or a second lead-out electrode 8b is formed. Thus, since part formed with an adhesion gap 21 increases a thickness of a whole layer that is formed as a sealing side wall 18. As a result, moisture is liable to penetrate into the sealed region through the part of which thickness is increased because the resin material 18a has moisture-proofness higher than that of the resin substrate 2 but has higher moisture permeability than that of material forming the substrate such as glass in general.

In a preferable aspect of a composite substrate 3, an adhesion gap 21 is formed like a line in planar view (as seen from a direction perpendicular to a surface of a moisture-proof substrate 1). The adhesion gap 21 may be shaped like a line that continuously extends from an outside to an inside in planar view. The adhesion gap 21 is also formed to have an advancing part 21a that advances in a direction from an outside to an inside, and a returning part 21b that advances in a direction from the inside to the outside. Accordingly, moisture penetration can be prevented because a region, which is shaped like a line and thick in thickness of the sealing side wall 18 arranged along the adhesion gap 21, has a distance increased by detour in a direction from an outside to an inside of the sealed region. When a sealing substrate 9 is in a center thereof provided with a concavity that houses an organic light-emitting multilayer 10 (an organic multilayer 5), a sealing side wall 18 may be formed of a periphery of the sealing substrate 9. In this case, a sealing substrate 9 shaped like a cap is employed, and the resin material 18a to be filled in the adhesion gap 21 may be adhesive for adhesion between the composite substrate 3 and the sealing substrate 9.

FIGS. 23A to 23F are examples in each of which an adhesion gap 21 is formed at border part between a first lead-out electrode 8a and a second lead-out electrode 8b. Each adhesion gap 21 is indicated by a dot region. Broken lines show a region (an adhesion region) provided with a sealing side wall 18. In the examples of FIGS. 23A to 23F, a first lead-out electrode 8a is on the left, and a second lead-out electrode 8b is on the right, but first and second lead-out electrodes 8a and 8b may be on the right and left, respectively.

As shown in FIGS. 23A to 23F, an adhesion gap 21 is indicated by one line between adjacent lead-out electrodes 8. That is, the adhesion gap 21 can have a continuation shape when it is described in a direction from an outside to an inside (a direction of an outline arrow) by line drawing. In addition, the adhesion gap 21 has neither line intersection nor divergence. If the adhesion gap 21 has divergence, it causes a separation part not connected to any lead-out electrode 8. Preferably, a line width of the adhesion gap 21 is constant. If the line width has wide regions and narrow regions, moisture is liable to penetrate from the wide regions. In order to prevent moisture penetration, it is preferable that the line width be as narrow as possible under a condition that electrical insulation between a first lead-out electrode 8a and a second lead-out electrode 8b is maintained.

A line-shaped adhesion gap 21 is now explained, where an "advancing straight direction" is a direction (a direction of an outline arrow) from an outside to an inside which is perpendicular to an edge of a sealing side wall 18 (broken lines of FIGS. 23A to 23F), a "returning straight direction" is an opposite direction to the advancing straight direction, and a "staying direction" is a direction perpendicular to the advancing straight direction and the returning straight direction. An advancing part 21a is needed to be part that advances from the outside to the inside. Accordingly, it may be part that advances in a direction in parallel with the advancing straight direction or part that advances in an oblique direction that is inclined (has an angle) with respect to the advancing straight direction. A returning part 21b is needed to be part that advances from the inside to the outside. Accordingly, it may be part that advances in a direction in parallel with the returning straight direction or part that advances in an oblique direction that is inclined (has an angle) with respect to the returning straight direction.

Figure 23A:
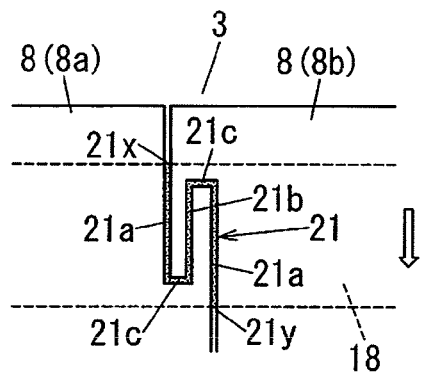
FIGS. 23A, 23B, 23C, 23D, 23E and 23F are enlarged sectional views each of which illustrates a composite substrate provided with lead-out electrodes.

In a form of FIG. 23A, as a brief outline an adhesion gap 21 is drawn as a meandering line which is shaped like an S and turns twice when an outer end 21x to an inner end 21y of the adhesion gap 21 is described in a direction from an outside to an inside by line drawing. It is provided as turning with one turning toward a returning direction from an advancing part 21a to a returning part 21b and one turning toward an advancing direction from the returning part 21b to other advancing part 21a.

In the form, the adhesion gap 21 is formed of the advancing part 21a, the returning part 21b and the other advancing part 21a arranged in that order in a direction from the outside to the inside. That is, one returning part 21b is formed. Thus, the adhesion gap 21 is formed, by providing the returning part 21b, in a shape of turning toward the returning direction to advance when it is described by line drawing, thereby capable of increasing a distance from an outside end to an inside end of the adhesion gap 21 and effectively preventing moisture penetration.

In the form, each advancing part 21a is shaped like a straight line parallel with the advancing straight direction. Each returning part 21b is shaped like a straight line parallel with the returning straight direction. A staying part 21c parallel with an outer edge of the sealing side wall 18 is provided between an advancing part 21a and a returning part 21b without advancing toward any of the advancing direction and the returning direction. A line on each border between an advancing part 21a and a staying part 21c and between a returning part 21b and a staying part 21c is bent in a vertical direction.

In the form of FIG. 23A, when focusing on both shapes of lead-out electrodes 8, facing ends of first and second lead-out electrodes 8a and 8b have key-shaped patterns in which the ends protrude like an L and engage with each other.

Figure 23B:
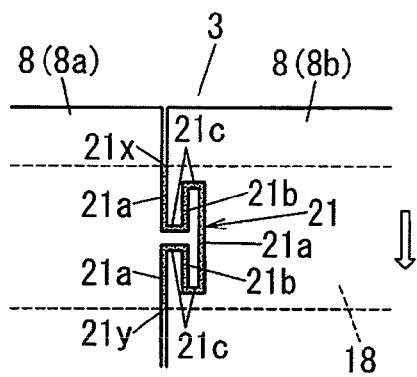

In the form of FIG. 23B, as a brief outline an adhesion gap 21 is drawn so as to turn four times when an outer end 21x to an inner end 21y of the adhesion gap 21 is described in a direction from an outside to an inside by line drawing. It is provided as turning with two turning toward a returning direction from an advancing part 21a to a returning part 21b and two turning toward an advancing direction from a returning part 21b to an advancing part 21a. First turning and second turning from an advancing part 21a to a returning part 21b pivot and turn in an opposite direction. First turning and second turning from a returning part 21b to an advancing part 21a pivot and turn in an opposite direction. Thus, the adhesion gap 21 is formed so as to pivot and turn in an opposite direction, and can thereby advance and return in a direction perpendicular to the advancing straight direction. As a result, the adhesion gap 21 can be easily formed by matching positions of the outer end 21x and the inner end 21y of the adhesion gap 21 in a direction perpendicular to the outer edge of the sealing side wall 18. Positions of end edges of the lead-out electrodes 8 can be aligned at the outside and the inside of the sealed region.

In the form of the adhesion gap 21, an advancing part 21a, a returning part 21b, an advancing part 21a, a returning part 21b and an advancing part 21a are arranged in order in the direction from the outside to the inside. That is, a plurality of (two) returning parts 21b is formed. Thus, the adhesion gap 21 is formed, by providing the returning parts 21b, in a shape of turning and then advancing in a returning direction when it is described by line drawing, thereby capable of increasing a distance from an outside end to an inside end of the adhesion gap 21 and effectively preventing moisture penetration. In the form of FIG. 23B, since a plurality of returning parts 21b is formed, it is possible to further increase the distance from the outside end to the inside end of the adhesion gap 21.

In the form, each advancing part 21a is shaped like a straight line parallel with the advancing straight direction, and each returning part 21b is shaped like a straight line parallel with the returning straight direction. Each staying part 21c parallel with an outer edge of the sealing side wall 18 is provided between an advancing part 21a and a returning part 21b without advancing toward any of the advancing direction and the returning direction. A line on each border between an advancing part 21a and a staying part 21c and between a returning part 21b and a staying part 21c is bent in a vertical direction. Anterior two staying parts 21c advance in an identical direction (a right direction in FIG. 23B), and posterior two staying parts advance in an identical direction (a left direction) that is an opposite direction to the anterior two staying parts. As a result, the adhesion gap 21 can be easily formed with the positions of the outer end 21x and the inner end 21y of the adhesion gap 21 matched in the direction perpendicular to the outer edge of the sealing side wall 18 because it can advance and return in a direction (the staying direction) perpendicular to the advancing straight direction.

In the form of FIG. 23B, when focusing on both shapes of lead-out electrodes 8, they have patterns in which a T-shaped end of one of the lead-out electrodes 8 is protruded, and an end of other lead-out electrode 8 has a T-shaped recess.

Figure 23C:
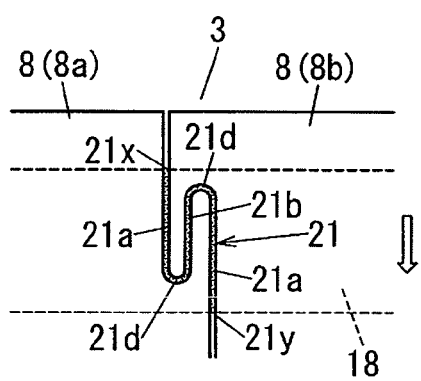

In the form of FIG. 23C, as a brief outline an adhesion gap 21 is drawn as a meandering line which is shaped like an S and turns twice when an outer end 21x to an inner end 21y of the adhesion gap 21 is described in a direction from an outside to an inside by line drawing. It is provided as turning with one turning toward a returning direction from an advancing part 21a to a returning part 21b and one turning toward an advancing direction from the returning part 21b to other advancing part 21a.

In the form, the adhesion gap 21 is formed of the advancing part 21a, the returning part 21b and the other advancing part 21a arranged in order in a direction from the outside to the inside. That is, one returning part 21b is formed. Thus, the adhesion gap 21 is formed, by providing the returning part 21b, in a shape of turning toward the returning direction to advance when it is described by line drawing, thereby capable of increasing a distance from an outside end to an inside end of the adhesion gap 21 and effectively preventing moisture penetration.

In the form, each advancing part 21a except for its own adjacent part connected with the returning part 21b is shaped like a straight line that is in parallel with the advancing straight direction. The returning part 21b except for its own adjacent part connected with the advancing parts 21a is shaped like a straight line that is in parallel with the returning straight direction. Each curved part 21d is formed at border part of advancing and returning parts 21a and 21b. Each curved part 21d is shaped like a curved line that smoothly turns from an advancing direction to a returning direction so that a line width of the adhesion gap 21 is substantially constant even at each turning part thereof without becoming thick. Thus, each curving part of the adhesion gap 21 is shaped like a curved line so that the line width at each curving part is substantially constant without becoming thick. It is accordingly possible to further prevent moisture penetration because the adhesion gap 21 hardly has wide part in planar view.

Figure 24A:
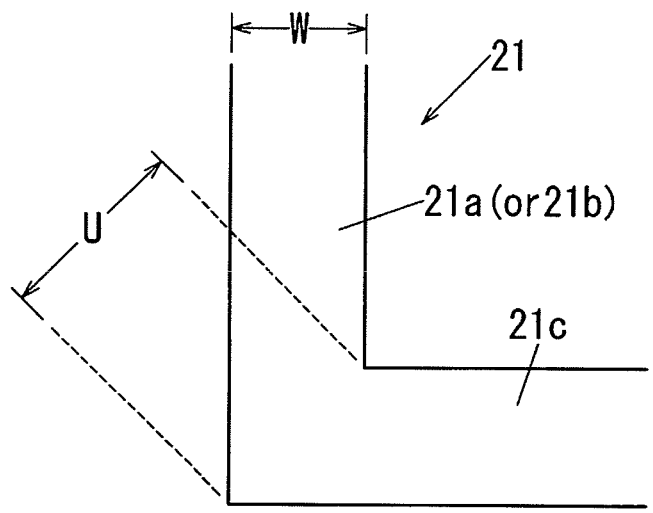
FIGS. 24A and 24B are enlarged plan views each of which illustrates a composite substrate provided with lead-out electrodes.
Figure 24B:
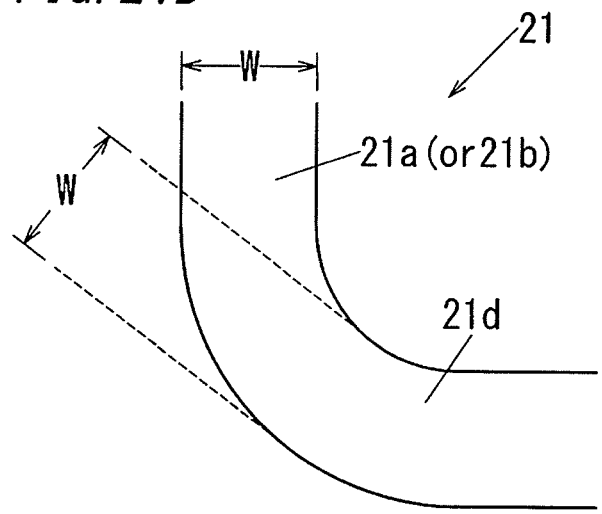

FIGS. 24A and 24B show a bend of an adhesion gap 21. In FIG. 24A, wider part U than a line width W of an adhesion gap 21 is formed because the line is bent at a right angle. In FIG. 24B, wider part than a line width W of an adhesion gap 21 is not formed because the line is shaped like a curved line and is smoothly bent. In order to prevent moisture penetration, the shape having substantially a constant line width as shown in FIG. 24B is more advantageous than the shape of FIG. 24A. Therefore, each curved part 21d is formed at border part of advancing and returning parts 21a and 21b as shown in the form of FIG. 23C rather than the form of FIG. 23A, thereby capable of further preventing moisture penetration.

In the form of FIG. 23C, when focusing on both shapes of lead-out electrodes 8, facing ends of first and second lead-out electrodes 8a and 8b have key-shaped patterns in which the ends protrude like a rounded L and engage with each other.

Figure 23D:
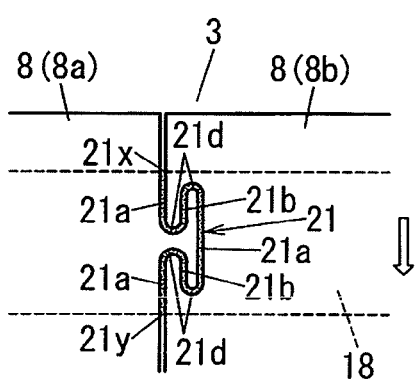

In the form of FIG. 23D, as a brief outline an adhesion gap 21 is drawn so as to turn four times when an outer end 21x to an inner end 21y of the adhesion gap 21 is described in a direction from an outside to an inside by line drawing. It is provided as turning with two turning toward a returning direction from an advancing part 21a to a returning part 21b and two turning toward an advancing direction from a returning part 21b to an advancing part 21a. First turning and second turning from an advancing part 21a to a returning part 21b pivot and turn in an opposite direction. First turning and second turning from a returning part 21b to an advancing part 21a pivot and turn in an opposite direction. Thus, the adhesion gap 21 is formed so as to pivot and turn in an opposite direction, and can thereby advance and return in a direction perpendicular to the advancing straight direction. As a result, the adhesion gap 21 can be easily formed by matching positions of the outer end 21x and the inner end 21y of the adhesion gap 21 in a direction perpendicular to the outer edge of the sealing side wall 18. Positions of end edges of the lead-out electrodes 8 can be aligned at the outside and the inside of the sealed region.

In the form of the adhesion gap 21, an advancing part 21a, a returning part 21b, an advancing part 21a, a returning part 21b and an advancing part 21a are arranged in order in the direction from the outside to the inside. That is, two or more (two) returning parts 21b are formed. Thus, the adhesion gap 21 is formed, by providing the returning parts 21b, in a shape of turning and then advancing in a returning direction when it is described by line drawing, thereby capable of increasing a distance from an outside end to an inside end of the adhesion gap 21 and effectively preventing moisture penetration. In the form of FIG. 23D, since a plurality of returning parts 21b is provided, it is possible to further increase the distance from the outside end to the inside end of the adhesion gap 21.

In the form, each advancing part 21a except for its own adjacent part connected with a returning part(s) 21b is shaped like a straight line that is in parallel with the advancing straight direction. Each returning part 21b except for its own adjacent part connected with advancing parts 21a is shaped like a straight line that is in parallel with the returning straight direction. Each curved part 21d is formed at border part of advancing and returning parts 21a and 21b. Each curved part 21d is shaped like a curved line that smoothly turns from an advancing direction to a returning direction so that a line width of the adhesion gap 21 is substantially constant even at each turning part thereof without becoming thick. Thus, each curving part of the adhesion gap 21 is shaped like a curved line so that the line width at each curving part is substantially constant without becoming thick. It is accordingly possible to further prevent moisture penetration as explained with reference to FIGS. 24A and 24B because the adhesion gap 21 hardly has wide part in planar view.

In FIG. 23D, when focusing on both shapes of lead-out electrodes 8, they have patterns in which a rounded T-shaped end of one of the lead-out electrodes 8 is protruded, and an end of other lead-out electrode 8 has a rounded T-shaped recess.

Figure 23E:
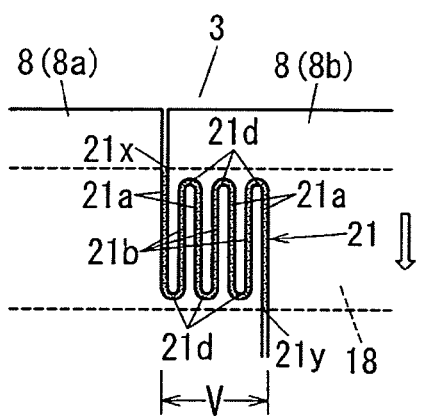

In the form of FIG. 23E, as a brief outline an adhesion gap 21 is drawn as a meandering line which is turns two times or more (six times in FIG. 23E) when an outer end 21x to an inner end 21y of the adhesion gap 21 is described in a direction from an outside to an inside by line drawing. It is provided as turning with three turning toward a returning direction from an advancing part 21a to a returning part 21b and three turning toward an advancing direction from a returning part 21b to an advancing part 21a. In the form, each turning from an advancing part 21a to a returning part 21b pivots and turns in an identical direction, and each turning from a returning part 21b to an advancing part 21a also pivots and turns in an identical direction. Therefore, a line along the adhesion gap 21 extends in a direction along an outer edge of a sealing side wall 18 (a transverse direction) while meandering in a width direction of the sealing side wall 18 that is a direction parallel with the advancing straight direction.

In the form of the adhesion gap 21, an advancing part 21a, a returning part 21b, an advancing part 21a, a returning part 21b, an advancing part 21a, a returning part 21b and an advancing part 21a are arranged in order in the direction from an outside to an inside. Each curved part 21d is formed at border part of advancing and returning parts 21a and 21b. That is, two or more (three) returning parts 21b are formed. Thus, the adhesion gap 21 is formed, by providing the returning parts 21b, in a shape of turning and then advancing in a returning direction when it is described by line drawing, thereby capable of increasing a distance from an outside end to an inside end of the adhesion gap 21 and effectively preventing moisture penetration. In the form of FIG. 23E, since a plurality of returning parts 21b is formed, it is possible to further increase the distance from the outside end to the inside end of the adhesion gap 21. In the form of FIG. 23E, it is possible to further increase a meandering distance because each border part of advancing and returning parts 21a and 21b in which the line turns is formed in a neighborhood of an end edge of the sealing side wall 18.

In the form, each advancing part 21a except for its own adjacent part connected with a returning part(s) 21b is shaped like a straight line that is in parallel with the advancing straight direction. Each returning part 21b except for its own adjacent part connected with advancing parts 21a is shaped like a straight line that is in parallel with the returning straight direction. Each curved part 21d is formed at border part of advancing and returning parts 21a and 21b. Each curved part 21d is shaped like a curved line that smoothly turns from an advancing direction to a returning direction or from a returning direction to an advancing direction so that a line width of the adhesion gap 21 is substantially constant even at each turning part thereof without becoming thick. Thus, each curving part of the adhesion gap 21 is shaped like a curved line so that the line width at each curving part is substantially constant without becoming thick. As explained with reference to FIGS. 24A and 24B, it is accordingly possible to further prevent moisture penetration because the adhesion gap 21 hardly has wide part in planar view.

In FIG. 23E, when focusing on both shapes of lead-out electrodes 8, they have patterns in which the lead-out electrodes 8 are shaped like a comb each and engage with each other.

It is preferable that an adhesion gap 21 have two or more returning parts 21b as the forms shown in FIGS. 23B, 23D and 23E. It is consequently possible to increase a distance from an outside end to an inside end of an adhesion gap 21 and to further effectively prevent moisture penetration. For example, in a case of three or more or four or more returning parts 21b, the length of the adhesion gap 21 can be more increased.

Figure 23F:
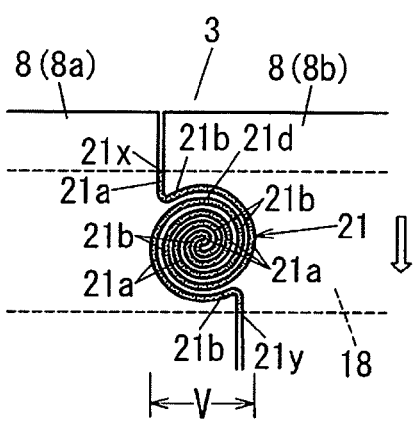

In the form of FIG. 23F, as a brief outline an adhesion gap 21 is drawn as a line that rotates like a helix when an outer end 21x to an inner end 21y of the adhesion gap 21 is described in a direction from an outside to an inside by line drawing. That is, it extends from the outer end 21x in the advancing straight direction, converges to a center of the helix while rotating, reverses to spread from the center of the helix toward the periphery in a radial direction while rotating in the opposite direction to the converging rotation, and extends in parallel with the advancing straight direction to reach the inner end 21y. It is provided with two or more turning toward a returning direction from an advancing part 21a to a returning part 21b and two or more turning toward an advancing direction from a returning part 21b to an advancing part 21a so that the advancing parts 21a and the returning parts 21b are arranged repeatedly and alternately.

In the form, the adhesion gap 21 is shaped like a curved line at helix part except for two advancing parts 21a arranged at sides of the outer end 21x and the inner end 21y. Each curved part 21d is disposed at border part between an advancing part 21a and a returning part 21b. As a result, a line width of the adhesion gap 21 can be made substantially constant without becoming thick.

The form is shaped like the helix and includes the advancing parts 21a and the returning parts 21b each of which is shaped like a curved line. The curved advancing and returning parts 21a and 21b forming the helix are continuously arranged to become a smooth curved line without difference in level. Thus, the adhesion gap 21 is formed, by providing the returning parts 21b, in a shape of turning and then advancing in a returning direction when it is described by line drawing, thereby capable of increasing a distance from an outside end to an inside end of the adhesion gap 21 and effectively preventing moisture penetration. In the form of FIG. 23F, since a plurality of returning parts 21b is formed, the distance from the outside end to the inside end of the adhesion gap 21 can be further increased.

In FIG. 23F, when focusing on both shapes of lead-out electrodes 8, they have patterns in which both ends of the lead-out electrodes 8 are shaped like the helix converging while rotating in an identical direction toward the center and engage with each other.

In the adhesion gap 21, preferably the outside end (the outer end 21x) of the adhesion gap 21 substantially crosses approximately at right angles to end edges of a sealing side wall 18 in planar view. It is accordingly possible to reduce a surface area of the adhesion gap 21 exposed outside and create structure into which moisture is further hard to penetrate.

Figure 25A:
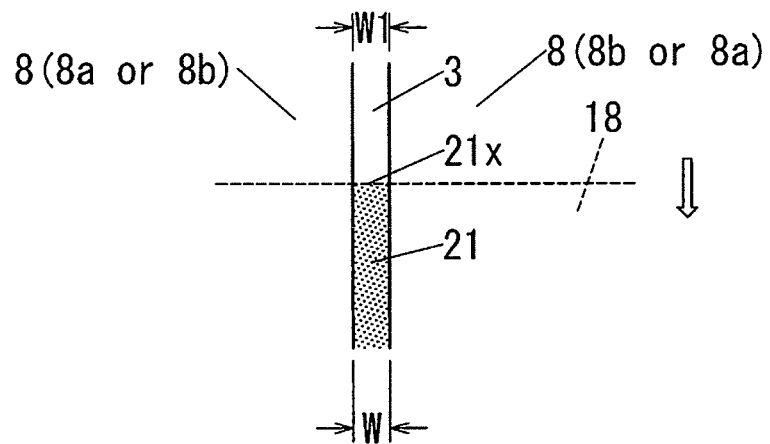
FIGS. 25A and 25B are enlarged plan views each of which illustrates a composite substrate provided with lead-out electrodes.
Figure 25B:
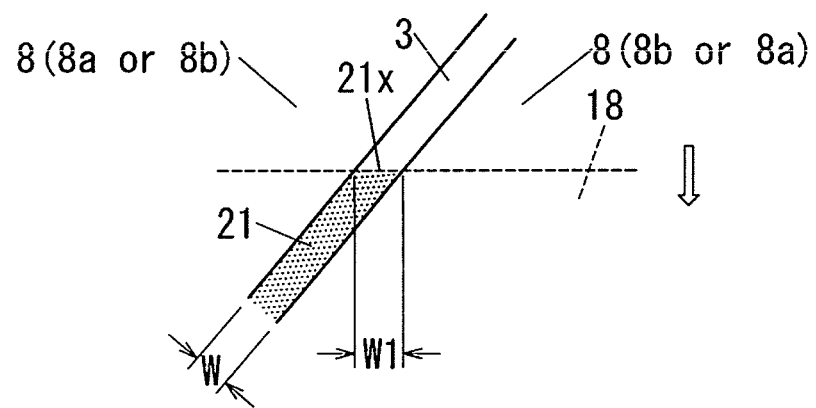

FIGS. 25A and 25B are examples each of which shows an outer end 21x of an adhesion gap 21. In FIG. 25A, an end of an adhesion gap 21 substantially crosses at right angles to an end edge of a sealing side wall 18, and a width W1 of exposed part of the adhesion gap 21 is substantially equal to a line width W of the adhesion gap 21 in planar view. In FIG. 25B, an end of an adhesion gap 21 inclines to cross an end edge of a sealing side wall 18 in a diagonal direction, and a width W1 of exposed part of the adhesion gap 21 is larger than a line width W of the adhesion gap 21 in planar view. Thus, the end of the adhesion gap 21 formed in the diagonal direction with respect to the end edge of the sealing side wall 18 causes an increase in an exposed surface area of the adhesion gap 21. It is therefore preferable that an end of an adhesion gap 21 substantially cross at right angles to an end edge of a sealing side wall 18. It is also preferable that an inside end (an inner end 21y) of the adhesion gap 21 substantially cross at right angles to an end edge of the sealing side wall 18. In this case, moisture penetration can be further prevented by decreasing an exposed surface area of the adhesion gap 21 on the inside.

Preferably, the line width W1 of the adhesion gap 21 is in a range of 5 to 500 μm. There is a concern that if the line width of the adhesion gap 21 is too narrow, a pattern is hard to be formed. There is also a concern that if the line width of the adhesion gap 21 is too wide, moisture penetration cannot be effectively prevented. The line width of the adhesion gap 21 is a distance between an end edge of a first lead-out electrode 8a and an end edge of a second lead-out electrode 8b.

A line length (a total length) of the adhesion gap 21 may be set to two times or more the length of a width of the sealing side wall 18, namely a minimum distance from an outer edge to an inner edge of the sealing side wall 18. It is accordingly possible to increase a distance from an outside end to an inside end of the sealing side wall 18 and effectively prevent moisture penetration. An upper limit of the line length of the adhesion gap 21 is not especially limited, but may be one hundred times or less in view of easy pattern formation. A width of a region formed with the adhesion gap 21, namely a length of the region formed with the adhesion gap 21 in a direction along end edges of the sealing side wall 18 (a length V shown in FIG. 23E or 23F) may be set to be, for example, in a range of 20 to 2000 μm. A width of the sealing side wall 18 (a distance from an outer edge to an inner edge thereof) may be set to be, for example, in a range of 0.5 to 1.5 mm. As a result, a sealing substrate 9 can be sufficiently pasted through the sealing side wall 18. In addition, a thickness of conductive layers (a first electrode 14, the first lead-out electrode 8a and the second lead-out electrode 8b), namely a depth of a recess formed with the adhesion gap 21 (a set-back distance) may be set to be, for example, in a range of 0.05 to 50 μm, but is not limited to this.

The adhesion gap 21 is formed by forming a groove as a result of patterning the conductive layers that form the first electrode 14 and the lead-out electrodes 8. Alternatively, the adhesion gap 21 may be formed by cutting a conductive layer by energy ray such as a laser beam to form a groove which is patterned so that the second lead-out electrode 8b is obtained by cutting. When the sealing substrate 9 is pasted, resin material 18a of the sealing side wall 18 is filled in adhesion part of the groove. As a result, the adhesion gap 21 is closed with the sealing side wall 18.

Figure 26A:
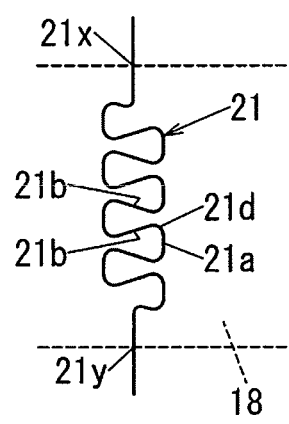
FIGS. 26A, 26B, 26C and 26D are enlarged plan views each of which illustrates a composite substrate provided with lead-out electrodes.
Figure 26B:
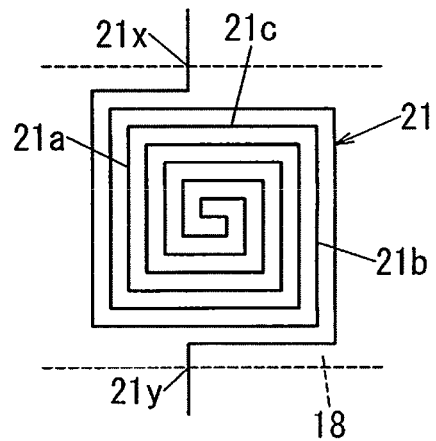
Figure 26C:
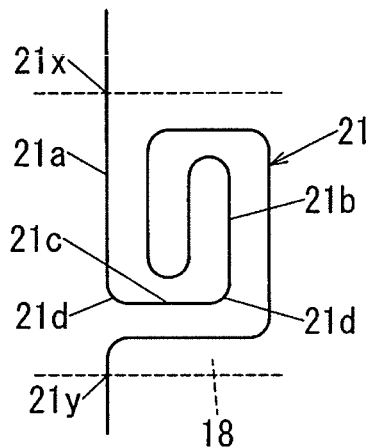
Figure 26D:
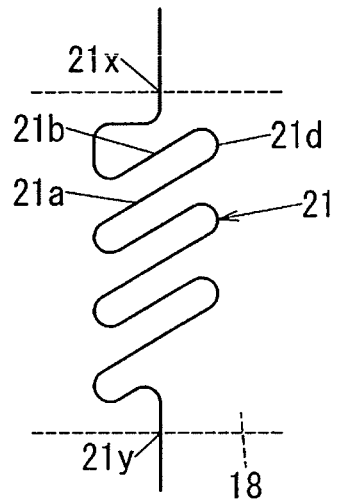

FIGS. 26A to 26D show other examples of adhesion gaps 21. FIG. 26A is an example of an adhesion gap 21 having a shape that advances from an outside to an inside of the sealing side wall 18 while meandering in a direction along the end edge of the sealing side wall 18 and alternately protruding and describe a curve in a direction along the end edge of the sealing side wall 18 (a staying direction) to describe a curve. FIG. 26B is an example of an adhesion gap 21 shaped like a square helix. In this example, each staying part 21c is formed between an advancing part 21a and a returning part 21b. FIG. 26C is an example of an adhesion gap 21 having a shape in which each staying part 21c is formed between an advancing part 21a and a returning part 21b, and each curved part 21d is formed at border part of an advancing part 21a and a staying part 21c and at border part of a returning part 21b and a staying part 21c. Such a form in which a staying part 21c and curved parts 21d are formed between an advancing part 21a and a returning part 21b is included in a form in which a curved part 21d is formed at border part of an advancing part 21a and a returning part 21b. The adhesion gap 21 is shaped like substantially a constant line without becoming thick at each curved part 21d as a curved line as shown in FIG. 24B. FIG. 26D is an example of an adhesion gap 21 in which advancing parts 21a and returning parts 21b are shaped like a straight line that advances in a diagonal direction with the advancing and returning parts 21a and 21b having an angle of inclination with respect to the advancing straight direction. Since an adhesion gap 21 shown in each example of FIGS. 26A to 26D has returning parts 21b, it is possible to increase a length of the adhesion gap 21 and prevent moisture penetration.

A manufacturing method of a composite substrate is now explained. FIGS. 27A to 27D, 28A to 28D, 29A to 29E and 30A to 30D are examples each of which shows a method for manufacturing a composite substrate 3.

In the aforementioned manufacturing of a composite substrate 3, a composite substrate 3 per se (a composite substrate 3 as substrate material with no organic multilayer 5) may be manufactured, or the structure of a composite substrate 3 may be formed when an organic electric device is manufactured. For example, organic electric devices can be efficiently formed by manufacturing the structure of the composite substrate 3 while dividing and individuating the devices after two or more organic multilayers 5 are layered on a substrate surface.

In manufacturing of a composite substrate 3, a moisture-proof substrate material 11 and a resin member 12 are prepared. A glass plate may be used as the moisture-proof substrate material 11, and a plastic sheet may be used as the resin member 12. In this case, each of the moisture-proof substrate material 11 and resin member 12 to be prepared has a size larger than organic electric devices to be arranged side by side.

By pasting the resin member 12 on a surface of the moisture-proof substrate material 11, it is possible to form a composite substrate material 13 having a combination size of composite substrates 3 used for devices. The resin member 12 may be pasted with adhesive. An adhesion layer 4 is formed of the adhesive. Alternatively, the resin member 12 may be pasted, for example, through component in the surface of the plastic sheet obtained by thermocompression bonding after the plastic sheet is stacked on the glass plate.

The composite substrate material 13 is formed by pasting together the moisture-proof substrate material 11 for forming moisture-proof substrates 1 and the resin member 12 for forming resin substrates 2. That is, composite substrates 3 for forming organic electric devices are obtained from the composite substrate material 13. A composite substrate 3 can be obtained by individually forming a moisture-proof substrate 1 and a resin substrate 2 which have a size corresponding to one organic electric device and then pasting them together. However, in this case, the process is complicated and manufacturing efficiency may be reduced. In contrast, it is possible to form composite substrates 3 in unison and efficiently form the composite substrates 3 by previously preparing a composite substrate 3 having a large surface area (the composite substrate material 13) and individuating it to form composite substrates 3 for individual devices. In addition, the devices can be obtained in unison by forming two or more organic multilayers 5 on a surface of the composite substrate 3 having the large surface area (the composite substrate material 13) to form a combination of devices, and then dividing the composite substrate material 13 to form the organic electric devices. Therefore, the organic electric devices can be efficiently manufactured.

The structure of the composite substrate 3 can be manufactured by a resin division and inclination step of dividing the resin member 12 of the composite substrate material 13 to form each end side 2b of divided resin substrates 2 into an inclined face, and a moisture-proof substrate dividing step of dividing the moisture-proof substrate material 11. That is, the moisture-proof substrate material 11 and the resin member 12 are separately divided in stages. When the moisture-proof substrate material 11 and the resin member 12 are cut at once, there is a concern that a yield rate is decreased because peeling easily occurs at an interface between the moisture-proof substrate material 11 and the resin member 12. In contrast, it is possible to relax a stress on cutting, prevent occurrence of cutting malfunction, and improve the yield rate by cutting the composite substrate 3 by material in stages. In addition, a size of the resin substrate 2 can be easily made smaller than a size of the moisture-proof substrate 1 by cutting in stages. In general, the resin division and inclination step is a first cutting step, and the moisture-proof substrate dividing step is a second cutting step.

A form of FIGS. 27A to 27D is an example of manufacturing structure of composite substrates 3 by cutting a composite substrate material 13 provided on a surface thereof with two or more organic multilayers 5.

Figure 27A:
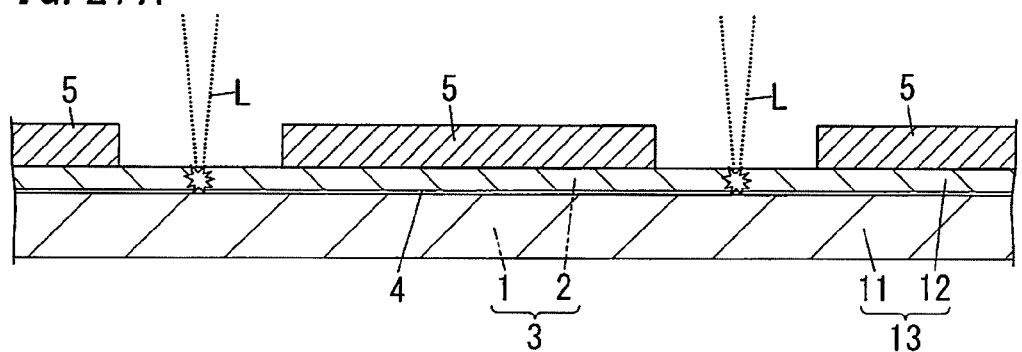
FIGS. 27A, 27B, 27C and 27D are sectional views showing an example of cutting a composite substrate.

FIG. 27A is an example of a resin division and inclination step. Dividing (cutting) of the resin member 12 may be cut with a cutting tool such as a cutter, but as shown in FIG. 27A is preferably performed by laser irradiation for focusing a laser beam L on positions at which the resin member 12 should be divided. Accordingly, the resin member 12 can be divided by laser-cutting resin forming the resin member 12 and individual resin substrates 2 can be formed. According to the laser irradiation, only the resin member 12 can be easily cut without cutting the moisture-proof substrate material 11, for example, in a case where a glass substrate is employed as the moisture-proof substrate 1 (the moisture-proof substrate material 11). In addition, since the resin is laser-cut by the laser irradiation, the resin member 12 can be easily divided so that a surface of the moisture-proof substrate 1 (the moisture-proof substrate material 11) is exposed. According to the laser irradiation, the laser beam L can be easily concentrated so as to become narrower toward a tip thereof, and can thereby cut while adding an inclined angle. As a result, an end side 2*b* of the resin substrate 2 formed by dividing the resin member 12 can be easily formed into an inclined face at the same time of cutting. According to the laser irradiation, since the resin material is cut by laser burning, a round can be easily given to a corner 2*c* of the resin substrate 2 by a thermal load. In a case of cutting with a cutter or the like, an inclined face can be formed if a resin member 12 is cut in a diagonal direction with respect to a surface thereof. Alternatively, after a resin member 12 is cut at right angles to a surface thereof, an end side 2*b* thereof may be treated by a processing for forming an inclined face or a processing for rounding a corner 2*c*.

In the resin division and inclination step, it is preferable that no adhesion layer 4 remain in part from which resin has been removed. In a case of the laser irradiation, the adhesion layer 4 can be removed by also laser-cutting the adhesion layer 4 in unison. When it is removed with a cutter or the like, it can be removed along with the resin member 12 because the adhesion layer 4 often has a stronger adhesive strength with respect to the resin member 12 than with respect to the moisture-proof substrate material 11.

Figure 27B:
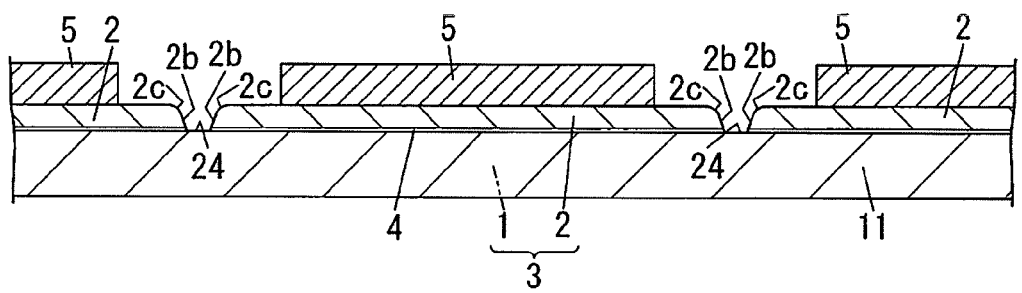

As shown in FIG. 27B, it is preferable that a division groove 24 as a groove of which width is rather wide be formed at each place in which the resin member 12 is cut. If the division grooves 24 are formed, a gap is formed between adjacent resin substrates 2 and 2. Accordingly, the moisture-proof substrate material 11 can be easily cut. Preferably, each division groove 24 is a groove shaped like a trapezoid having a cross section of which width becomes narrower toward its own bottom. In a case of the groove shaped like the trapezoid, each side 2*b* of the resin substrates 2 becomes an inclined face and a surface of the moisture-proof substrate material 11 is exposed. It is accordingly possible to easily expose a peripheral surface of each moisture-proof substrate 1 when the composite substrates 3 have been formed by dividing.

It is preferable that a residue removing step of removing processing-residue occurring in the resin division and inclination step be performed after the resin division and inclination step. The processing-residue is derived from the resin member 12 and the adhesion layer 4. Removing of processing-residue may be removing of processing-residue on at least each division groove 24 and a surface of the resin member 12 in the proximity of each division groove 24. When the processing-residue remains, it may cause a device malfunction. If the processing-residue remains when a moisture-proof film 6 is formed in particular, there is a concern that a malfunction such as holes (pin holes) cut in the moisture-proof film 6 occurs, but the moisture-proof film 6 can be securely formed by removing the processing-residue.

Preferably, the residue removing step is performed by blowing a gas. Cleaning can be performed by pouring a liquid. However, in a case of blowing the gas, a process after the residue removing becomes simple because a drying process and the like are unnecessary. Organic multilayers 5 are also hard to be damaged. Hence, according to blowing the gas, the processing-residue can be easily removed and a substrate surface suitable for the formation of the moisture-proof film 6 can be easily formed. In addition, the processing-residue can be removed without damaging organic multilayers 5.

Figure 27C:
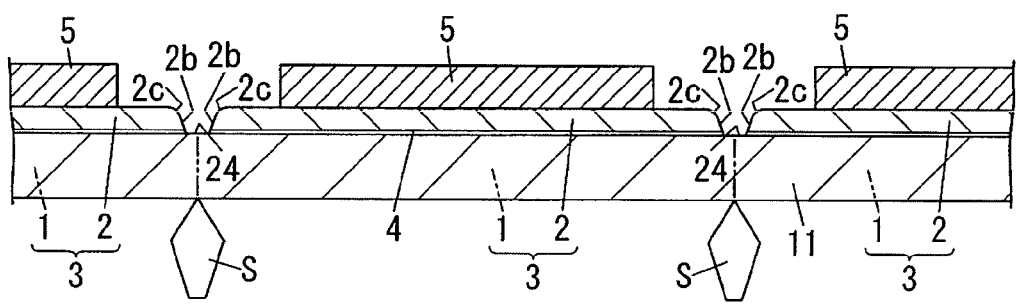
Figure 27D:
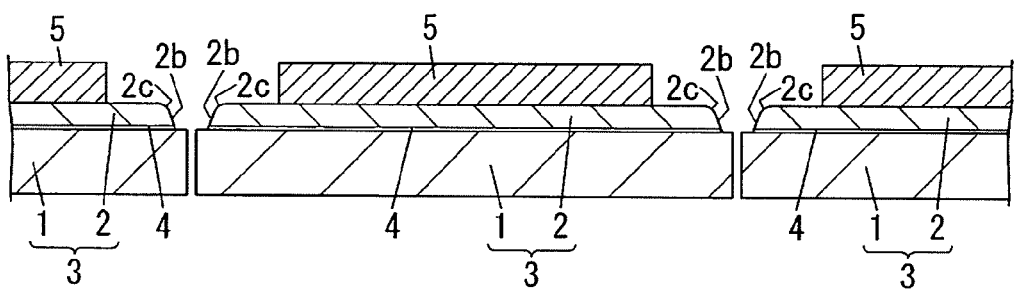

As shown in FIG. 27C, the moisture-proof substrate material 11 is then divided by cutting with a cutting tool such as scribers S. At this time, the moisture-proof substrate material 11 is cut at positions on which the resin member 12 has been divided (positions where no resin substrate 2 is formed). The resin member 12 is cut at positions of the division grooves 24. Cutting with the scribers S may be performed in a direction perpendicular to the substrate surface (a surface of the moisture-proof substrate material 11). Preferably, the scribers S come into contact with the moisture-proof substrate material 11 from a surface thereof where no organic multilayer 5 is formed because there is a concern that organic multilayers 5 may be damaged and stained with dirt if it is cut from a surface thereof where the organic multilayers 5 are formed. As shown in FIG. 27D, it is consequently possible to obtain the structure of the composite substrates 3 in each of which a resin substrate 2 is provided on a surface of a moisture-proof substrate 1. In the form of FIG. 27D, the structure of the composite substrates 3 each of which is provided on its own surface with an organic multilayer 5 can be manufactured.

FIGS. 28A to 28D is an example of manufacturing composite substrates 3 per se by cutting a composite substrate material 13 provided on a surface thereof with no organic multilayer 5. Structure of the composite substrates 3 can be formed in the same way as that of FIGS. 27A to 27D except that no organic multilayer 5 is provided.

Figure 28A:
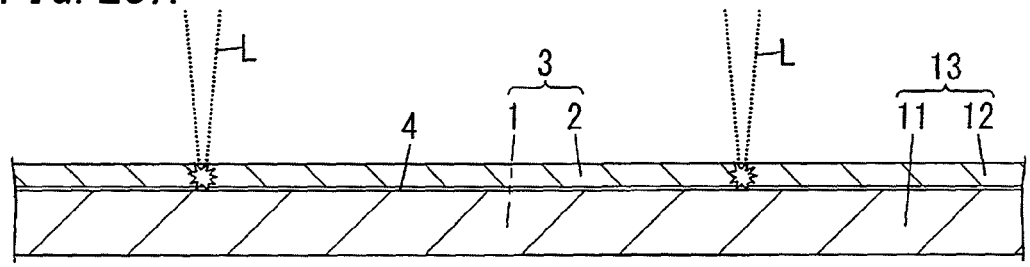
FIGS. 28A, 28B, 28C and 28D are sectional views showing an example of cutting a composite substrate.
Figure 28B:
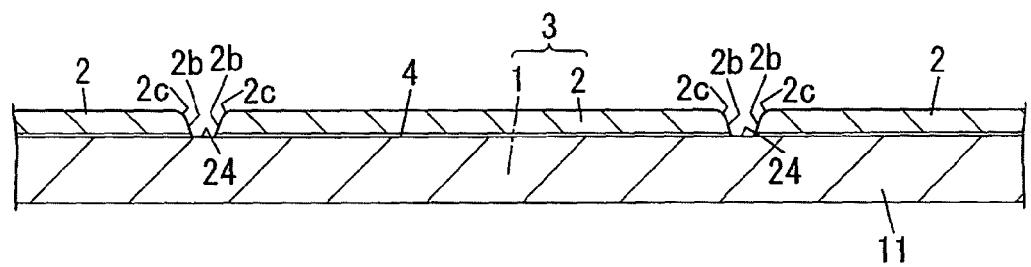

FIG. 28A is an example of a resin division and inclination step. A resin member 12 can be divided by laser irradiation for focusing a laser beam L on positions at which the resin member 12 should be divided, like FIG. 27A. As shown in FIG. 28B, it is accordingly possible to easily divide the resin member 12 and to form each end side 2*b* into an inclined face. Each division groove 24 can be easily shaped like a trapezoid and a surface of the moisture-proof substrate material 11 can be exposed. A residue removing step may be performed after the resin division and inclination step. The residue removing step may be also performed by blowing a gas.

Figure 28C:
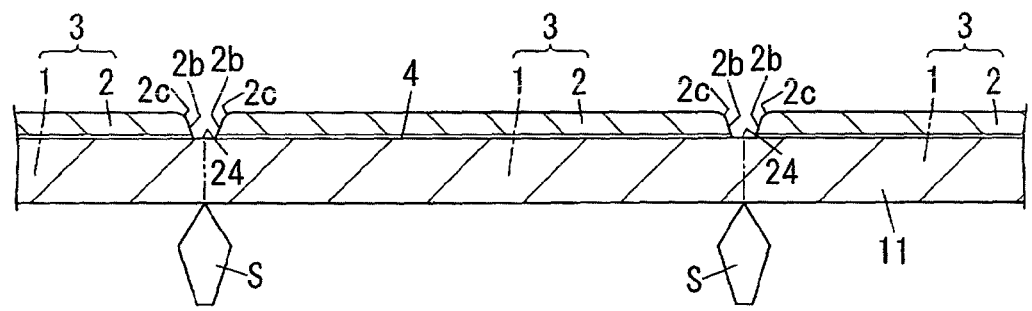
Figure 28D:
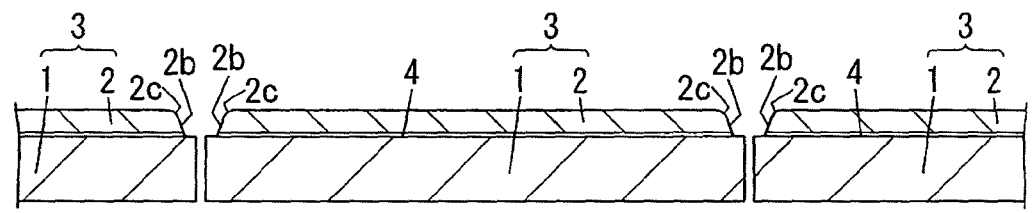

As shown in FIG. 28C, the moisture-proof substrate material 11 is then divided by cutting with a cutting tool such as scribers S. As shown in FIG. 28D, it is consequently possible to obtain structure of composite substrates 3 in each of which a resin substrate 2 is provided on a surface of a moisture-proof substrate 1. In the form of FIG. 28D, the composite substrates 3 each of which can be employed as a substrate material are manufactured.

The form of FIGS. 29A to 29E is a manufacturing example of composite substrates 3 in each of which a periphery end of a resin substrate 2 is coated with a moisture-proof film 6. In this example, each organic multilayer 5 is sealed with a sealing member 7. Structure of composite substrates 3 can be formed by a specific method for cutting by a method like the method of FIGS. 27A to 27D.

Figure 29A:
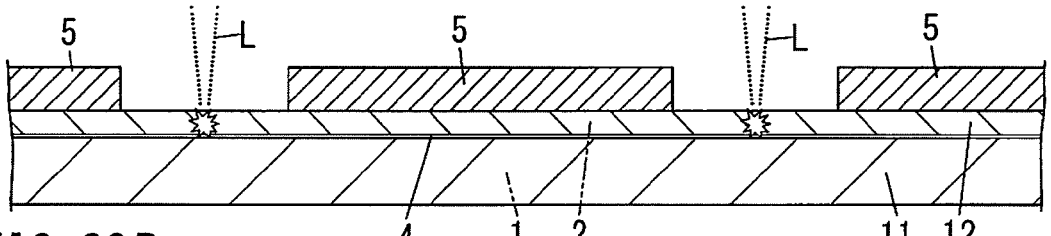
FIGS. 29A, 29B, 29C, 29D and 29E are sectional views showing an example of cutting a composite substrate.
Figure 29B:
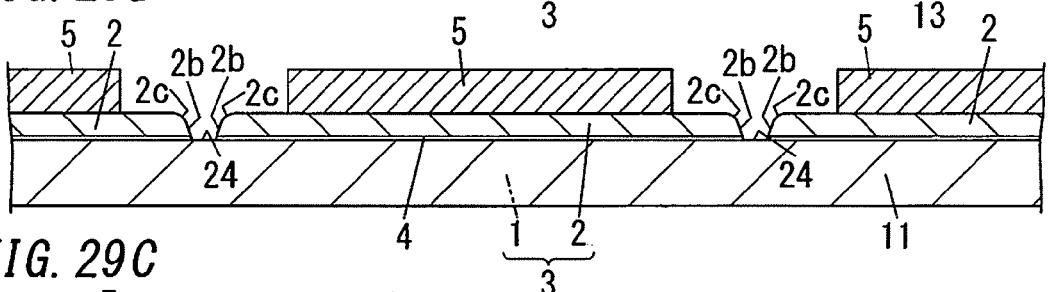

FIG. 29A is an example of a resin division and inclination step. It can be performed by laser irradiation for focusing a laser beam L on positions at which the resin member 12 should be divided, in the same way as FIG. 27A. As shown in FIG. 29B, resin substrates 2 are formed as a result of dividing the resin member 12. Preferably, a residue removing step is performed after the resin division and inclination step. It is also preferable that the residue removing step be performed by blowing a gas.

Figure 29C:
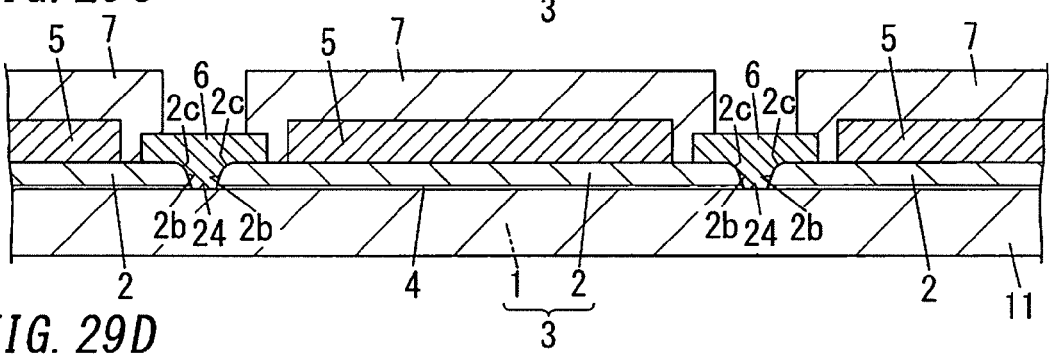

As shown in FIG. 29C, a moisture-proof film 6 is formed so as to cover division grooves 24 at regions of the division grooves 24 each of which is formed between adjacent resin substrates 2 and 2. Each organic multilayer 5 is then sealed with a sealing member 7 so that it covers part of a surface of a moisture-proof film 6.

As shown in FIG. 29C, it is preferable that a step of coating periphery ends of the resin substrates 2 with a moisture-proof film 6 be provided when organic electric devices are manufactured. It is consequently possible to prevent a resin substrate 2 from being exposed outside and effectively prevent inward penetration of moisture through the resin substrate 2. In the form, since a moisture-proof film 6 is provided to cross adjacent resin substrates 2 and 2, each end of the resin substrates 2 can be efficiently and surely coated with the moisture-proof film 6.

Figure 29D:
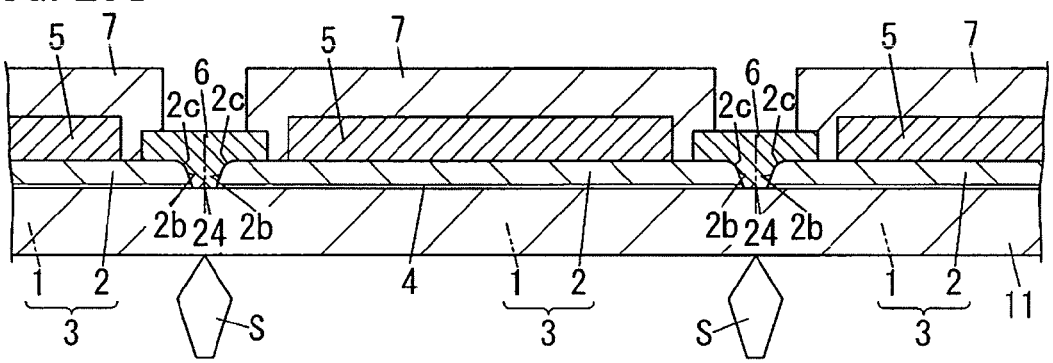
Figure 29E:
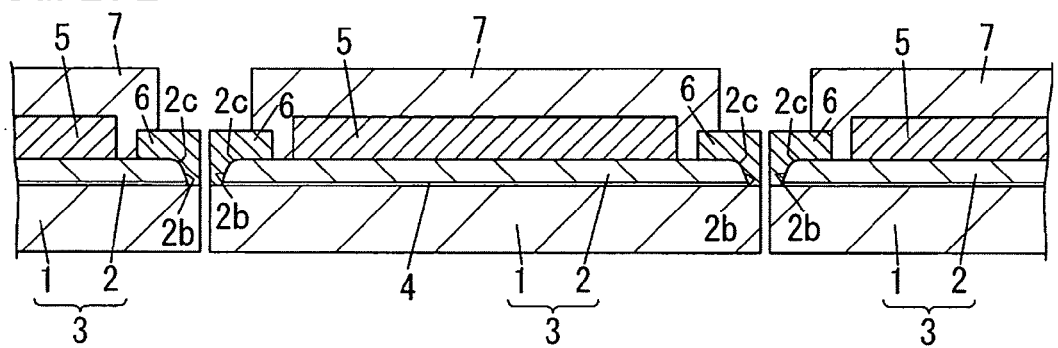

As shown in FIG. 29D, a moisture-proof substrate material 11 is then divided by cutting with a cutting tool such as scribers S. As shown in FIG. 29E, it is consequently possible to obtain the structure of the composite substrates 3 in each of which a resin substrate 2 is provided on a surface of a moisture-proof substrate 1. In the form of FIG. 29E, organic electric devices are obtained. In each of them, an organic multilayer 5 is sealed and a periphery end of a resin substrate 2 is coated with a moisture-proof film 6 to be hidden from an outside.

In a case where organic electric devices are formed, organic multilayers 5 each require to be formed on surfaces of resin substrates 2, but the organic multilayers 5 may be each formed on composite substrates 3 (a composite substrate material 13) at appropriate timing.

For example, a resin member 12 may be divided with no organic multilayer 5 provided as shown in FIGS. 28A and 28B. In this state, organic multilayers 5 may be then formed as the state of FIG. 27B. A moisture-proof substrate material 11 may be then cut as shown in FIGS. 27C and 27D.

As shown in FIGS. 28A and 28B, the resin member 12 may be divided with no organic multilayer 5 provided. In this state, organic multilayers 5 may be formed as the state of FIG. 29B. Structure of the composite substrates 3 forming part of each organic multilayer 5 can be formed by forming moisture-proof films 6, sealing with sealing members 7 and cutting a moisture-proof substrate material 11 in accordance with FIGS. 29C, 29D and 29E.

As shown in FIGS. 28A and 28B, the resin member 12 may be divided with no organic multilayer 5 provided. In this state, moisture-proof films 6 may be formed and organic multilayers 5 may be then formed. If each organic multilayer 5 is sealed with a sealing member 7, the state of FIG. 29C is obtained. Structure of the composite substrates 3 can be formed by cutting a moisture-proof substrate material 11 in accordance with FIGS. 29D and 29E. Alternatively, each organic multilayer 5 may be sealed after the moisture-proof substrate material 11 is cut.

Organic multilayers 5 may be formed like the form of FIG. 27D after composite substrates 3 are formed to correspond to one device each like FIG. 28D. Moisture-proof films 6 and organic multilayers 5 may be also formed and further sealed like the form of FIG. 29E after composite substrates 3 are formed to correspond to one device each like FIG. 28D. However, if the moisture-proof substrate material 11 is cut rather after organic multilayers 5 are formed, organic electric devices can be formed at the same time, and high manufacturability can be provided.

A form of FIGS. 30A to 30D is a manufacturing example of composite substrates 3 for manufacturing organic EL devices by dividing a combination of the organic EL devices. Structure of the composite substrates 3 can be formed by a specific method for cutting by a method like the method of FIGS. 27A to 27D. In the form, laser beam L is emitted after each organic multilayer 5 (each organic light-emitting multilayer 10) is sealed.

Figure 30A:
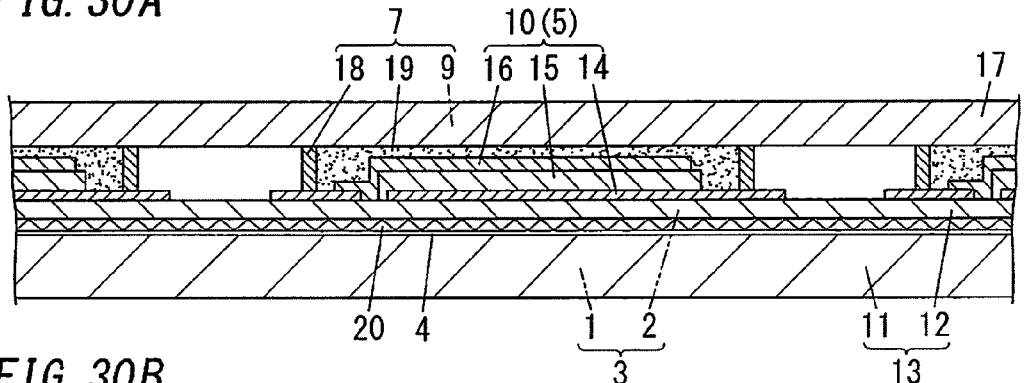
FIGS. 30A, 30B, 30C and 30D are sectional views showing an example of cutting a composite substrate.

FIG. 30A is an example of an organic EL device combination in which organic EL devices are combined. In manufacture of organic EL devices, organic EL devices may be manufactured by arranging and combining them lengthwise and breadthwise in a planar direction to form an organic EL device combination and then dividing and individuating the organic EL device combination. Accordingly, the organic EL devices can be manufactured at the same time, and the manufacturing efficiency can be enhanced.

In the organic EL device combination of FIG. 30A, a sealing substrate material 17 for forming sealing substrates 9 is pasted to a surface of a composite substrate material 13 on a side of a resin member 12. The organic EL device combination is provided with organic light-emitting multilayers 10 that are arranged side by side between the composite substrate material 13 and the sealing substrate material 17. Regarding side by side, they may be arranged in planar or in linear. The composite substrate material 13 is formed of a moisture-proof substrate material 11 and the resin member 12. Each organic light-emitting multilayer 10 is formed of a first electrode 14, an organic layer 15 and a second electrode 16 that are formed on a surface of the composite substrate material 13 in that order. Sealing side walls 18 are provided to surround respective peripheries of the organic light-emitting multilayers 10. Filler 19 is filled in each region sealed with a sealing side wall 18. The sealing substrate material 17 is pasted to the composite substrate material 13 through the sealing side walls 18. The organic light-emitting multilayers 10 are sealed with the sealing side walls 18, filler 19 and the sealing substrate material 17. The organic EL devices can be manufactured by dividing and individuating the organic EL device combination. For example, the organic EL devices like the form of FIG. 3 are formed.

Figure 30B:
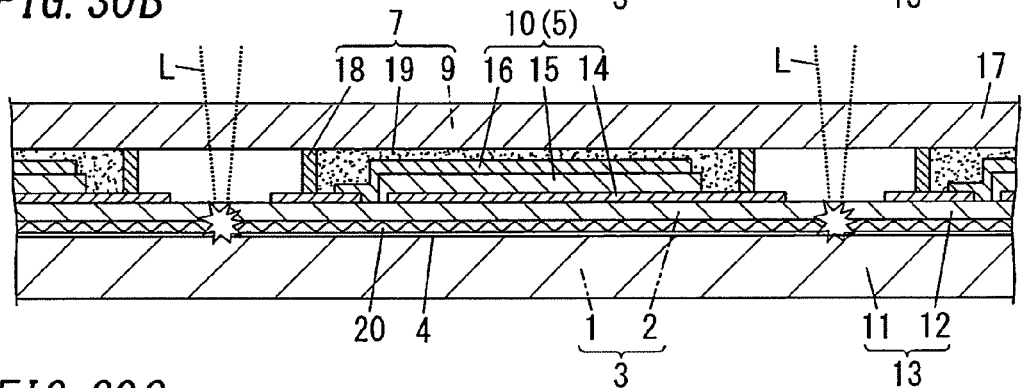

FIG. 30B is an example of a resin division and inclination step. The resin division and inclination step can be performed by laser irradiation for focusing a laser beam L on positions at which the resin member 12 should be divided. At this time, in the form, the resin member 12 can be divided by emitting the laser beam L that passes through the sealing substrate material 17. The laser beam L is set to focus on the resin member 12, and accordingly the sealing substrate material 17 is not cut. If a glass member is employed as the sealing substrate material 17, it is possible to easily allow the laser beam L to pass therethrough to focus it on each resin member 12. In the form, since the laser beam L is emitted after sealing, the organic light-emitting multilayers 10 can be prevented from being damaged by processing-residue and the devices can be more safely manufactured.

Figure 30C:
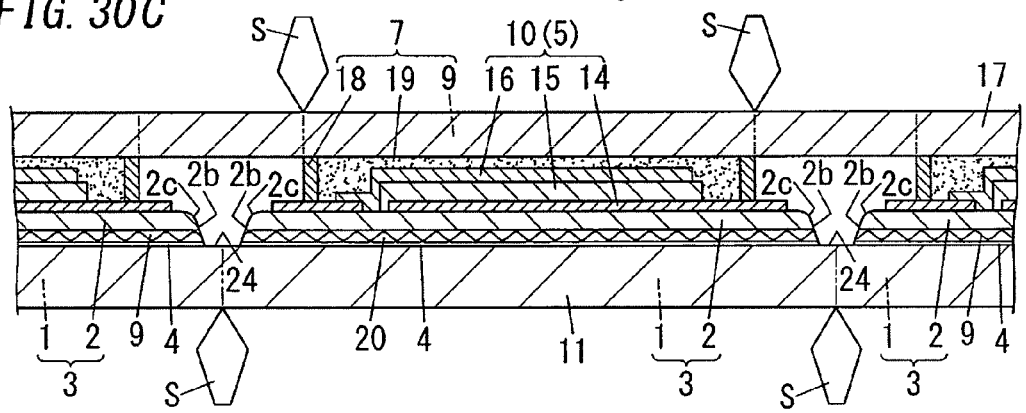

As shown in FIG. 30C, resin substrates 2 are obtained by dividing the resin member 12 by irradiation of the laser beam L. Each division groove 24 is formed between adjacent resin substrates 2 and 2 and forms, into an inclined face, end face (end side 2b) of the resin substrates 2 formed by dividing. Corners 2c of the resin substrate 2 have a round each. Each division groove 24 may be formed like FIGS. 27A to 27D or the like.

Figure 30D:
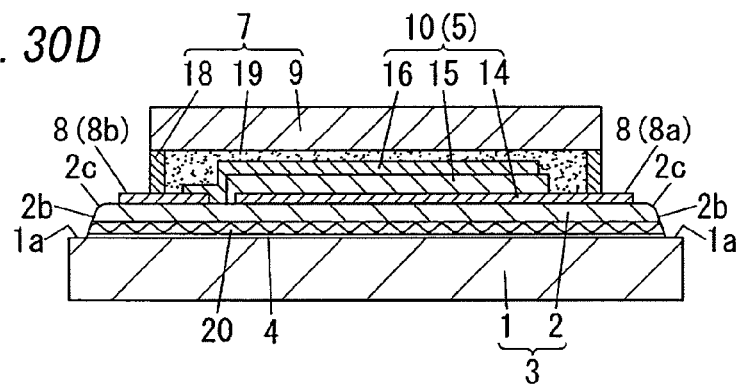

As shown in FIG. 30C, the moisture-proof substrate material 11 and the sealing substrate material 17 are cut and divided at appropriate positions with a cutting tool such as scribers S. The cutting positions of the moisture-proof substrate material 11 may be positions of the division grooves 24. The cutting positions of the sealing substrate material 17 may be positions on peripheries of the sealing side walls 18 or positions slightly outside them. As shown in FIG. 30D, individuated organic EL devices are obtained. In each organic EL device, structure of a composite substrate 3 is formed, where a resin substrate 2 is provided on a surface of a moisture-proof substrate 1.

In the composite substrates 3 and the organic EL devices manufactured by the method of FIGS. 30A to 30D, preferably a periphery end of each resin substrate 2 protruding from a sealed region is sealed with a moisture-proof film 6 after the state of FIG. 30D. As a result, each resin substrate 2 can be sealed with a moisture-proof film 6 having high moisture-proofness and hidden from an outside. In each composite substrate 3 according to the present form, each end side 2b of a resin substrate 2 is an inclined face, and accordingly can be formed with a moisture-proof film 6 without being cut on its own end edge. Each end surface 1a of a moisture-proof substrate 1 is exposed, and accordingly a moisture-proof film 6 can coat the resin substrate 2 by covering border part of the resin substrate 2 and the moisture-proof substrate 1. It is consequently possible to effectively prevent inward penetration of moisture through the resin substrate 2 and to form structure having high moisture-proofness. The organic EL devices are obtained by the aforementioned steps.

FIGS. 30A to 30D show the manufacturing method of organic EL devices, but organic electric devices except for the organic EL devices can be also manufactured by like method.

Figure 31A:
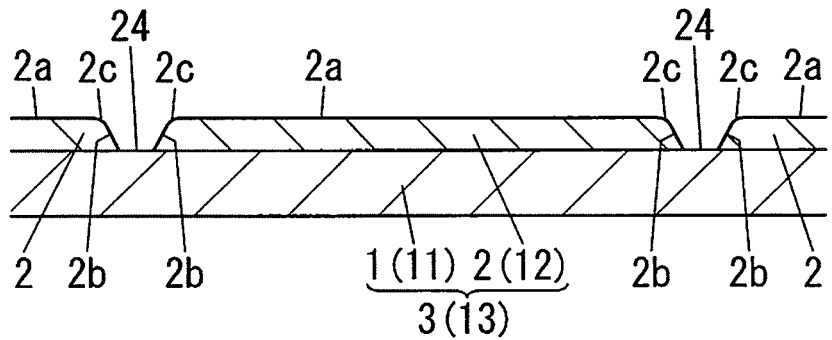
FIGS. 31A and 31B are sectional views showing an example of forming a moisture-proof film.
Figure 31B:
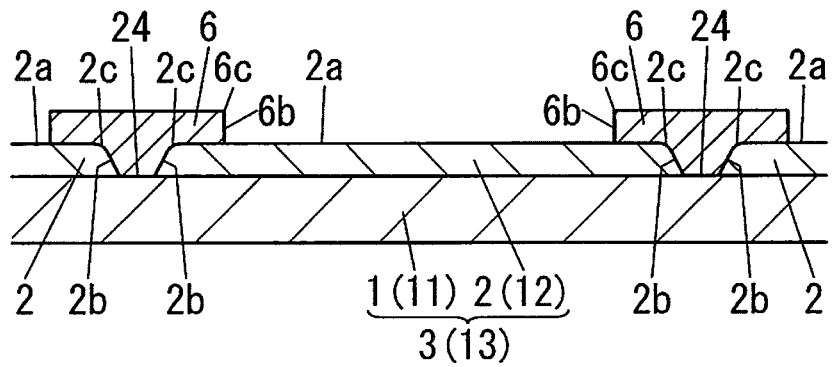

FIGS. 31A and 31B show a step example of forming moisture-proof films 6 on composite substrates 3. The step of forming the moisture-proof films 6 can be applied to each of the aforementioned forms. FIG. 31A shows an example of the composite substrates 3 after division grooves 24 are provided by dividing. In each division groove 24, end sides 2b of resin substrates 2 are exposed. It is preferable that a gap such that a groove like a division groove 24 can be created be formed between individuated resin substrates 2 and 2 because there is a concern that if end sides 2b and 2b of adjacent resin substrates 2 and 2 are in close contact with each other, material of a moisture-proof film 6 is hard to penetrate therebetween, so that the moisture-proof films 6 cannot coat ends of the resin substrates 2.

A shape of each end of the resin substrates 2 is formed by cutting at a step of cutting a resin member 12. By appropriately performing cutting, it is therefore possible to form each end side 2b of the resin substrates 2 into an inclined face and to form a corner 2c of each end of the resin substrates 2 into a curved round. For example, in a case of division by irradiation of energy ray through a laser or the like as described above, a shape of each end can be adjusted by adjusting an irradiation angle of the energy ray. Alternatively, it can be performed by using a cutting tool of which tip is an inclined face when performing a dividing step. It can be also adjusted by adjusting a cutting angle when cutting. A step of adjusting a shape of each end may be performed by a step different from the step of dividing the resin materials 12.

As shown in FIG. 31B, individuated ends of resin substrates 2 are coated with a moisture-proof film 6 by supplying material of the moisture-proof film 6 to a region obtained by dividing into the resin substrates 2. That is a coating step. Supply of the material of the moisture-proof film 6 can be performed by application, deposition or the like.

FIG. 31B shows an example of composite substrates 3 provided with a moisture-proof film 6, but formation of the moisture-proof film 6 is not limited to this. In the form of FIG. 31B, the moisture-proof film 6 is laminated so that it is filled in a division groove 24. The moisture-proof film 6 is formed to cross each adjacent resin substrates 2. Thus, if the moisture-proof film 6 is formed to cross adjacent resin substrates 2, the manufacturing efficiency can be improved. Alternately, ends of adjacent resin substrates 2 may be coated with a moisture-proof film 6 by the end. That is, a moisture-proof film 6 coating one of the resin substrates 2 may be separated from a moisture-proof film 6 coating the other of the resin substrates 2.

As shown in FIG. 31B, ends of a moisture-proof film 6 formed on a surface of a resin substrate 2 becomes ends of the moisture-proof film 6 arranged inside an device when it is individuated. Therefore, a shape of each end of the moisture-proof film 6 on the surface of the resin substrate 2 can be adjusted by appropriately adjusting an application method or a deposition method. It is consequently possible to form each end side 6b of a moisture-proof film 6 into an inclined face, or to form a corner 6c of each end of the resin substrate 2 into a curve.

In FIG. 31B, since each side 2b of a resin substrate 2 is an inclined face, each side 2b can be easily coated with a moisture-proof film 6. In addition, the moisture-proof film 6 is hard to be cut on end edges because each corner 2c that is an edge between a surface 2a and a side 2b of the resin substrate 2 is rounded.

Figure 32:
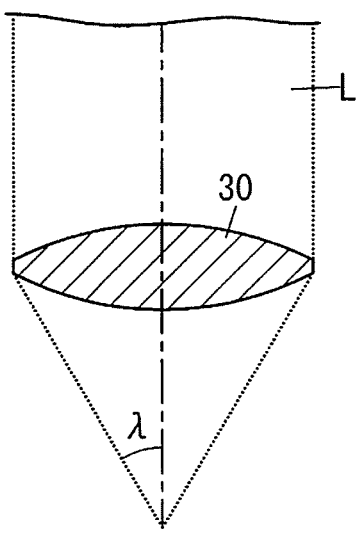
FIG. 32 is a sectional view showing an example of a laser beam.

FIG. 32 is an example of a laser beam L used for cutting a resin member 12. The laser beam L can be concentrated through an object lens 30. It is preferable that laser irradiation be performed by concentrating the laser beam L through the object lens 30 having a numerical aperture of 0.5 or more. Accordingly, the laser beam L is concentrated like a cone (an isosceles triangle in section). It is consequently possible to easily form, into an inclined face, each side 2b of resin substrates 2 to be cut because the laser beam L can be emitted in a diagonal direction from both sides with respect to a division position on a substrate surface. An irradiation direction of the laser beam L may be a direction perpendicular to the substrate surface. Even if the laser beam L propagates at right angles to the substrate surface, it is concentrated through the object lens 30 toward a focus point thereof. It is therefore possible to perform taper processing such that inclined faces are formed.

Preferably, a converging angle λ of the laser beam L is 30° or more. By setting the converging angle θ to 30° or more, it is possible to improve accuracy and efficiency of taper processing and to securely and efficiently form inclined faces. The converging angle λ is an angle of an inclined outer edge of the concentrated laser beam L, and an angle between a propagation direction of the emitted laser beam L and the outer edge of the laser beam L concentrated through the object lens 30 as shown in FIG. 32. Numerical aperture (NA) is presented by an expression "NA=n Sin λ", where n is a refractive index of a medium between the lens and a processed object. If it is air, the refractive index is n=1. An upper limit of the numerical aperture is a value as near as possible to 1.0 but may be substantially 0.9 or less or 0.8 or less. The converging angle λ may be 45° or more, or 60° or more. The converging angle λ may be also 75° or less, 60° or less, or 45° or less.

Figure 33:
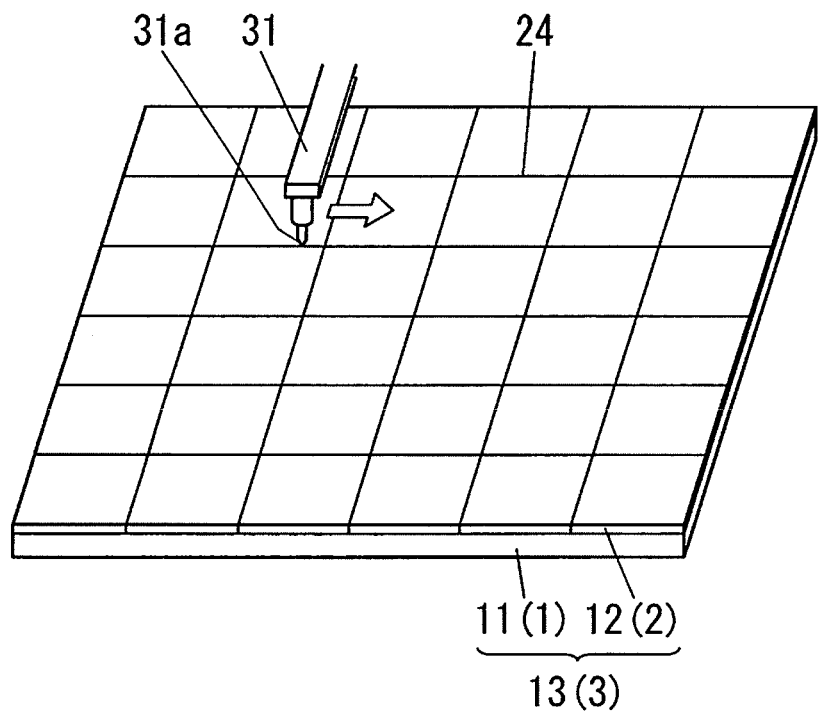
FIG. 33 is a perspective view showing an example of cutting a composite substrate.

FIG. 33 is an example of other method of cutting a resin member 12. In this form, cutting is performed with a cutting tool having a blade with a pointed tip. For example, a cutting plotter 31 having a cutter 31a at a tip thereof, or the like can be employed. The resin member 12 can be easily divided with the cutting plotter 31. Alternatively, cutting of the resin member 12 may be performed by burn-cut by the energy ray from an energy irradiation device such as a laser as a cutting tool. The division groove 24 can be formed of grooves each of which is between resin substrates 2 and 2 individuated by the step of dividing the resin member 12, When each end side 2b of resin substrates 2 is exposed by cutting with the cutting tool and dividing into the resin substrates 2, a resin member 12 of a composite substrate material 13 is cut but a moisture-proof substrate material 11 is not cut. As a result, the resin substrates 2 individuated by dividing are formed on a surface of the single moisture-proof substrate material 11. Thus, if the resin member 12 (the resin substrates 2) is previously cut (pre-cut) without cutting the moisture-proof substrate material 11, pre-cut parts can be further cut with ease when individuating organic EL devices.

Figure 34:
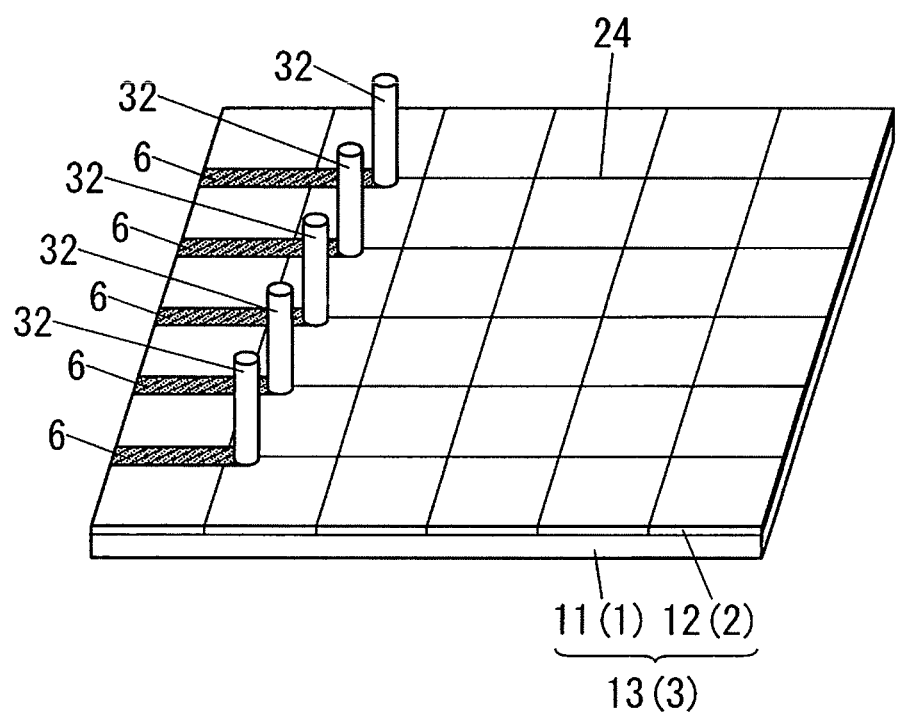
FIG. 34 is a perspective view showing an example of forming a moisture-proof film.

FIG. 34 shows an example of a method for forming a moisture-proof film 6. In the method of FIG. 34, by using dispensers 32 as a coater, application material of the moisture-proof film 6 is supplied on surfaces of composite substrates 3 along division grooves 24 from the dispensers 32. Thus, by using the dispensers 32, the moisture-proof film 6 can be efficiently formed. The moisture-proof film 6 can be formed after conductive layers forming first electrodes 14 are formed, or before the conductive layers forming the first electrodes 14 are formed.

Figure 35A:
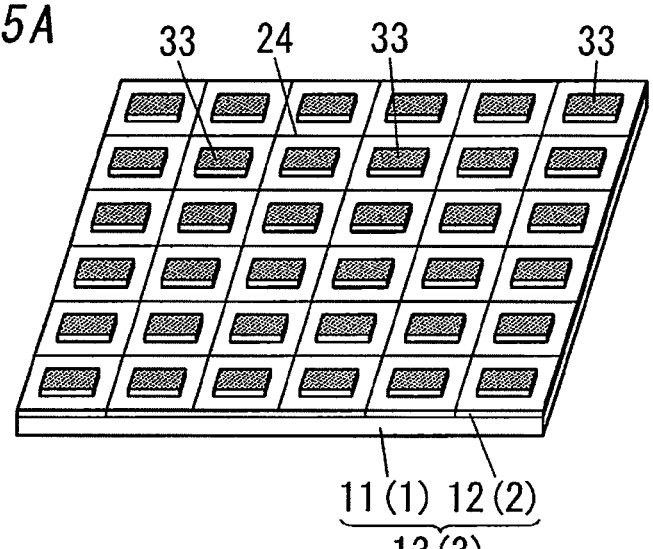
FIGS. 35A, 35B and 35C are perspective views showing an example of forming a moisture-proof film.
Figure 35B:
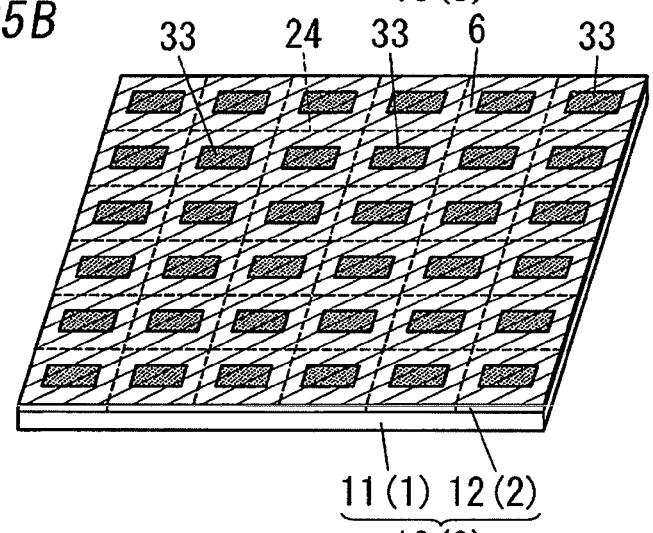
Figure 35C:
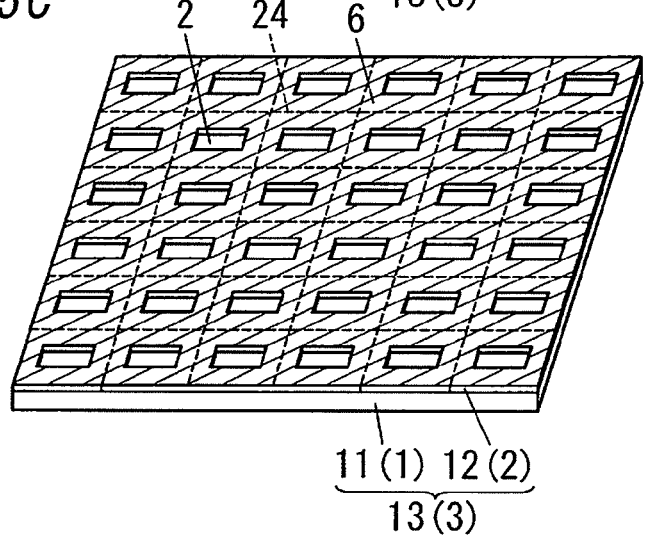

FIGS. 35A to 35C show another example of a method for forming a moisture-proof film 6. In the method of FIGS. 35A to 35C, resists 33 are first formed at regions except for a formation region of the moisture-proof film 6 on composite substrates 3 (a composite substrate material 13) as shown in FIG. 35A. As shown in FIG. 35B, material of the moisture-proof film 6 is laminated on all surfaces of the composite substrates 3. In FIGS. 35B and 35C, the formation region of the moisture-proof film 6 is indicated by oblique lines. Laminating of the moisture-proof films 6 can be performed by applying the application material of the moisture-proof film 6. Alternatively, laminating of the moisture-proof film 6 may be performed by depositing deposition material of the moisture-proof film 6. It may be also performed by sputtering. When laminating of the moisture-proof film 6 is performed by application, die coat can be employed for example. As shown in FIG. 35C, the resists 33 are removed (lifted-off), thereby removing the moisture-proof films 6 formed on surfaces of the resists 33. As shown in FIG. 35C, surfaces of the resin substrates 2 are exposed in a case where no conductive layer is formed on a surface of the composite substrate material 13. That is, the composite substrates 3 (the composite substrate material 13) is exposed. In a case where conductive layers are formed on the surface of the composite substrate material 13, the conductive layers are exposed. Thus, the moisture-proof film 6 can be formed on desired regions.

It is hence possible to obtain the composite substrates 3 in each of which a moisture-proof film 6 coats ends of an individually divided resin substrate 2. How to form the moisture-proof film 6 is not limited to the aforementioned method, but formation by deposition with a mask pattern may be employed.

Figure 36A:
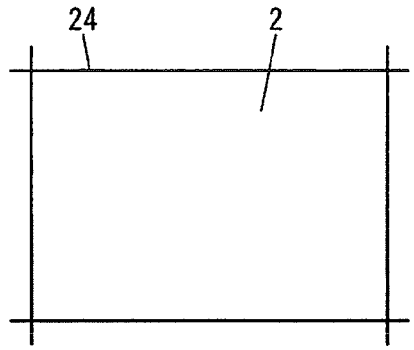
FIGS. 36A, 36B, 36C, 36D, 36E and 36F are plan views showing a manufacture example of an organic electroluminescence device.

FIGS. 36A to 36F show a manufacturing example of organic EL devices. FIG. 36A shows a surface of a resin substrate 2 provided with a division groove 24.

Figure 36B:
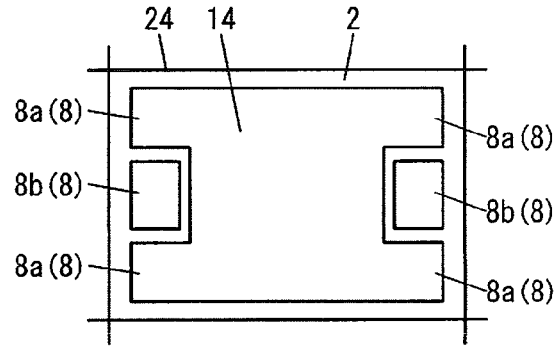

As shown in FIG. 36B, electrode material is first laminated on the surface of the resin substrate 2. At this time, it is laminated to form a pattern so that a first electrode 14 is formed at a center region on the surface of the resin substrate 2 and lead-out electrodes 8 are formed on surfaces of ends of the resin substrate 2. That is an electrode forming step. The pattern may be formed by a method of forming it on the whole surface to then remove pattern-shaped part thereof, or by a method of laminating a patterned electrode material with a pattern mask or the like. Alternatively, it may be formed by forming a composite substrate 3 by using a resin substrate 2 previously provided on a surface thereof with an electrode film, and then performing patterning of electrodes by partially removing the electrode film. The electrode material may be material for transparent conductive layer. For example, transparent metal oxide such as ITO can be employed. The conductive layers may be formed by deposition, sputtering, application or the like. A shape of the pattern may be a shape for forming the first electrode 14, first lead-out electrodes 8a and second lead-out electrodes 8b. A shape of an adhesion gap 21 may be adjusted by patterning of electrodes.

Figure 36C:
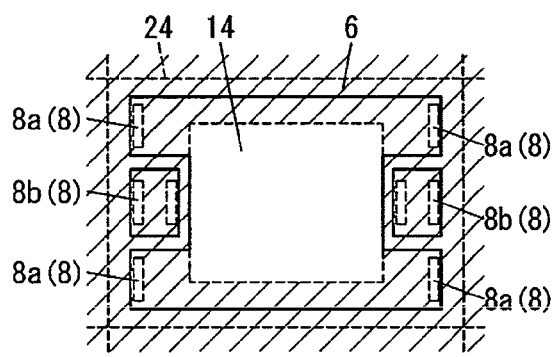

As shown in FIG. 36C, a moisture-proof film 6 is then laminated. In FIGS. 36C, 36D, 36E and 36F, a formation region of the moisture-proof film 6 is indicated by oblique lines. The moisture-proof film 6 may be shaped like a pattern corresponding to any of the forms of the composite substrate 3 as mentioned above. In the present form, the moisture-proof film 6 is formed to cross the division groove 24, and the resin substrate 2 of which each end is coated with the moisture-proof film 6 can be obtained. The pattern is shaped so that an organic light-emitting multilayer 10 can be formed with no moisture-proof film 6 formed at a region of the first electrode 14. It is not formed at each region to be provided with an auxiliary electrode 22 and at each part of second lead-out electrodes 8b connected with extended parts from a second electrode 16, on the lead-out electrodes 8. Thus, the moisture-proof film 6 is formed with openings. Therefore, electrical connection becomes possible.

Figure 36D:
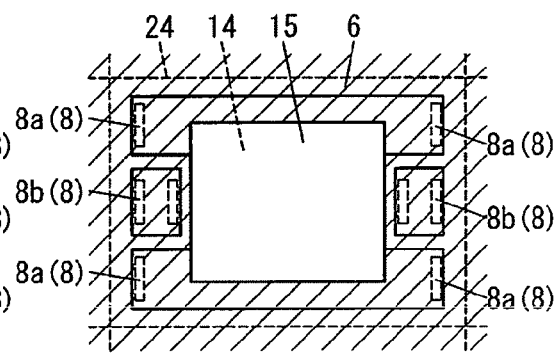

As shown in FIG. 36D, an organic layer 15 is then laminated on a surface of the first electrode 14 on a center region of the transparent conductive layer. The organic layer 15 may be formed by sequentially laminating layers constituting the organic layer 15 by deposition or application. The organic layer 15 to be laminated is patterned so that when the second electrode 16 is formed thereon, the second electrode 16 is out of contact with the first electrode 14. When the surface of the resin substrate 2 is exposed, the exposed surface of the resin substrate 2 may be coated with the organic layer 15.

Figure 36E:
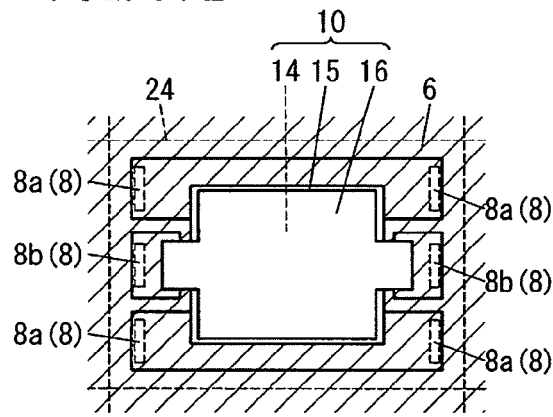

As shown in FIG. 36E, the second electrode 16 is then laminated on a surface of the organic layer 15. At this time, the second electrode 16 is out of contact with the first electrode 14 and the first lead-out electrodes 8a and is also laminated on surfaces of the second lead-out electrodes 8b. Thus, an organic light-emitting multilayer 10 is formed on a surface of the composite substrate 3.

Figure 36F:
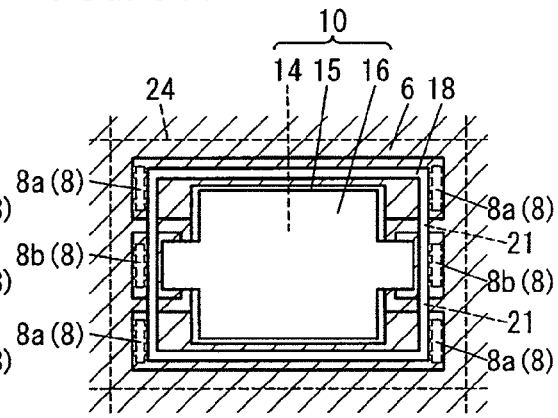

As shown in FIG. 36F, sealing adhesive for forming a sealing side wall 18 is provided, and a sealing substrate 9 is pasted with the sealing side wall 18. Like a moisture-proof substrate 1, a sealing substrate material 17 that is a single continuous substrate can be employed as the sealing substrate 9. An adhesive having moisture-proofness and electrical insulation can be used for the sealing adhesive. Thus, the composite substrates 3 and the sealing substrates 9 are pasted through the sealing side walls 18 so that individual organic light-emitting multilayers 10 are sealed. As a result, an organic EL device combination can be manufactured.

Finally, by cutting and separating a moisture-proof substrate material 11 and the sealing substrate material 17 at ends of each organic EL device, organic EL devices can be individuated. In this case, the moisture-proof film 6 is also cut at the same time. It is therefore preferable that the moisture-proof film 6 be formed of easily cuttable material. There is a concern that if the resin substrates 2 are integrally formed, they cannot be easily cut. However, since the resin substrates 2 are previously cut as described above, the organic EL devices can be easily cut at ends thereof.

FIGS. 37A to 37F show other manufacturing example of organic EL devices. In the example of FIGS. 37A to 37F, lead-out electrodes 8 are formed on a surface of a moisture-proof film 6.

Figure 37A:
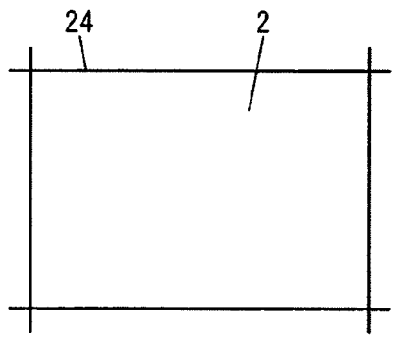
FIGS. 37A, 37B, 37C, 37D, 37E and 37F are plan views showing a manufacture example of an organic electroluminescence device.
Figure 37B:
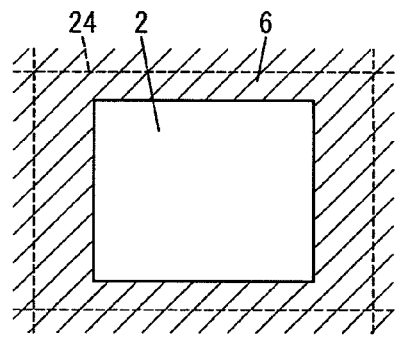

FIG. 37A shows a surface of a resin substrate 2 provided with a division groove 24. As described above, by forming the moisture-proof film 6 along the division groove 24, it is possible to obtain the resin substrate 2 of which ends are coated with the moisture-proof film 6 as shown in FIG. 37B. In FIGS. 37B, 37C, 37D, 37E and 37F, a region at which the moisture-proof film 6 is formed is indicated by oblique lines.

Figure 37C:
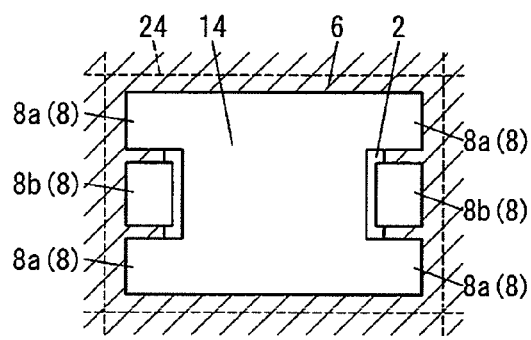

As shown in FIG. 37C, electrode material is laminated on a surface of a composite substrate material 13 in which ends of each resin substrate 2 are coated with a moisture-proof film 6. At this time, it is laminated to form a pattern so that a first electrode 14 is formed at a center region on a surface of a resin substrate 2 and lead-out electrodes 8 are formed on surfaces of ends of the resin substrate 2. That is an electrode forming step. The pattern may be formed by a method of forming it on the whole surface to then remove pattern-shaped part thereof, or by a method of laminating a patterned electrode material with a pattern mask or the like. The electrode material may be material for transparent conductive layer. For example, transparent metal oxide such as ITO can be employed. The conductive layers may be formed by deposition, sputtering, application or the like. A shape of the pattern may be a shape for forming the first electrode 14, first lead-out electrodes 8a and second lead-out electrodes 8b. In the present form, if conductive layers are laminated so that the first and second lead-out electrodes 8a and 8b cross an edge of the moisture-proof film 6, the first and second lead-out electrodes 8a and 8b can be provided on a surface of the moisture-proof film 6. Alternatively, a conductive layer may be laminated by forming an outer edge of the conductive layer, in which the first electrode 14 and the first lead-out electrodes 8a are integrally connected, into a pattern located outside an edge of the moisture-proof film 6. In this case, the first and second lead-out electrodes 8a and 8b can be provided within a surface region of the moisture-proof film 6. A shape of an adhesion gap 21 may be adjusted by patterning of electrodes.

Figure 37D:
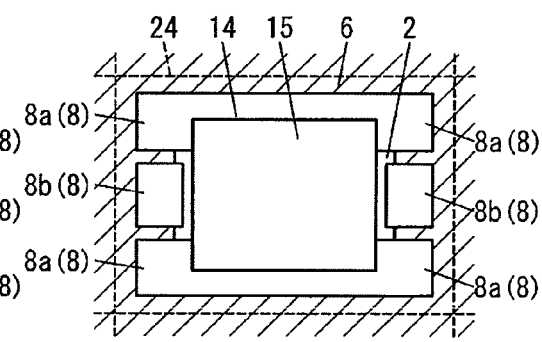

As shown in FIG. 37D, an organic layer 15 is then laminated on a surface of the first electrode 14 on a center region of the transparent conductive layer. The organic layer 15 may be formed by sequentially laminating layers constituting the organic layer 15 by deposition or application. The organic layer 15 to be laminated is patterned so that when a second electrode 16 is laminated thereon, the second electrode 16 is out of contact with the first electrode 14. An exposed surface of the resin substrate 2 may be coated with the organic layer 15. In this case, it is possible to prevent the resin substrate 2 from being exposed.

Figure 37E:
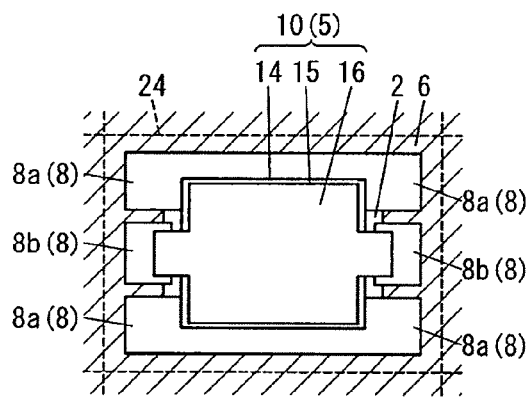

As shown in FIG. 37E, the second electrode 16 is laminated on a surface of the organic layer 15. In this case, the second electrode 16 is also laminated on surfaces of the second lead-out electrodes 8b so that it is out of contact with the first electrode 14 and the first lead-out electrodes 8a. Thus, an organic light-emitting multilayer 10 is formed on a surface of a composite substrate 3.

Figure 37F:
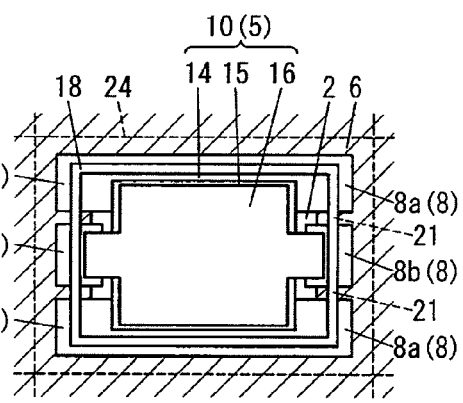

As shown in FIG. 37F, sealing adhesive is provided on the first and second lead-out electrodes 8a and 8b on a region provided with the moisture-proof film 6 in planar view, and a surface of the moisture-proof film 6 exposed therebetween. A sealing substrate 9 is then pasted with a sealing side wall 18. Like a moisture-proof substrate 1, a sealing substrate material 17 that is a single continuous substrate can be employed as the sealing substrate 9. In this case, the sealing side wall 18 is provided on the surface of the moisture-proof film 6 in regions among ends of the first and second lead-out electrodes 8a and 8b. An adhesive having moisture-proofness and electrical insulation can be used for the sealing adhesive. Thus, the composite substrates 3 and the sealing substrates 9 are pasted through the sealing side walls 18 so that individual organic light-emitting multilayers 10 are sealed. As a result, an organic EL device combination can be manufactured.

Finally, by cutting and separating a moisture-proof substrate material 11 (moisture-proof substrates 1) and the sealing substrate material 17 (the sealing substrates 9) at ends of each organic EL device, organic EL devices can be individuated. In this case, the moisture-proof films 6 are also cut at the same time. It is therefore preferable that the moisture-proof films 6 be formed of easily cuttable material. There is a concern that if the resin substrates 2 are integrally formed, they cannot be easily cut. However, since the resin substrates 2 are previously cut, the organic EL devices can be easily cut at ends thereof.

Figure 38:
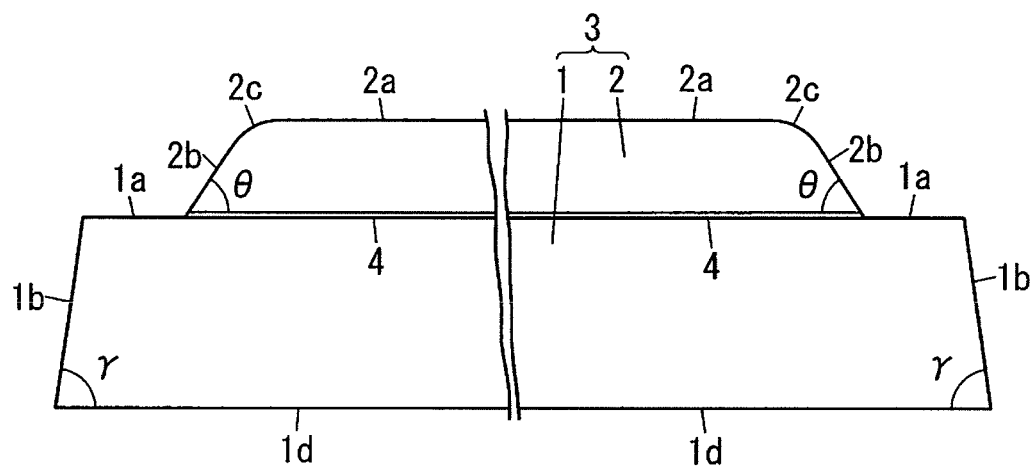
FIG. 38 is an enlarged sectional view showing an example of a composite substrate in an embodiment.

FIG. 38 is other example according to an embodiment of a composite substrate 3. Like kind elements are assigned the same reference numerals as depicted in the form of FIG. 2.

In the form of FIG. 38, outer end sides 1b of a moisture-proof substrate 1 are formed into inclined faces each of which is inclined inward. That is, the moisture-proof substrate 1 is shaped like a trapezoid. An angle of inclination γ of each side 1b of the moisture-proof substrate 1 needs to be 90° or less, and may be 80° or less, 70° or less, or 60° or less. The angle of inclination γ may be 45° or more, 60° or more, or 70° or more because if it becomes small, a region of each end side 1b of the moisture-proof substrate 1 becomes too wide. The angle of inclination λ is an angle between an end side 1b of the moisture-proof substrate 1 and an opposite surface 1d of the moisture-proof substrate 1 from the resin substrate 2. By forming each side 1b of the moisture-proof substrate 1 into an inclined face, a device can be easily attached to an enclosure of luminaire or the like.

In the form, it is preferable that an angle of inclination θ of each side 2b of the resin substrate 2 be smaller than the angle of inclination γ of each side 1b of the moisture-proof substrate 1. That is, each side 2b of the resin substrate 2 is more inclined than each side 1b of the moisture-proof substrate 1. When the moisture-proof film 6 is formed, the moisture-proof film 6 can be formed without being divided, by forming each side 2b of the resin substrate 2 into an inclined face having small angle of inclination.

According to the method of manufacturing the structure of composite substrates 3 as described above, the structure of the composite substrate 3 in FIG. 38 can be manufactured by performing a process of forming each side 1b of the moisture-proof substrate 1 into an inclined face after cutting with a scriber(s) S. Alternatively, it can be manufactured by performing cutting with a scriber(s) S coming into contact with the moisture-proof substrate 1 in a diagonal direction.

The structure of the composite substrate 3 in the form of FIG. 38 can be employed as a substrate for an organic electric device (an organic EL device) like the forms as described above.

REFERENCE SIGNS LIST 1 moisture-proof substrate
2 resin substrate
2a surface of resin substrate
2b side of resin substrate
2c corner of resin substrate
3 composite substrate
4 adhesion layer
5 organic multilayer
6 moisture-proof film
6a surface of moisture-proof film
6b end side of moisture-proof film
6c corner of moisture-proof film
7 sealing member
7a sealed space
8 lead-out electrode
8a first lead-out electrode
8b second lead-out electrode
9 sealing substrate 10 organic light-emitting multilayer
11 moisture-proof substrate material
12 resin member
13 composite substrate material
14 first electrode
15 organic layer
16 second electrode
17 sealing substrate material
18 sealing side wall
18a resin material
19 filler
20 light diffusion layer
21 adhesion gap
21a advancing part
21b returning part
21c staying part
21d curved part
22 auxiliary electrode
23 light-extraction part
24 division groove
30 object lens
31 cutter
32 resist
L laser
S scriber

The invention claimed is:

1. A composite substrate comprising a moisture-proof substrate and a resin substrate pasted to a surface of the moisture-proof substrate, wherein
the resin substrate is formed to be smaller than the moisture-proof substrate in planar view, and
an end side of the resin substrate is formed into an inclined face that is inclined inward.

2. The composite substrate of claim 1, wherein a corner from a surface to a side of an end of the resin substrate has a round.

3. The composite substrate of claim 1, wherein
the composite substrate is provided with an organic multilayer on a surface of the resin substrate, the organic multilayer being sealed with a sealing member,
a first lead-out electrode and a second lead-out electrode are provided on an end surface of the composite substrate, the first lead-out electrode being extended from an inside of the composite substrate in planar view, the second lead-out electrode being electrically insulated from the first lead-out electrode and extended from the inside of the composite substrate in planar view, and
a moisture-proof film configured to prevent moisture penetration is formed on at least part of the surface of the resin substrate in which the first and second lead-out electrodes are not formed.

4. The composite substrate of claim 3, wherein the moisture-proof film is formed at least on part of the resin substrate protruding from the sealing member.

5. The composite substrate of claim 3, wherein the moisture-proof film is formed at least on a region sealed with the sealing member.

6. The composite substrate of claim 3, wherein the moisture-proof film is formed at all regions on end surfaces of the composite substrate in which the first and second lead-out electrodes are not formed.

7. The composite substrate of claim 3, wherein the first and second lead-out electrodes are formed on a surface of the moisture-proof film.

8. The composite substrate of claim 7, wherein an inside end side of the moisture-proof film is formed into an inclined face that is inclined outward with respect to the surface of the resin substrate.

9. The composite substrate of claim 1, wherein
the composite substrate is provided with an organic multilayer on a surface of the resin substrate, the organic multilayer being sealed with a sealing member,
a first lead-out electrode and a second lead-out electrode are provided on an end surface of the composite substrate, the first lead-out electrode being extended from an inside of the composite substrate in planar view, the second lead-out electrode being electrically insulated from the first lead-out electrode and extended from the inside of the composite substrate in planar view, and
an adhesion gap in which resin material for gluing of the sealing member is filled is formed between the first and second lead-out electrodes, the adhesion gap being shaped like a line that continuously extends from an outside to an inside in planar view, the adhesion gap comprising an advancing part that extends in a direction from the outside to the inside and a returning part that extends in a direction from the inside to the outside.

10. A manufacturing method of a composite substrate comprising a moisture-proof substrate and a resin substrate pasted to a surface of the moisture-proof substrate, comprising:
a resin division and inclination step of preparing a composite substrate material obtained by pasting together a moisture-proof substrate material for forming moisture-proof substrates and a resin member for forming resin substrates, and dividing the resin member of the composite substrate material to form end sides of the resin substrates into inclined faces; and
a moisture-proof substrate dividing step of dividing the moisture-proof substrate material.

11. The manufacturing method of claim 10, comprising a step of coating peripheral ends of the resin substrates with a moisture-proof film.

12. The manufacturing method of claim 10, wherein the resin division and inclination step is performed by laser irradiation.

13. The manufacturing method of claim 12, wherein the laser irradiation is performed by concentrating a laser beam through an object lens having a numerical aperture of 0.5 or more.

14. The manufacturing method of claim 10, comprising a residue removing step of removing processing-residue occurring in the resin division and inclination step.

15. The manufacturing method of claim 14, wherein the residue removing step is performed by blowing a gas.

16. The manufacturing method of claim 10, wherein a sealing substrate material for forming sealing substrates is pasted to a surface of the composite substrate material on a side of the resin member,
the resin division and inclination step is performed by emitting a laser beam that passes through the sealing substrate material, and
the sealing substrate material is divided at the moisture-proof substrate dividing step.

17. An organic electroluminescence device, comprising:
a composite substrate comprising a moisture-proof substrate and a resin substrate pasted to a surface of the moisture-proof substrate;
an organic light-emitting multilayer that comprises a first electrode, an organic light-emitting layer and a second electrode, and is provided on a surface of the resin substrate of the composite substrate;

a sealing member that seals the organic light-emitting multilayer;

a first lead-out electrode provided on an end surface of the composite substrate, the first lead-out electrode being extended from an inside of the composite substrate in planar view;

a second lead-out electrode provided on the end surface of the composite substrate, the second lead-out electrode being electrically insulated from the first lead-out electrode and extended from the inside of the composite substrate in planar view; and a moisture-proof film that is configured to prevent moisture penetration and formed on at least part of regions of the surface of the resin substrate in which the first and second lead-out electrodes are not formed, wherein the first lead-out electrode is electrically conducted to the first electrode, the second lead-out electrode is electrically conducted to the second electrode, the resin substrate is formed to be smaller than the moisture-proof substrate in planar view, and an end side of the resin substrate is formed into an inclined face that is inclined inward.

* * * * *